United States Patent
Yamazaki et al.

(10) Patent No.: US 10,316,404 B2
(45) Date of Patent: Jun. 11, 2019

(54) METHOD FOR MANUFACTURING SPUTTERING TARGET

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yoshinori Yamada, Kanagawa (JP); Masashi Oota, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/537,915

(22) PCT Filed: Dec. 16, 2015

(86) PCT No.: PCT/IB2015/059650
§ 371 (c)(1),
(2) Date: Jun. 20, 2017

(87) PCT Pub. No.: WO2016/103114
PCT Pub. Date: Jun. 30, 2016

(65) Prior Publication Data
US 2017/0350002 A1    Dec. 7, 2017

(30) Foreign Application Priority Data

Dec. 26, 2014  (JP) .................................. 2014-266201
Jan. 14, 2015  (JP) .................................. 2015-004964

(51) Int. Cl.
*C23C 14/34*    (2006.01)
*C01G 15/00*    (2006.01)
(Continued)

(52) U.S. Cl.
CPC .......... *C23C 14/3414* (2013.01); *C01G 9/006* (2013.01); *C01G 9/02* (2013.01);
(Continued)

(58) Field of Classification Search
None
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    102534500 A    7/2012
CN    102598285 A    7/2012
(Continued)

OTHER PUBLICATIONS

International Search Report (Application No. PCT/IB2015/059650) dated Apr. 12, 2016 with English translation.
(Continued)

*Primary Examiner* — Katie L. Hammer
(74) *Attorney, Agent, or Firm* — Fish & Richardson P.C.

(57) ABSTRACT

A sputtering target including an oxide with a low impurity concentration is provided. Provided is a method for manufacturing a sputtering target, including a first step of preparing a mixture including indium, zinc, an element M (the element M is aluminum, gallium, yttrium, or tin), and oxygen; a second step of raising a temperature of the mixture from a first temperature to a second temperature in a first atmosphere containing nitrogen at a concentration of higher than or equal to 90 vol % and lower than or equal to 100 vol %; and a third step of lowering the temperature of the mixture from the second temperature to a third temperature in a second atmosphere containing oxygen at a concentration
(Continued)

of higher than or equal to 10 vol % and lower than or equal to 100 vol %.

18 Claims, 61 Drawing Sheets

(51) Int. Cl.
    *C23C 14/08* (2006.01)
    *H01J 37/34* (2006.01)
    *C01G 9/02* (2006.01)
    *C01G 9/00* (2006.01)
    *C01G 19/02* (2006.01)
    *C04B 35/453* (2006.01)
    *H01L 29/786* (2006.01)
    *C01G 19/00* (2006.01)
    *C30B 23/02* (2006.01)
    *C30B 29/22* (2006.01)
    *C04B 35/01* (2006.01)
    *C04B 35/117* (2006.01)
    *C04B 35/44* (2006.01)
    *C04B 35/457* (2006.01)
    *C04B 35/505* (2006.01)
    *C04B 35/64* (2006.01)

(52) U.S. Cl.
    CPC ......... *C01G 15/006* (2013.01); *C01G 19/006* (2013.01); *C01G 19/02* (2013.01); *C04B 35/01* (2013.01); *C04B 35/117* (2013.01); *C04B 35/44* (2013.01); *C04B 35/453* (2013.01); *C04B 35/457* (2013.01); *C04B 35/505* (2013.01); *C04B 35/64* (2013.01); *C23C 14/086* (2013.01); *C23C 14/34* (2013.01); *C30B 23/02* (2013.01); *C30B 29/22* (2013.01); *H01J 37/3426* (2013.01); *H01L 29/786* (2013.01); *C01P 2006/80* (2013.01); *C04B 2235/3217* (2013.01); *C04B 2235/3225* (2013.01); *C04B 2235/3286* (2013.01); *C04B 2235/3293* (2013.01); *C04B 2235/658* (2013.01); *C04B 2235/6583* (2013.01); *C04B 2235/661* (2013.01); *C04B 2235/662* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,193,031 B2 | 6/2012 | Hosoba et al. |
| 8,592,251 B2 | 11/2013 | Hosoba et al. |
| 8,889,477 B2 | 11/2014 | Yamazaki et al. |
| 9,051,646 B2 | 6/2015 | Herzog et al. |
| 9,093,262 B2 | 7/2015 | Hosoba et al. |
| 9,382,611 B2 | 7/2016 | Yamazaki et al. |
| 9,461,181 B2 | 10/2016 | Hosoba et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0197757 A1* | 8/2009 | Fukushima ........... C04B 35/453 501/127 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0114944 A1 | 5/2011 | Yamazaki et al. |

(56) References Cited

U.S. PATENT DOCUMENTS

| | | | |
|---|---|---|---|
| 2011/0114999 A1 | 5/2011 | Yamazaki et al. | |
| 2012/0085641 A1* | 4/2012 | Herzog | C04B 35/01 204/298.13 |
| 2012/0312681 A1 | 12/2012 | Yamazaki et al. | |
| 2012/0325650 A1 | 12/2012 | Yamazaki et al. | |
| 2013/0011962 A1 | 1/2013 | Yamazaki et al. | |
| 2013/0056727 A1* | 3/2013 | Yamade | H01L 29/7869 257/43 |
| 2014/0001032 A1 | 1/2014 | Yamazaki | |
| 2014/0042014 A1 | 2/2014 | Yamazaki | |
| 2014/0042674 A1 | 2/2014 | Yamazaki | |
| 2016/0090647 A1 | 3/2016 | Yamazaki | |
| 2017/0005204 A1 | 1/2017 | Hosoba et al. | |
| 2017/0016108 A1 | 1/2017 | Yamazaki et al. | |

FOREIGN PATENT DOCUMENTS

| | | |
|---|---|---|
| CN | 103124805 A | 5/2013 |
| CN | 103290371 A | 9/2013 |
| DE | 112012002394 | 2/2014 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-197219 A | 10/2012 |
| JP | 2013-144841 A | 7/2013 |
| JP | 2013-144844 A | 7/2013 |
| JP | 2013-145864 A | 7/2013 |
| JP | 2014-051735 A | 3/2014 |
| JP | 2015-071829 A | 4/2015 |
| KR | 2014-0003315 A | 1/2014 |
| KR | 2014-0007495 A | 1/2014 |
| KR | 2014-0119835 A | 10/2014 |
| TW | 201250033 | 12/2012 |
| TW | 201303059 | 1/2013 |
| TW | 201333242 | 8/2013 |
| WO | WO-2004/114391 | 12/2004 |
| WO | WO-2011/062043 | 5/2011 |
| WO | WO-2012/121298 | 9/2012 |
| WO | WO-2012/169449 | 12/2012 |

OTHER PUBLICATIONS

Written Opinion (Application No. PCT/IB2015/059650) dated Apr. 12, 2016 without English translation.

Yamazaki.S et al., "Properties of crystalline In—Ga—Zn-oxide semiconductor and its transistor characteristics", Jpn. J. Appl. Phys. (Japanese Journal of Applied Physics), Apr. 1, 2014, vol. 53, No. 4, pp. 04ED18-1-04ED18-10.

Hosemann.R, "Crystalline and Paracrystalline Order in High Polymers", J. Appl. Phys. (Journal of Applied Physics), 1963, vol. 34, No. 1, pp. 25-41.

Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.

Kamiya.T et al., "Electron-Beam-Induced Crystallization of Amorphous In—Ga—Zn—O Thin Films Fabricated by UHV Sputtering", IDW'13 : Proceedings of the 20th International Display Workshops, Dec. 4, 2013, pp. 280-281.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Syposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,Or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-24502-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201580070738.8) dated Jan. 3, 2019.

\* cited by examiner

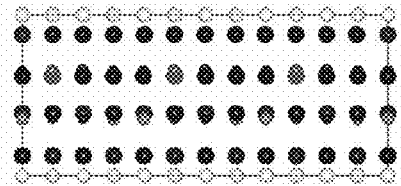
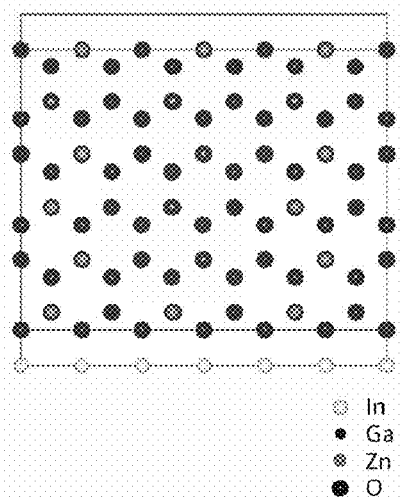

○ In
● Ga
◈ Zn
● O

○ In
● Ga
◉ Zn
● O crystal structure of InMZnO$_4$

FIG. 27A
FIG. 27B
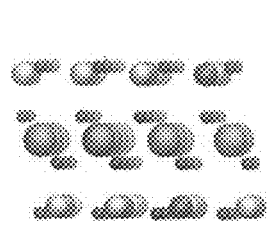
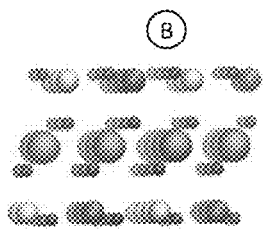
FIG. 27C
FIG. 27D
FIG. 27E
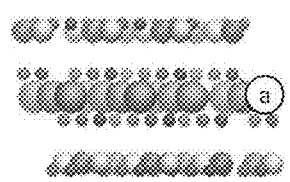
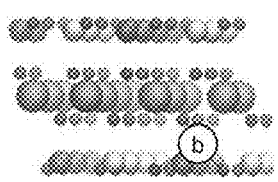
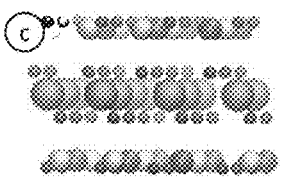
FIG. 27F
FIG. 27G
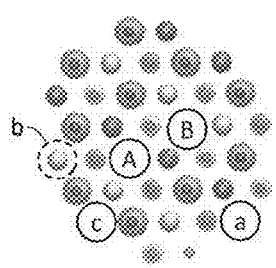
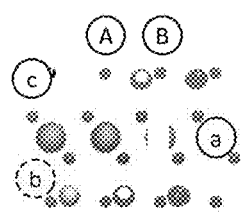
In
Ga
Zn
O
bonding position

- In
- Gd
- Zn
- O
- bonding position

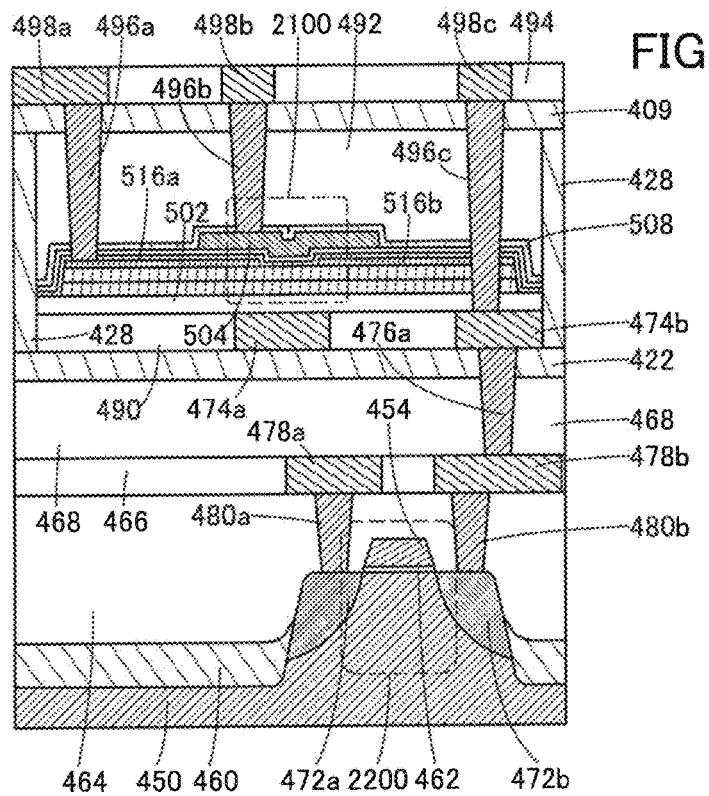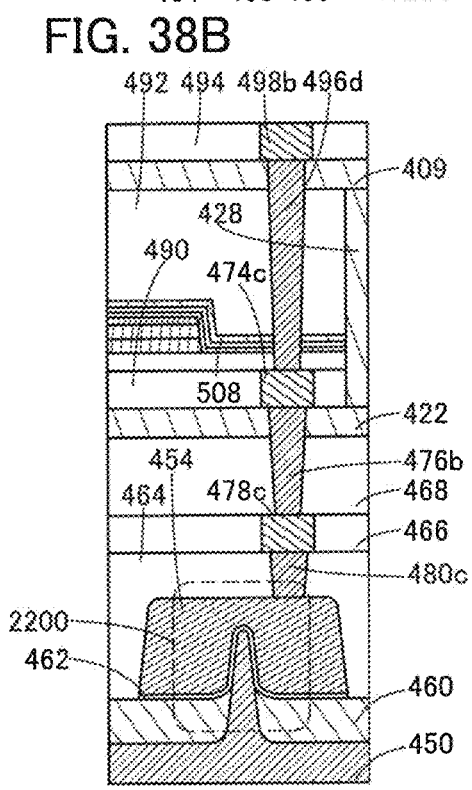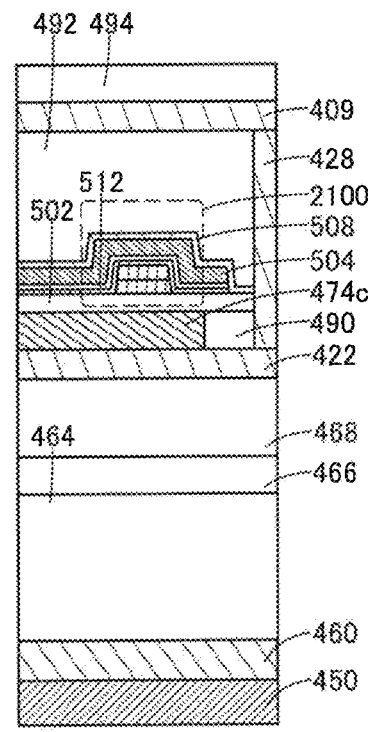

FIG. 49A1
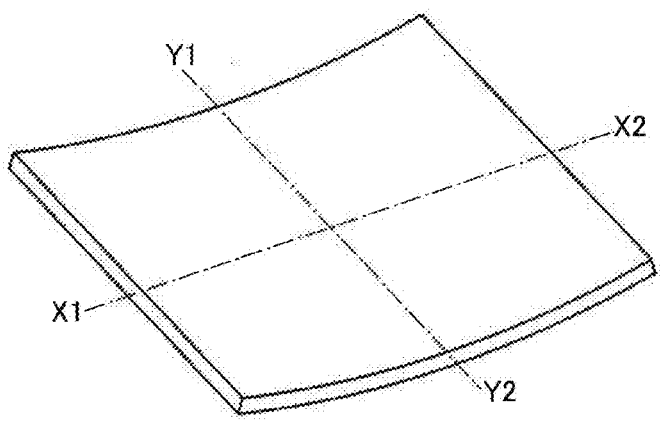
FIG. 49A2
FIG. 49A3
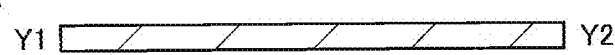
FIG. 49B1
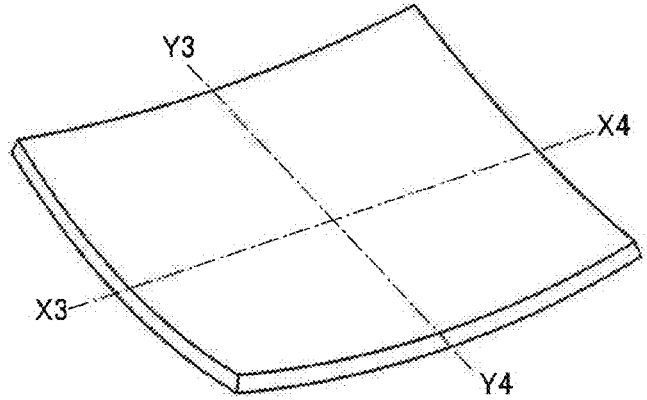
FIG. 49B2
FIG. 49B3
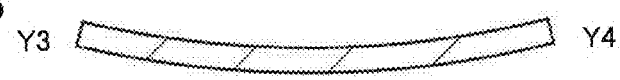

FIG. 57A
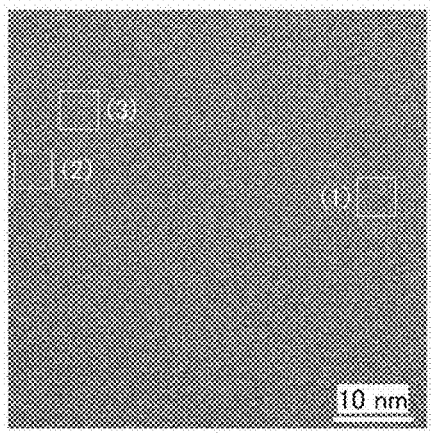
FIG. 57B　　FIG. 57C　　FIG. 57D
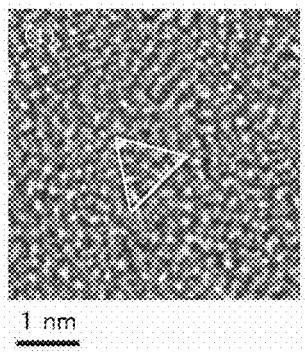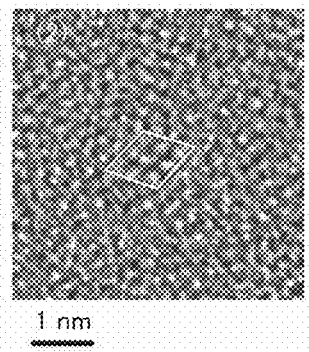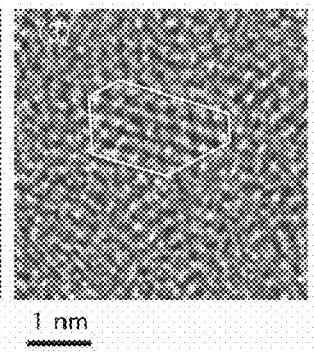

Electron beam is incident
from direction parallel to
sample surface

Electron beam is incident
from direction perpendicular to
sample surface

METHOD FOR MANUFACTURING SPUTTERING TARGET

TECHNICAL FIELD

The present invention relates to a sputtering target and a manufacturing method thereof.

The present invention relates to, for example, an oxide, a transistor, a semiconductor device, and manufacturing methods thereof. Furthermore, the present invention relates to, for example, an oxide, a display device, a light-emitting device, a lighting device, a power storage device, a memory device, a processor, or an electronic device. Furthermore, it relates to a manufacturing method of an oxide, a display device, a liquid crystal display device, a light-emitting device, a memory device, or an electronic device. Furthermore, it relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.t

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case where silicon is used in a transistor included in a large display device, it is preferable to use amorphous silicon, for which a technique of forming a film over a large substrate is established. In the case where silicon is used in a transistor included in a high-performance display device where a driver circuit and a pixel circuit are formed over the same substrate, it is preferable to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, an In—Ga—Zn oxide) have been actively developed.

Oxide semiconductors have a long history, and it was disclosed to use a crystal In—Ga—Zn oxide for a semiconductor element in 1988 (see Patent Document 1). In 1995, a transistor including an oxide semiconductor was invented, and its electrical characteristics were disclosed (see Patent Document 2).

In 2013, one group reported that an amorphous In—Ga—Zn oxide had an unstable structure in which crystallization is promoted by irradiation with an electron beam (see Non-Patent Document 1). It is also reported that the amorphous In—Ga—Zn oxide formed by the group has no ordering in observation with a high-resolution transmission electron microscope.

In 2014, a transistor using a crystalline In—Ga—Zn oxide that has more excellent electrical characteristics and higher reliability than a transistor using an amorphous In—Ga—Zn oxide was reported (see Non-Patent Document 2, Non-Patent Document 3, and Non-Patent Document 4). Here, it is reported that a crystal boundary is not clearly observed in an In—Ga—Zn oxide including a CAAC-OS (C-Axis Aligned Crystalline Oxide Semiconductor).

A sputtering target with which CAAC-OS having high crystallinity can be formed is disclosed (see Patent Document 3).

Meanwhile, as a kind of a crystalline structure of a polymer, a concept of "paracrystal" is known. A paracrystal is a crystalline structure which seemingly has a trace of crystal lattice but has distortion as compared with an ideal single crystal (see Non-Patent Document 5).

REFERENCE

Patent Document

[Patent Document 1] Japanese Published Patent Application No. S63-239117
[Patent Document 2] Japanese translation of PCT international application No. H11-505377
[Patent Document 3] Japanese Published Patent Application No. 2014-51735

Non-Patent Document

[Non-Patent Document 1] T. Kamiya, K. Kimoto, N. Ohashi, K. Abe, Y. Hanyu, H. Kumomi, and H. Hosono, Proceedings of *The 20th International Display Workshops,* 2013. AMD2-5L
[Non-Patent Document 2] S. Yamazaki, H. Suzawa. K. Inoue, K. Kato, T. Hirohashi, K. Okazaki, and N. Kimizuka. *Japanese Journal of Applied Physics,* 2014, vol. 53, 04ED18
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display,* 2014, Volume 22, Issue 1, pp. 55-67
[Non-Patent Document 4] S. Yamazaki, *The Electrochemical Society Transactions,* 2014, vol. 64(10), pp. 155-164
[Non-Patent Document 5] Rolf Hosemann, *Journal of Applied Physics,* 1963 January, vol. 34, number. 1, pp. 25-41

SUMMARY OF THE INVENTION

Problems to be Solved by the Invention

One object is to provide a sputtering target including an oxide with a low impurity concentration. Another object is to provide a sputtering target including an oxide with high crystallinity. Another object is to provide a method for forming an oxide with a low impurity concentration using the sputtering target. Another object is to provide a method for forming an oxide with high crystallinity using the sputtering target.

Another object is to provide a semiconductor device using an oxide as a semiconductor. Another object is to provide a module that includes a semiconductor device using an oxide as a semiconductor. Another object is to provide an electronic device that includes a semiconductor device using an oxide as a semiconductor or includes a module including a semiconductor device using an oxide as a semiconductor.

Another object is to provide a transistor with favorable electrical characteristics. Another object is to provide a transistor with stable electrical characteristics. Another object is to provide a transistor with high frequency characteristics. Another object is to provide a transistor with low off-state current. Another object is to provide a semiconductor device including the transistor. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems (1)

One embodiment of the present invention is a method for manufacturing a sputtering target, which includes a first step of preparing a mixture including indium, zinc, an element M (the element M is aluminum, gallium, yttrium, or tin), and oxygen a second step of raising a temperature of the mixture from a first temperature to a second temperature in a first atmosphere containing nitrogen at a concentration of higher than or equal to 90 vol % and lower than or equal to 100 vol %; and a third step of lowering the temperature of the mixture from the second temperature to a third temperature in a second atmosphere containing oxygen at a concentration of higher than or equal to 10 vol % and lower than or equal to 100 vol %.

(2)

One embodiment of the present invention is a method for manufacturing a sputtering target, which includes a first step of preparing a mixture including indium, zinc, an element M (the element M is aluminum, gallium, yttrium, or tin), and oxygen; a second step of raising a temperature of the mixture from a first temperature to a second temperature in a first atmosphere containing nitrogen at a concentration of higher than or equal to 90 vol % and lower than or equal to 100 vol %; a third step of maintaining the mixture at the second temperature in the first atmosphere for longer than or equal to 3 minutes and shorter than 24 hours; and a fourth step of lowering the temperature of the mixture from the second temperature to a third temperature in a second atmosphere containing oxygen at a concentration of higher than or equal to 10 vol % and lower than or equal to 100 vol %.

(3)

One embodiment of the present invention is a method for manufacturing a sputtering target, which includes a first step of preparing a mixture including indium, zinc, an element M (the element M is aluminum, gallium, yttrium, or tin), and oxygen;

a second step of raising a temperature of the mixture from a first temperature to a second temperature in a first atmosphere containing nitrogen at a concentration of higher than or equal to 90 vol % and lower than or equal to 100 vol %; a third step of maintaining the mixture at the second temperature in the first atmosphere for longer than or equal to 3 minutes and shorter than 24 hours; a fourth step of maintaining the mixture at the second temperature in a second atmosphere containing oxygen at a concentration of higher than or equal to 10 vol % and lower than or equal to 100 vol % for longer than or equal to 3 minutes and shorter than 24 hours; and the fourth step of lowering the temperature of the mixture from the second temperature to a third temperature in the second atmosphere.

(4)

One embodiment of the present invention is the method for manufacturing a sputtering target according to any one of (1) to (3), in which the first atmosphere includes a gas with a dew point of lower than −60° C.

(5)

One embodiment of the present invention is the method for manufacturing a sputtering target according to any one of (1) to (4), in which the second atmosphere includes a gas with a dew point of lower than −60° C.

(6)

One embodiment of the present invention is the method for manufacturing a sputtering target according to any one of (1) to (4), in which the second atmosphere includes dry air.

(7)

One embodiment of the present invention is the method for manufacturing a sputtering target according to any one of (1) to (6), in which the first temperature is higher than or equal to 10° C. and lower than or equal to 300° C.

(8)

One embodiment of the present invention is the method for manufacturing a sputtering target according to any one of (1) to (7), in which the second temperature is higher than or equal to 800° C. and lower than or equal to 1700° C.

(9)

One embodiment of the present invention is the method for manufacturing a sputtering target according to any one of (1) to (8), in which the third temperature is higher than or equal to 10° C. and lower than or equal to 300° C.

Effect of the Invention

A sputtering target including an oxide with a low impurity concentration can be provided. A sputtering target including an oxide with high crystallinity can be provided. A method for forming an oxide with a low impurity concentration using the sputtering target can be provided. A method for forming an oxide with high crystallinity using the sputtering target can be provided.

A semiconductor device using an oxide as a semiconductor can be provided. A module that includes a semiconductor device using an oxide as a semiconductor can be provided. An electronic device that includes a semiconductor device using an oxide as a semiconductor or includes a module including a semiconductor device using an oxide as a semiconductor can be provided.

A transistor with favorable electrical characteristics can be provided. A transistor with stable electrical characteristics can be provided. A transistor with high frequency characteristics can be provided. A transistor with low off-state current can be provided. A semiconductor device including the transistor can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIG. 5 Diagrams illustrating a hydrogen desorption model.

FIG. 27 Diagrams illustrating a position where a particle is attached to a pellet.

FIG. 38 Cross-sectional views illustrating a semiconductor device according to one embodiment of the present invention.

FIG. 49 Perspective views and cross-sectional views illustrating a semiconductor device according to one embodiment of the present invention.

FIG. 57 Cs-corrected high-resolution TEM images of a plane of a CAAC-OS.

MODE FOR CARRYING OUT THE INVENTION

Figure 1A:
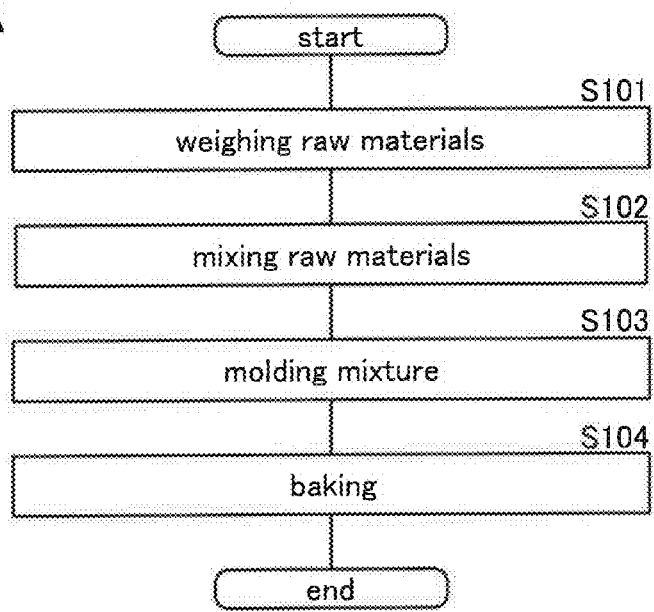
FIG. 1 A flow chart showing an example of a method for manufacturing a sputtering target, and a diagram illustrating conditions for baking.

Embodiments of the present invention will be described in detail with reference to the drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the invention with reference to the drawings, the same reference numerals are used in common for the same portions in different drawings. Note that the same hatch pattern is applied to similar parts, and the similar parts are not especially denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). Thus, a voltage can also be referred to as a potential. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" in this specification are used for convenience and do not denote the order of steps or the stacking order of layers. Therefore, for example, "first" can be replaced with "second", "third", or the like as appropriate. In addition, the ordinal numbers in this specification and the like do not correspond to the ordinal numbers which specify one embodiment of the present invention in some cases.

Note that what is represented as a "semiconductor" includes characteristics of an "insulator" in some cases when the conductivity is sufficiently low, for example. Furthermore, a "semiconductor" and an "insulator" cannot be strictly distinguished from each other in some cases because the border is not clear. Accordingly, a "semiconductor" described in this specification can be called an "insulator" in some cases. Similarly, an "insulator" described in this specification can be called a "semiconductor" in some cases.

Furthermore, what is represented as a "semiconductor" includes characteristics of a "conductor" in some cases when the conductivity is sufficiently high, for example. Furthermore, a "semiconductor" and a "conductor" cannot be strictly distinguished from each other in some cases because the border is not clear. Accordingly, a "semiconductor" described in this specification can be called a "conductor" in some cases. Similarly, a "conductor" described in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the DOS (Density of State) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (also included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, what is simply represented as a channel may refer to a surrounded channel width or an apparent channel width. Alternatively, in this specification, what is simply represented as a channel width may refer to an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°. Accordingly, the case where it is greater than or equal to −5° and less than or equal to 5° is also included. In addition, the term "substantially parallel" indicates that the angle formed between two straight lines is greater than or equal to −30° and less than or equal to 30°. Furthermore, the term "perpendicular" indicates that the angle formed between two straight lines is greater than or equal to 80° and less than or equal to 100°. Thus, the case where it is greater than or equal to 85° and less than or equal to 95° is also included. In addition, the term "substantially perpendicular" indicates that the angle formed between two straight lines is greater than or equal to 60° and less than or equal to 120°.

In this specification, when a crystal is a trigonal crystal or a rhombohedral crystal, it is represented as a hexagonal crystal system.

In this specification, what is represented as a semiconductor can also be referred to as an oxide semiconductor. As the semiconductor, a Group 14 semiconductor such as silicon or germanium; a compound semiconductor such as silicon carbide, germanium silicide, gallium arsenide, indium phosphide, zinc selenide, or cadmium sulfide; or an organic semiconductor can be used.

In this specification, what is simply represented as an oxide can also be referred to as an oxide semiconductor, an oxide insulator, or an oxide conductor.

<Target 1>

A sputtering target according to one embodiment of the present invention is described below. Note that application of the target is not limited to a sputtering method. For example, it can be used in a deposition method such as a molecular beam epitaxy (MBE) method or a pulsed laser deposition (PLD) method.

FIG. 1(A) is a flow chart showing a method for manufacturing a sputtering target.

First, raw materials are weighed (step S101). As the raw materials, first to nth oxide powders (n is a natural number of 2 or more) are used. For example, an indium oxide powder, a gallium oxide powder, and a zinc oxide powder are used. Note that instead of the indium oxide powder, the gallium oxide powder, and/or the zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, or a tungsten oxide powder may be used. For example, the molar ratio of the indium oxide powder to the gallium oxide powder and the zinc oxide powder is set to "2:2:1", "8:4:3", "3:1:1", "1:1:1", "4:2:3", "1:1:2", "3:1:4", "4:2:4.1", "5:5:6", "1:3:2", "1:3:4", or "3:1:2". With such a molar ratio, a sputtering target which includes a polycrystalline oxide with high crystallinity can be obtained easily later.

Note that, raw materials used in this embodiment are not limited to the above raw materials. For example, an indium oxide powder, a gallium oxide powder, a zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, a tungsten oxide powder, an indium oxide powder and a zinc oxide powder, an indium oxide powder and a gallium oxide powder, a gallium oxide powder and a zinc oxide powder, an aluminum oxide powder and a zinc oxide powder, a zinc oxide powder and a tin oxide powder, or an indium oxide powder and a tin oxide powder may be used as the raw materials.

When a material with high purity is used, a sputtering target which contains a polycrystalline oxide with a low impurity concentration can be obtained easily later. Specifically, alkali metals can be set to be lower than 10 ppm by weight, preferably lower than 5 ppm by weight, further preferably lower than 2 ppm by weight. Alkaline earth metals can be set to be lower than 5 ppm by weight, preferably lower than 2 ppm by weight, further preferably lower than 1 ppm by weight. Each halogen can be set to be lower than 10 ppm by weight, preferably lower than 5 ppm by weight, further preferably lower than 2 ppm by weight. Boron, magnesium, phosphorus, copper, and germanium can each be set to be lower than 5 ppm by weight, preferably lower than 2 ppm by weight, further preferably lower than 1 ppm by weight. Nitrogen can be set to be lower than 20 ppm by weight, preferably lower than 10 ppm by weight, further preferably lower than 5 ppm by weight, still further preferably lower than 2 ppm by weight. Silicon can be set to be lower than 50 ppm by weight, preferably lower than 20 ppm by weight, further preferably lower than 10 ppm by weight, still further preferably lower than 5 ppm by weight. Note that the impurity concentration may be measured by secondary ion mass spectrometry (SIMS), glow discharge mass spectrometry (GDMS), inductively coupled plasma mass spectrometry (ICP-MS), or the like.

Next, the weighed raw materials are mixed (step S102).

Then, the mixed raw materials are spread over a mold and molded (step S103).

Subsequently, the molded body is subjected to baking (also referred to as sintering) to form a sintered body (step S104).

Figure 1B:
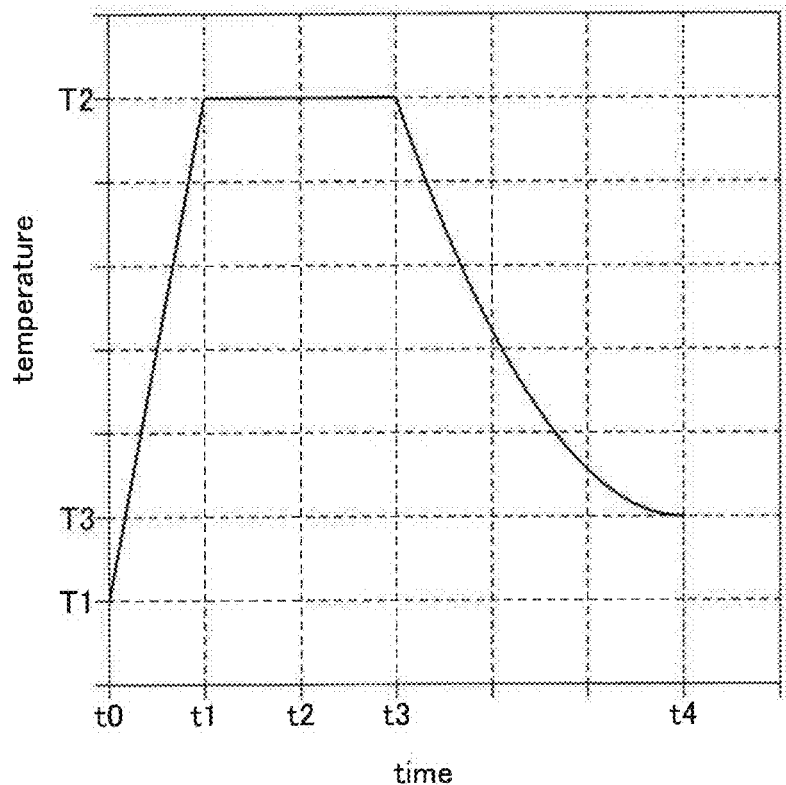

FIG. 1(B) is a diagram illustrating conditions for the baking. A furnace (also referred to as a baking furnace or a sintering furnace) is used in the baking. The baking is started at time t0 and a temperature T1 in an inert atmosphere. The temperature T1 may be, for example, higher than or equal to 10° C. and lower than or equal to 400° C. When the temperature T1 is too high, members of the furnace might deteriorate. When the temperature T1 is too low, a time for lowering to the temperature T1 might be long in a later temperature lowering step. Note that the inert atmosphere refers to an atmosphere which contains an inert gas such as nitrogen or a rare gas or an atmosphere which does not contain a reactive gas such as an oxidation gas. Specifically, an atmosphere containing a reactive gas such as an oxidation gas at lower than 10%, preferably lower than 5%, further preferably lower than 1%, still further preferably lower than 0.1% is employed. Note that the pressure inside the furnace in the baking may be a reduced pressure of lower than or equal to 100 Pa, lower than or equal to 10 Pa, or lower than or equal to 1 Pa. To reduce impurities which are to be mixed, the purity of the inert gas is preferably set to higher than or equal to 8N (99.999999%), preferably higher than or equal to 9N (99.9999999%).

Next, the temperature is raised to a temperature T2 in a period from the time t0 to time t1. The temperature T2 is, for example, higher than or equal to 800° C. and lower than or equal to 1700° C., preferably higher than or equal to 1000° C. and lower than or equal to 1400° C. The period from the time t0 to the time t1 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. Note that when the temperature is raised to the temperature T2, the temperature may exceed the temperature T2 temporarily depending on the furnace. In that case, it needs to become the temperature T2 after a predetermined time is elapsed. Therefore, at the time of actual processing, a period in which the temperature is higher than the temperature T2 that is the maximum temperature in FIG. 1(B) may be included.

Next, the temperature T2 is maintained from the time t1 to time t3. The period from the time t1 to the time t3 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. In that case, at time t2 between the time t1 and the time t3, the atmosphere inside the furnace is preferably switched. For example, it may be switched to an oxidation atmosphere. A period from the time t1 to the time t2 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. Note that an oxidation atmosphere refers to an atmosphere containing an oxidation gas. The oxidation gas is oxygen, ozone, nitrous oxide, or the like, and it is preferable that it do not contain water, hydrogen, and the like. In the oxidation atmosphere, an oxidation gas and an inert gas may be mixed. In that case, the atmosphere contains the oxidation gas at at least higher than or equal to 10%, preferably higher than or equal to 20%, further preferably higher than or equal to 50%, still further preferably higher than or equal to 90%. To reduce impurities to be mixed, the purity of the oxidation gas is preferably higher than or equal to 8N, preferably higher than or equal to 9N. Note that the pressure inside the furnace may be changed together with the switching of the atmosphere. For example, the pressure may be heightened from a reduced pressure to an atmospheric pressure. Alternatively, the pressure may be reduced from an atmospheric pressure.

In an inert atmosphere or under a reduced pressure, the temperature T2 is maintained, whereby hydrogen and water contained in the molded body can be effectively reduced. This can be explained by a hydrogen desorption model, which is to be described later. With desorption of hydrogen, oxygen vacancies (also represented as $V_O$) are formed in the molded body. Note that spaces included in the molded body are also reduced with the reduction in water, so that a sintered body whose density (also referred to as relative density) is high is formed.

In addition, the sintered body is maintained at the temperature T2 in an oxidation atmosphere, whereby oxygen vacancies in the sintered body can be reduced.

Next, the temperature is lowered to a temperature T3 in a period from the time t3 to time t4. The temperature T3 may be, for example, higher than or equal to 20° C. and lower than or equal to 500° C. When the temperature T3 is too high, a crack might be generated in the sintered body when the sintered body is taken out from the furnace. When the temperature T3 is too low, a time for lowering to the temperature T3 might be long.

Note that the conditions for baking are not limited to the conditions shown in FIG. 1(B). For example, it may be performed in conditions shown in FIG. 2(A) or FIG. 2(B).

Modification Example 1 of Baking Conditions

Figure 2A:
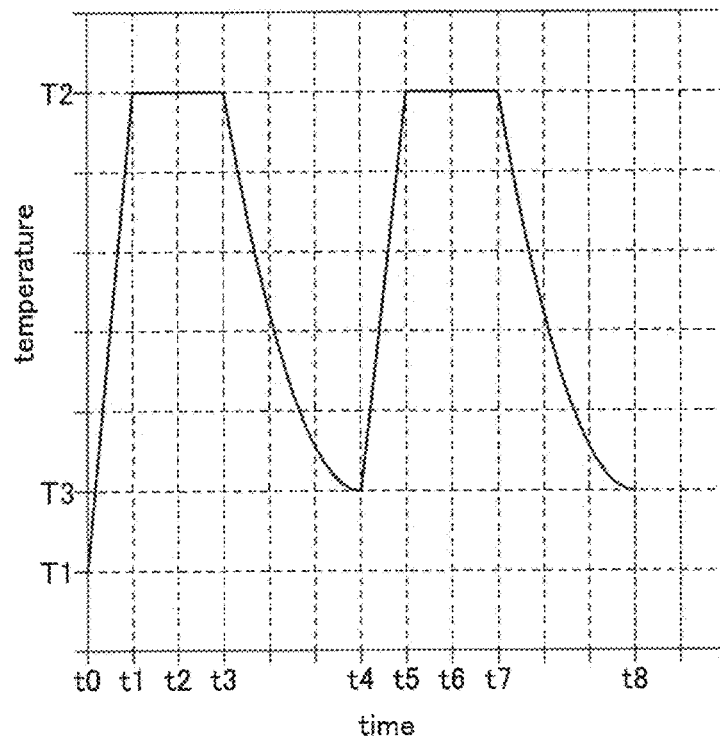
FIG. 2 Diagrams illustrating conditions for baking.

The conditions for baking shown in FIG. 2(A) begin at time t0 and a temperature T1 in an inert atmosphere. The temperature T1 may be, for example, higher than or equal to 10° C. and lower than or equal to 400° C. When the temperature T1 is too high, members might deteriorate. When the temperature T1 is too low, a time for lowering to the temperature T1 might be long. Note that the pressure inside the furnace in the baking may be a reduced pressure of lower than or equal to 100 Pa, lower than or equal to 10 Pa, or lower than or equal to 1 Pa.

Next, the temperature is raised to a temperature T2 in a period from the time t0 to time t1. The temperature T2 is, for example, higher than or equal to 800° C. and lower than or equal to 1700° C., preferably higher than or equal to 1000° C. and lower than or equal to 1400° C. The period from the time t0 to the time t1 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours.

Next, the temperature T2 is maintained from the time t1 to time t3. The period from the time t1 to the time t3 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. In that case, at time t2 between the time t1 and the time t3, the atmosphere inside the furnace is preferably switched. For example, it may be switched to an oxidation atmosphere. A period from the time t1 to the time t2 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. Note that the pressure inside the furnace may be changed together with the switching of the atmosphere. For example, the pressure may be heightened from a reduced pressure to an atmospheric pressure. Alternatively, the pressure may be reduced from an atmospheric pressure.

In an inert atmosphere or under a reduced pressure, the temperature T2 is maintained, whereby hydrogen and water contained in the molded body can be effectively reduced. With desorption of hydrogen, oxygen vacancies are formed in the molded body. Note that spaces included in the molded body are also reduced with the reduction in water, so that a sintered body whose density is high is formed.

In addition, the sintered body is maintained at the temperature T2 in an oxidation atmosphere, whereby oxygen vacancies in the sintered body can be reduced.

Next, the temperature is lowered to a temperature T3 in a period from the time t3 to time t4. The temperature T3 may be, for example, higher than or equal to 20° C. and lower than or equal to 500° C. When the temperature T3 is too low, a time for lowering to the temperature T3 might be long.

Next, at the time t4, the atmosphere inside the furnace is preferably switched. For example, it may be switched to an inert atmosphere. Note that the pressure inside the furnace may be changed together with the switching of the atmosphere. For example, the pressure may be heightened from a reduced pressure to an atmospheric pressure. Alternatively, the pressure may be reduced from an atmospheric pressure.

Next, the temperature is raised to the temperature T2 in a period from the time t4 to time t5. The period from the time t4 to the time t5 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. Note that at the time t5, the temperature may be raised to a temperature different from the temperature T2. For example, the temperature may be higher than the temperature T2. Alternatively, the temperature may be lower than the temperature T2. For example, at the time t5, the temperature is set to higher than the temperature T2, whereby hydrogen and water contained in the sintered body can be reduced more effectively. As a result, the crystallinity of the sintered body can be further increased.

Next, the temperature T2 is maintained from the time t5 to time t7. The period from the time t5 to the time t7 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. In that case, at time t6 between the time t5 and the time t7, the atmosphere inside the furnace is preferably switched. For example, it may be switched to an oxidation atmosphere. Note that the period from the time t5 to the time t7 may be a period different from the period from the time t1 to the time t3. For example, the period from the time t5 to the time t7 may be longer than the period from the time t1 to the time t3. Alternatively, the period from the time t5 to the time t7 may be shorter than the period from the time t1 to the time t3. A period from the time t5 to the time t6 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. Note that the period from the time t5 to the time t6 may be a period different from the period from the time t1 to the time t2. For example, the period from the time t5 to the time t6 may be longer than the period from the time t1 to the time t2. Alternatively, the period from the time t5 to the time t6 may be shorter than the period from the time t1 to the time t2. Note that the pressure inside the furnace may be changed together with the switching of the atmosphere. For example, the pressure may be heightened from a reduced pressure to an atmospheric pressure. Alternatively, the pressure may be reduced from an atmospheric pressure.

In addition, the sintered body is maintained at the temperature T2 in an oxidation atmosphere, whereby oxygen vacancies in the sintered body can be reduced.

Next, the temperature is lowered to the temperature T3 in a period from the time t7 to time t8. Note that at the time t8, the temperature may be lowered to a temperature different from the temperature T3. For example, the temperature may be higher than the temperature T3. Alternatively, the temperature may be lower than the temperature T3. The temperature is set to be lower than the temperature T3, whereby cracking in the sintered body when the sintered body is taken out from the furnace can be prevented.

Note that the processing for raising the temperature inside the furnace and then lowering the temperature is performed for two cycles in the conditions for baking shown in FIG. 2(A); however, baking according to one embodiment of the present invention is not limited to the above-described conditions. For example, it may be repeated for three or more cycles. In addition, the temperature to be raised may be increased with each cycle. Alternatively, the temperature to be raised may be reduced with each cycle.

Modification Example 2 of Baking Conditions

Figure 2B:
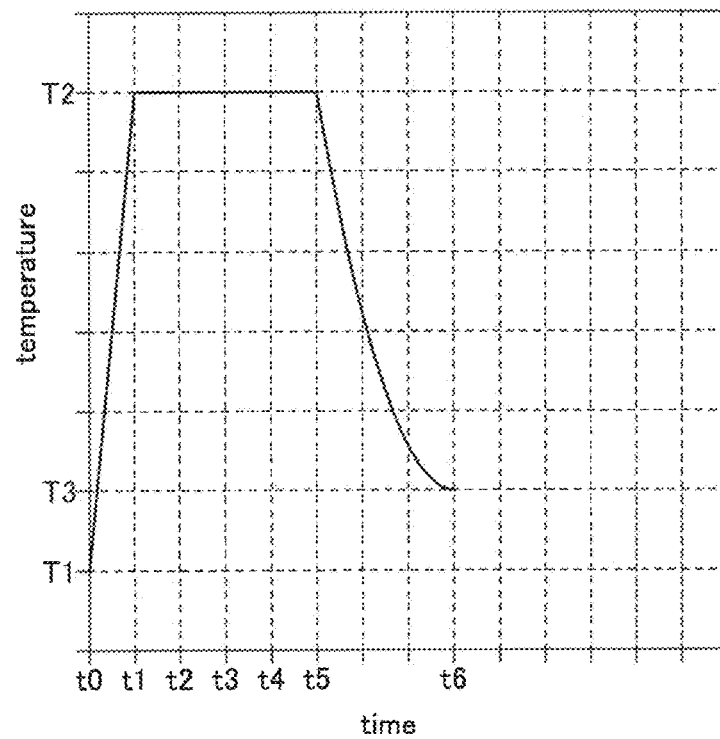

The conditions for baking shown in FIG. 2(B) begin at time t0 and a temperature T1 in an inert atmosphere. The temperature T1 may be, for example, higher than or equal to 100° C. and lower than or equal to 400° C. When the temperature T1 is too high, members might deteriorate. When the temperature T1 is too low, a time for lowering to the temperature T1 might be long. Note that the pressure inside the furnace in the baking may be a reduced pressure of lower than or equal to 100 Pa, lower than or equal to 10 Pa, or lower than or equal to 1 Pa.

Next, the temperature is raised to a temperature T2 in a period from the time t0 to time t1. The temperature T2 is, for example, higher than or equal to 800° C. and lower than or equal to 1700° C., preferably higher than or equal to 1000° C. and lower than or equal to 1400° C. The period from the time t0 to the time t1 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours.

Next, the temperature T2 is maintained from the time t1 to time t5. The period from the time t1 to the time t5 is, for example, longer than or equal to 1 hour and shorter than or equal to 72 hours, preferably longer than or equal to 2 hours and shorter than or equal to 36 hours, further preferably longer than or equal to 4 hours and shorter than or equal to 12 hours. In that case, at time t2 between the time t1 and the time t5, the atmosphere inside the furnace is preferably switched. For example, it may be switched to an oxidation atmosphere. A period from the time t1 to the time t2 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. In addition, at time 3 between the time t2 and the time t5, the atmosphere inside the furnace is preferably switched. For example, it may be switched to an inert atmosphere. A period from the time t2 to the time t3 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. Furthermore, at time t4 between the time t3 and the time t5, the atmosphere inside the furnace is preferably switched. For example, it may be switched to an oxidation atmosphere. A period from the time t3 to the time t4 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. A period from the time t4 to the time t5 is, for example, longer than or equal to 0.5 hours and shorter than or equal to 70 hours, preferably longer than or equal to 1 hour and shorter than or equal to 30 hours, further preferably longer than or equal to 2 hours and shorter than or equal to 10 hours. Note that the pressure inside the furnace may be changed together with the switching of the atmosphere. For example, the pressure may be heightened from a reduced pressure to an atmospheric pressure. Alternatively, the pressure may be reduced from an atmospheric pressure.

In an inert atmosphere or under a reduced pressure, the temperature T2 is maintained, whereby hydrogen and water contained in the molded body can be effectively reduced. With desorption of hydrogen, oxygen vacancies are formed in the molded body. Note that spaces included in the molded body are also reduced with the reduction in water, so that a sintered body whose density is high is formed.

In addition, the sintered body is maintained at the temperature T2 in an oxidation atmosphere, whereby oxygen vacancies in the sintered body can be reduced.

Next, the temperature is lowered to a temperature T3 in a period from the time t5 to time t6. The temperature T3 may be, for example, higher than or equal to 20° C. and lower than or equal to 500° C. When the temperature 13 is too low, a time for lowering to the temperature T3 might be long.

Baking is performed in the conditions shown in FIG. 2(B), whereby hydrogen and water contained in the sintered body can be reduced more effectively. In addition, oxygen vacancies can be further reduced.

Note that the processing for raising the temperature inside the furnace and then lowering the temperature is performed for one cycle in the conditions for baking shown in FIG. 2(B); however, baking according to one embodiment of the present invention is not limited to the above-described conditions. For example, it may be repeated for two or more cycles. In addition, the temperature to be raised may be increased with each cycle. Alternatively, the temperature to be raised may be reduced with each cycle.

The sintered body formed by being baked in the above-described conditions or the like is subjected to finishing treatment, so that a sputtering target is manufactured. Specifically, division or grinding is performed so that the length, the width, and the thickness of the sintered body are adjusted. Furthermore, since abnormal discharge might occur when a surface has minute unevenness, polishing treatment is performed on the surface. The polishing treatment is preferably performed by chemical mechanical polishing (CMP).

Through the above steps, the sputtering target with a low concentration of impurities such as hydrogen can be manufactured. Furthermore, the sputtering target with a small amount of oxygen vacancies can be manufactured. In addition, the sputtering target with high crystallinity can be manufactured. Moreover, the sputtering target with a high relative density can be manufactured. Specifically, the relative density of the sputtering target can be set to higher than or equal to 90%, higher than or equal to 95%, or higher than or equal to 99%. In addition, the purity of the sputtering target can be increased. Specifically, the proportion of main components of the sputtering target can be higher than or equal to 99.9 wt % (3N), preferably higher than or equal to 99.99 wt % (4N), further preferably higher than or equal to 99.999 wt % (5N). Such a sputtering target can be called a highly purified intrinsic or substantially highly purified intrinsic sputtering target.

With the use of the manufactured sputtering target, a film with a low impurity concentration can be formed. Alternatively, a film with a low hydrogen concentration can be formed. Alternatively, a film with a small amount of defects can be formed. Alternatively, a film with a low carrier density can be formed. Alternatively, a film with high crystallinity can be formed. Note that a film which is formed using the manufactured sputtering target is a film according to one embodiment of the present invention. In addition, a device including a film formed using the manufactured sputtering target is a device according to one embodiment of the present invention.

<Hydrogen Desorption Model>

A hydrogen desorption model of an In-M-Zn oxide is described below.

Figure 3A:
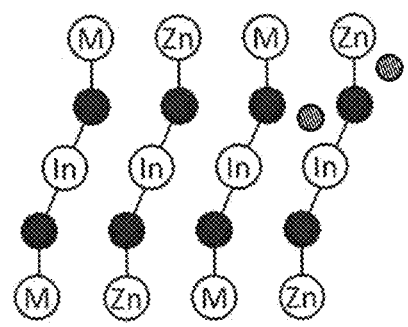
FIG. 3 Diagrams illustrating a hydrogen desorption model.

FIG. 3(A) is a schematic view illustrating the crystal structure of an In-M-Zn oxide. Hydrogen atoms that are impurities exist in the In-M-Zn oxide.

Figure 3B:
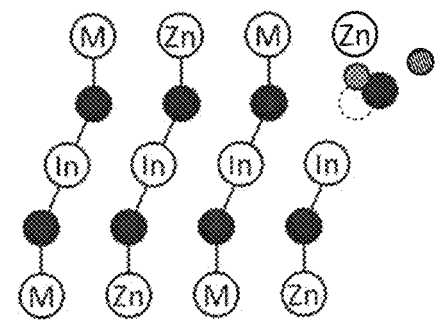
Figure 3C:
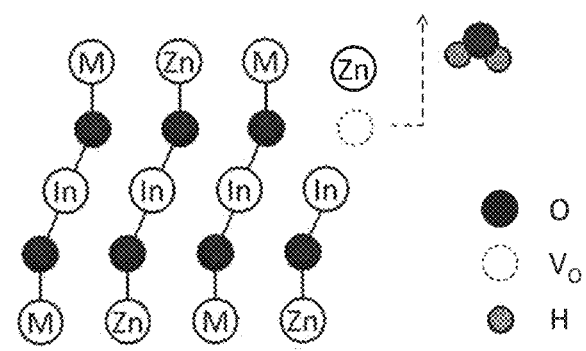

When the In-M-Zn oxide is heated in an inert atmosphere or under a reduced pressure in this state, one hydrogen atom is bonded to one oxygen atom to form OH (see FIG. 3(B)). When the OH reaches a surface of the In-M-Zn oxide, it is bonded to another hydrogen atom to be desorbed as $H_2O$ (see FIG. 3(C)). At this time, a site from which oxygen has come out serves as an oxygen vacancy ($V_O$).

Thus, it is found that one oxygen atom of the In-M-Zn oxide makes two hydrogen atoms being desorbed.

Figure 4A:
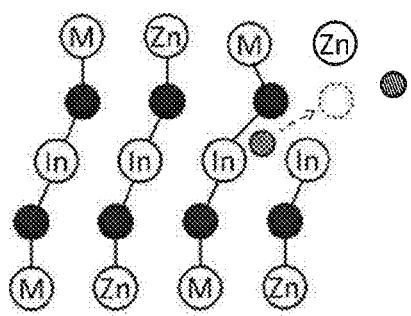
FIG. 4 Diagrams illustrating a hydrogen desorption model.
Figure 4B:
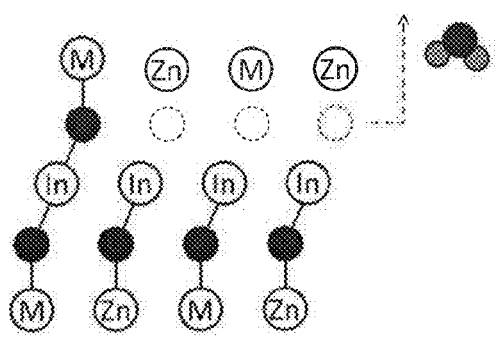

As illustrated in FIG. 4(A), distortion is generated in atomic arrangement around the site which has become an oxygen vacancy. Because of the distortion of the atomic arrangement, there is a possibility that a bond between adjacent oxygen and indium atoms is easy to break. A hydrogen atom is bonded to an unpaired electron of an oxygen atom with a broken bond to form new OH. As described above, when the OH reaches the surface of the In-M-Zn oxide, it is bonded to another hydrogen atom to be desorbed as $H_2O$. In this manner, an oxygen vacancy is additionally formed. By repeating this, the hydrogen concentration is reduced. Then, oxygen vacancies are increased sequentially in one layer (see FIG. 4(B)).

Meanwhile, when the In-M-Zn oxide is heated in an oxidation atmosphere, an oxygen vacancy which is generated by desorption of $H_2O$ is filled with oxygen immediately; therefore, distortion of atomic arrangement does not occur. Since a bond of an oxygen atom is difficult to break in heating in an oxidation atmosphere, an effect of reducing the hydrogen concentration is smaller than that of heating in an inert atmosphere or under a reduced pressure.

Figure 4C:
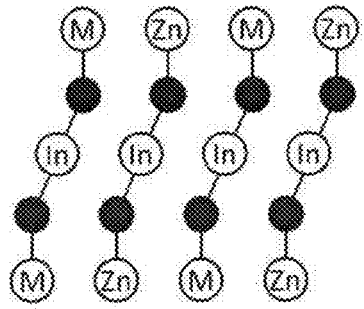
Figure 4D:
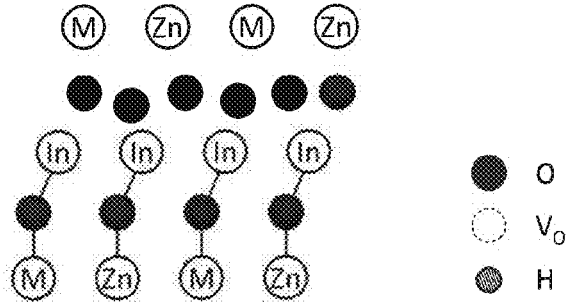

It is found that heating in an inert atmosphere or under a reduced atmosphere can reduce the hydrogen concentration of the In-M-Zn oxide but increases oxygen vacancies at the same time. Therefore, after heating in an inert atmosphere or under a reduced pressure, heating in an oxygen atmosphere is preferably performed. By the heating in an oxidation atmosphere, oxygen vacancies formed in the In-M-Zn oxide can be reduced. The In-M-Zn oxide with reduced oxygen vacancies may return to the original crystal structure as illustrated in FIG. 4(C) or may have a larger number of oxygen atoms than the original crystal structure as illustrated in FIG. 4(D).

As described above, it is suggested that the In-M-Zn oxide can have a reduced hydrogen concentration while maintaining the crystal structure. Note that when the temperature is lowered in the state where the In-M-Zn oxide includes a large amount of oxygen vacancies, a long-time heating may be needed for returning to the original crystal structure. Therefore, switching from an inert atmosphere or a reduced pressure to an oxidation atmosphere is preferably performed at around a maximum temperature for heating.

<Cohesiveness of Oxygen Vacancies>

Next, cohesiveness of oxygen vacancies is described with the use of first-principles calculations.

In the first-principles calculations, VASP (Vienna Ab initio Simulation Package) was used. For the exchange-correlation potential, PBE (Perdew-Burke-Emzerhof) type generalized gradient approximation (GGA: Generalized Gradient Approximation) was used, and for the ion potential, a PAW (Projector Augmented Wave) method was used. The cut-off energy was 400 eV, and k-point sampling was only Γ point.

FIG. 5(A) and FIG. 5(B) illustrate an $InGaZnO_4$ crystal (252 atoms) which is one kind of In-M-Zn oxide. FIG. 5(A) illustrates the structure seen from a direction perpendicular to the c-axis, and FIG. 5(B) illustrates the structure seen from a direction parallel to the c-axis. Note that frame lines illustrated in FIG. 5(A) and FIG. 5(B) indicate periodic boundaries.

Here, oxygen vacancies were put in the $InGaZnO_4$ crystal, and stability thereof was investigated.

Figure 6A:
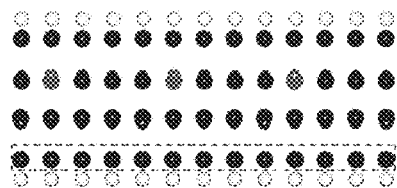
FIG. 6 Diagrams illustrating a hydrogen desorption model.
Figure 6B:
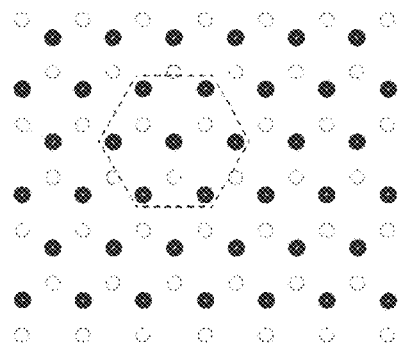
Figure 6C:
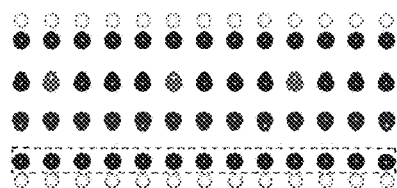
Figure 6D:
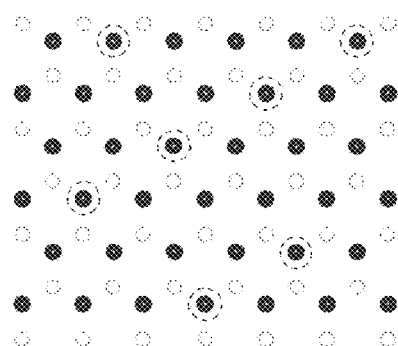
Figure 6E:
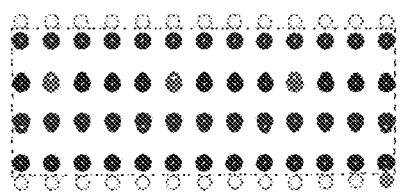
Figure 7A:
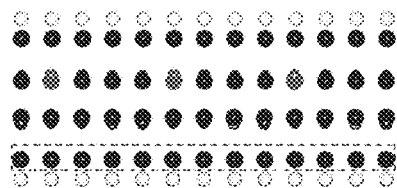
FIG. 7 Diagrams illustrating a hydrogen desorption model.
Figure 7B:
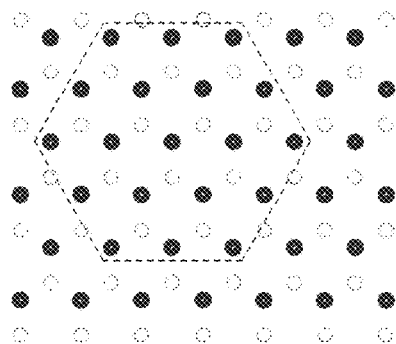
Figure 7C:
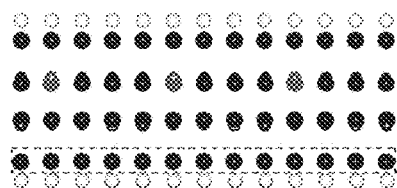
Figure 7D:
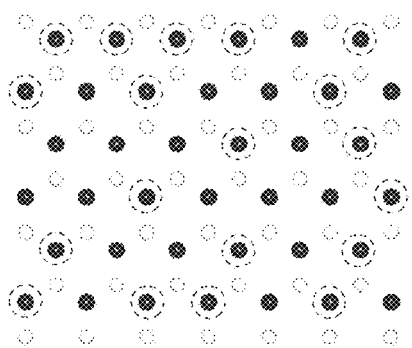
Figure 7E:
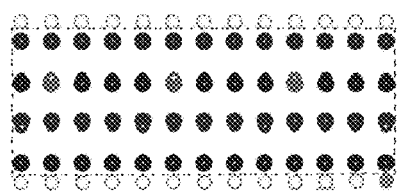

Model A is a model from which seven oxygen atoms are extracted, as illustrated in a portion surrounded by a broken line in FIG. 6(B), in a layer in a portion surrounded by a broken line in FIG. 6(A). That is, it is a model where oxygen vacancies cohere. Model B is a model from which seven oxygen atoms in portions surrounded by broken lines illustrated in FIG. 6(D) are removed from a layer in a portion surrounded by a broken line in FIG. 6(C). That is, it is a model where oxygen vacancies exist only in one layer but are dispersed as compared to those in Model A. Model C is a model from which seven oxygen atoms are removed at random from a portion surrounded by a broken line in FIG. 6(E), i.e., the whole $InGaZnO_4$ crystal. That is, it is a model where oxygen vacancies of the $InGaZnO_4$ crystal are dispersed. Model D is a model from which 19 oxygen atoms are removed, as illustrated in a portion surrounded by a broken line in FIG. 7(B), in a layer in a portion surrounded by a broken line in FIG. 7(A). That is, it is a model where oxygen vacancies cohere. Model E is a model from which 19 oxygen atoms are removed, as illustrated in portions surrounded by broken lines in FIG. 7(D), in a layer in a portion surrounded by a broken line in FIG. 7(C). That is, it is a model where oxygen vacancies exist in only one layer but are dispersed as compared to those in Model D. Model F is a model from which 19 oxygen atoms are removed at random from a portion surrounded by a broken line in FIG. 7(E), i.e., the whole $InGaZnO_4$ crystal. That is, it is a model where oxygen vacancies of the $InGaZnO_4$ crystal are dispersed.

Model A, Model B, Model C, Model D. Model E, and Model F were subjected to structural optimization, and the energy of the structure after optimization was calculated. In each model, the arrangement of oxygen vacancies were changed in several ways, and the energy of the structure after structural optimization was calculated.

Figure 8A:
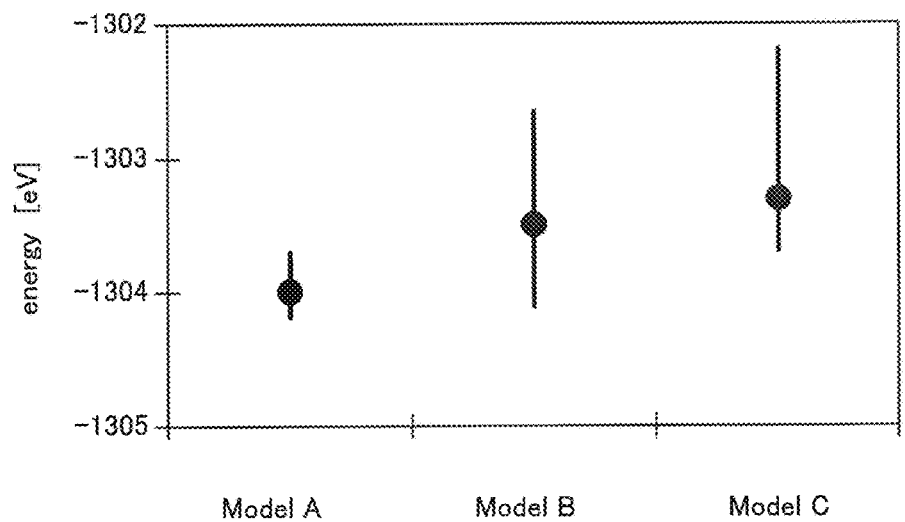
FIG. 8 Diagrams illustrating a hydrogen desorption model.
Figure 8B:
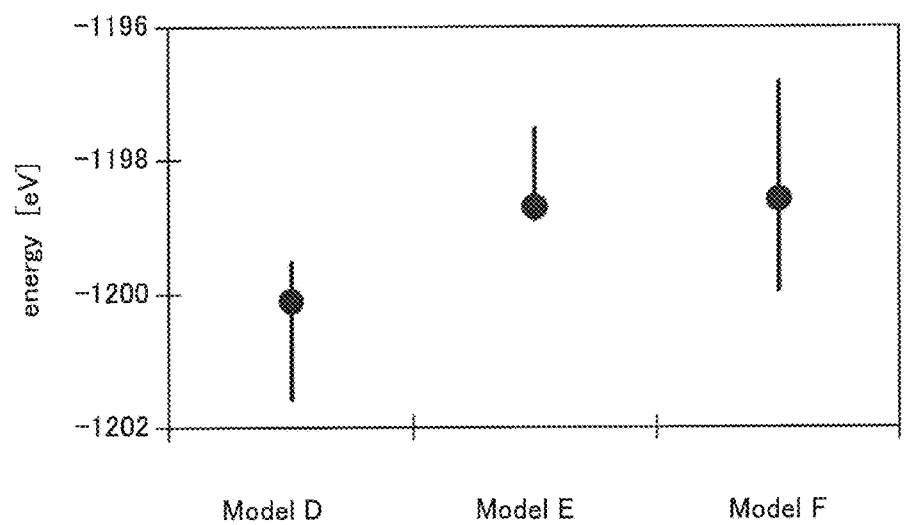

FIG. 8(A) shows the energies of the structures after structural optimization in Model A, Model B, and Model C. FIG. 8(B) shows the energies of the structures after structural optimization in Model D, Model E, and Model F. Note that a symbol denoted by a circle indicates a median value.

As shown in FIG. 8(A), comparison among Model A, Model B, and Model C indicated that Model A had the lowest energy. In addition, as shown in FIG. 8(B), comparison among Model D, Model E, and Model F indicated that Model D has the lowest energy. Both Models A and D are a model where oxygen vacancies cohere. That is, oxygen vacancies are more stable in the case where they cohere than in the case where they are dispersed when the number of oxygen vacancies is the same in both cases.

The calculation results suggest that oxygen vacancies are likely to cohere.

<Target 2>

Another method for manufacturing a sputtering target according to one embodiment of the present invention is described below.

Figure 9:
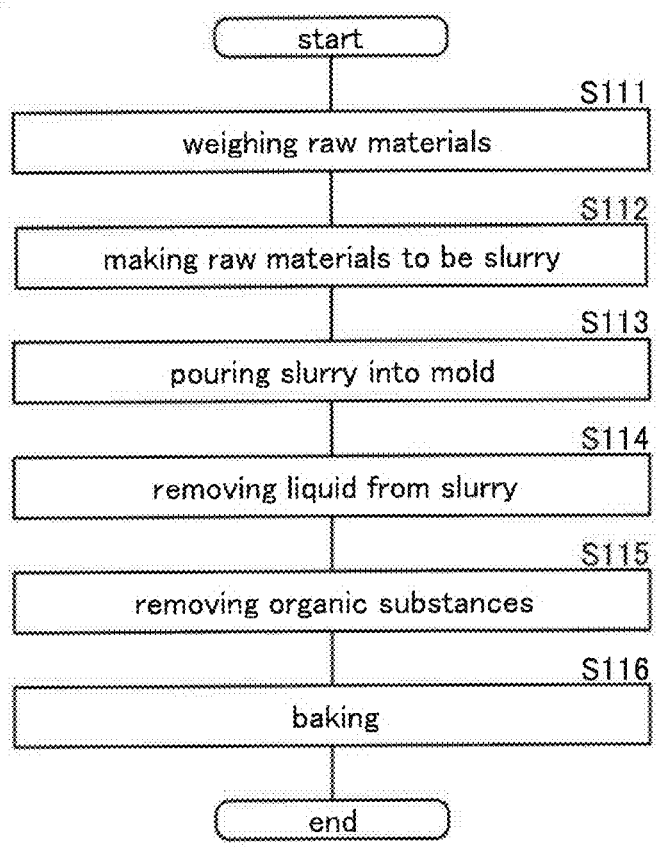
FIG. 9 A flow chart showing an example of a method for manufacturing a sputtering target.

FIG. 9 is a flow chart showing a method for manufacturing a sputtering target.

First, raw materials are weighed (step S111). As the raw materials, first to nth oxide powders (n is a natural number of 2 or more) are used. For example, an indium oxide powder, a gallium oxide powder, and a zinc oxide powder are used. Note that instead of the indium oxide powder, the gallium oxide powder, and/or the zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, or a tungsten oxide powder may be used. For example, the molar ratio of the indium oxide powder to the gallium oxide powder and the zinc oxide powder is set to "2:2:1", "8:4:3", "3:1:1", "1:1:1", "4:2:3", "2:1:2", "3:1:4", "4:2:4.1", "5:5:6", "1:3:2", "1:3:4", or "3:1:2". With such a molar ratio, a sputtering target which includes a polycrystalline oxide with high crystallinity can be obtained easily later.

Note that, raw materials used in this embodiment are not limited to the above raw materials. For example, an indium oxide powder, a gallium oxide powder, a zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, a tungsten oxide powder, an indium oxide powder and a zinc oxide powder, an indium oxide powder and a gallium oxide powder, a gallium oxide powder and a zinc oxide powder, an aluminum oxide powder and a zinc oxide powder, a zinc oxide powder and a tin oxide powder, or an indium oxide powder and a tin oxide powder may be used as the raw materials.

Next, the weighed materials, water, and organic substances (a dispersant and a binder) are mixed to give slurry (step S112).

Next, the slurry is poured into a mold (step S113). One or more suction ports are provided at a bottom of the mold, which enables suction of water and the like. In addition, a filter is provided at the bottom of the mold. The filter has a function of inhibiting the raw material powders to pass and allowing water and the organic substance to pass. Specifically, a filter in which a porous resin film is attached over a woven fabric or a felt may be used.

Next, water and the like of the slurry are sucked through the filter provided at the bottom of the mold to remove water and organic substances from the slurry, so that a molded body is formed (step S114). The use of the slurry raw materials makes it possible to form the molded body where the raw materials are mixed homogeneously.

Note that in the obtained molded body, water and the organic substances are slightly left; thus, drying treatment and a removal of the organic substances are performed (step S115). The drying treatment is preferably natural drying because the molded body is less likely to be cracked. Furthermore, heat treatment is performed at a temperature higher than or equal to 300° C. and lower than or equal to 700° C., so that water and organic substance which cannot be eliminated by natural drying can be removed.

Next, the molded body is baked to form a sintered body (step S116). Note that the baking may be performed in the conditions shown in FIG. 1(B), FIG. 2(A), or FIG. 2(B).

The formed sintered body is subjected to finishing treatment, so that a sputtering target is manufactured. Specifically, division or grinding is performed so that the length, the width, and the thickness of the sintered body are adjusted. Furthermore, since abnormal discharge might occur when a surface has minute unevenness, polishing treatment is performed on the surface. The polishing treatment is preferably performed by CMP.

Through the above steps, a sputtering target with a low concentration of impurities such as hydrogen can be manufactured. Furthermore, a sputtering target with a small amount of oxygen vacancies can be manufactured. Moreover, a sputtering target with high crystallinity can be manufactured. In addition, since mixing of the raw materials can be performed homogeneously when the molded body is formed, a sputtering target with a higher relative density can be manufactured.

With the use of the manufactured sputtering target, a film with a low impurity concentration can be formed. Alternatively, a film with a low hydrogen concentration can be formed. Alternatively, a film with a small amount of defects can be formed. Alternatively, a film with a low carrier density can be formed. Alternatively, a film with high crystallinity can be formed. Note that a film which is formed using the manufactured sputtering target is a film according to one embodiment of the present invention. In addition, a device including a film formed using the manufactured sputtering target is a device according to one embodiment of the present invention.

<Target 3>

Another method for manufacturing a sputtering target according to one embodiment of the present invention is described below.

Figure 10:
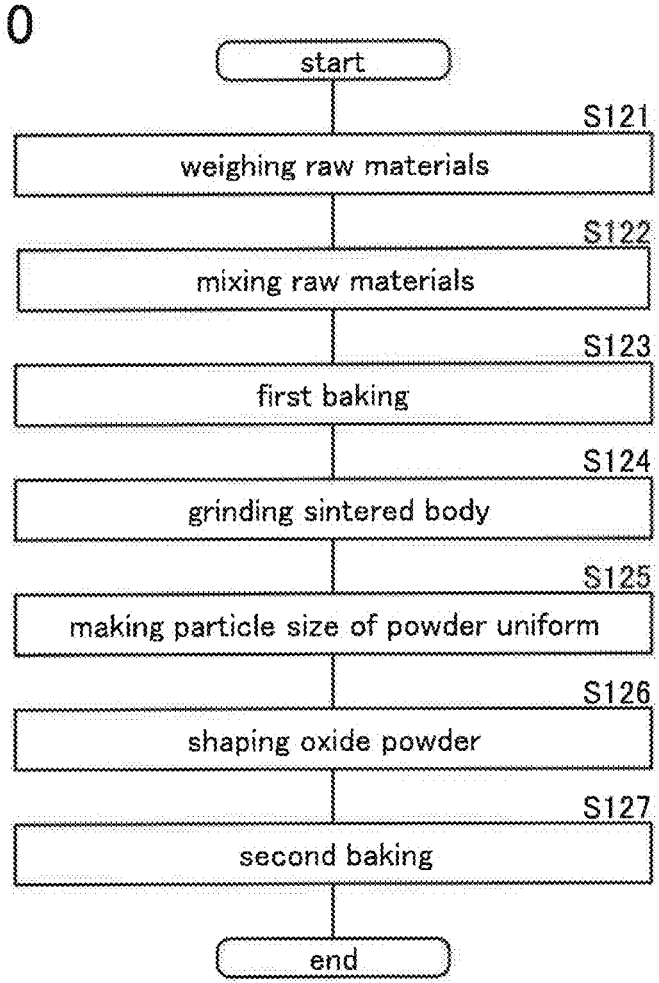
FIG. 10 A flow chart showing an example of a method for manufacturing a sputtering target.

FIG. 10 is a flow chart showing a method for manufacturing a sputtering target.

First, raw materials are weighed (step S121). As the raw materials, first to nth oxide powders (n is a natural number of 2 or more) are used. For example, an indium oxide powder, a gallium oxide powder, and a zinc oxide powder are used. Note that instead of the indium oxide powder, the gallium oxide powder, and/or the zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, or a tungsten oxide powder may be used. For example, the molar ratio of the indium oxide powder to the gallium oxide powder and the zinc oxide powder is set to "2:2:1", "8:4:3", "3:1:1", "1:1:1", "4:2:3", "1:1:2", "3:1:4", "4:2:4.1", "5:5:6", "1:3:2", "1:3:4", or "3:1:2". With such a molar ratio, a sputtering target which includes a polycrystalline oxide with high crystallinity can be obtained easily later.

Note that, raw materials used in this embodiment are not limited to the above raw materials. For example, an indium oxide powder, a gallium oxide powder, a zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, a tungsten oxide powder, an indium oxide powder and a zinc oxide powder, an indium oxide powder and a gallium oxide powder, a gallium oxide powder and a zinc oxide powder, an aluminum oxide powder and a zinc oxide powder, a zinc oxide powder and a tin oxide powder, or an indium oxide powder and a tin oxide powder may be used as the raw materials.

Next, the weighed raw materials are mixed (step S122).

Next, the mixed raw materials are baked (first baking) (step S123). Note that the first baking may be performed in the conditions shown in FIG. 1(B), FIG. 2(A), or FIG. 2(B).

By performing the first baking, an oxide which is a reactive product of the mixed raw materials is obtained. Here, an In—Ga—Zn oxide is obtained. Note that the first baking may be performed plural times with different conditions.

Next, an In—Ga—Zn oxide powder with crystallinity is obtained by grinding the In—Ga—Zn oxide (step S124). A mill machine such as a ball mill may be used for grinding the In—Ga—Zn oxide. For a ball of the ball mill, a substance with a high degree of hardness such as agate, aluminum oxide, zirconium oxide, tungsten carbide, or silicon carbide may be used. There is no particular limitation on a container used for the ball mill. A material that is the same as the ball is preferably used. Note that grinding in the ball mill is preferably performed for longer than or equal to 8 hours and shorter than or equal to 72 hours, preferably longer than or equal to 20 hours and shorter than or equal to 72 hours.

Note that after the step S124, the process returns to the step S123, and the In—Ga—Zn oxide powder may be subjected to the first baking. In that case, after the first baking, the In—Ga—Zn oxide is ground again in the step S124. When the step S123 and the step S124 are repeated plural times, the crystallinity of the In—Ga—Zn oxide powder can be further increased.

Next, the particle size of the obtained In—Ga—Zn oxide powder is made uniform (step S125). Here, treatment is performed so that a particle size of the In—Ga—Zn oxide powder is less than or equal to 1 μm, preferably less than or equal to 0.5 μm, further preferably less than or equal to 0.3 μm. For this treatment, a sieve or a filter through which a particle of less than or equal to 1 μm, preferably less than or equal to 0.5 μm, further preferably less than or equal to 0.3 μm passes may be used. Then, an In—Ga—Zn oxide powder having a particle size less than 0.01 μm, which tends to have low crystallinity, is preferably removed. For the removal, a sieve or a filter through which a particle of less than 0.01 μm passes may be used. In the above manner, an In—Ga—Zn oxide powder whose particle size is greater than or equal to 0.01 μm and less than or equal to 1 μm, greater than or equal to 0.01 μm and less than or equal to 0.5 μm, or greater than or equal to 0.01 μm and less than or equal to 0.3 μm can be obtained.

Subsequently, a mold is spread over the In—Ga—Zn oxide to perform shaping (step S126).

Then, the molded body is baked (second baking) to form a sintered body (step S127). Note that the second baking may be performed in the conditions shown in FIG. 1(B), FIG. 2(A), or FIG. 2(B).

The formed sintered body is subjected to finishing treatment, so that a sputtering target is manufactured. Specifically, division or grinding is performed so that the length, the width, and the thickness of the sintered body are adjusted. Furthermore, since abnormal discharge might occur when a surface has minute unevenness, polishing treatment is performed on the surface. The polishing treatment is preferably performed by CMP.

Through the above steps, a sputtering target with a low concentration of impurities such as hydrogen can be manufactured. Furthermore, a sputtering target with a small amount of oxygen vacancies can be manufactured. Since the crystallinity of the oxide powder included in the molded body is high, a sputtering target with higher crystallinity can be manufactured. Moreover, the sputtering target with a high relative density can be manufactured.

With the use of the manufactured sputtering target, a film with a low impurity concentration can be formed. Alternatively, a film with a low hydrogen concentration can be formed. Alternatively, a film with a small amount of defects can be formed. Alternatively, a film with a low carrier density can be formed. Alternatively, a film with high crystallinity can be formed. Note that a film which is formed using the manufactured sputtering target is a film according to one embodiment of the present invention. In addition, a device including a film formed using the manufactured sputtering target is a device according to one embodiment of the present invention.

<Target 4>

Figure 11:
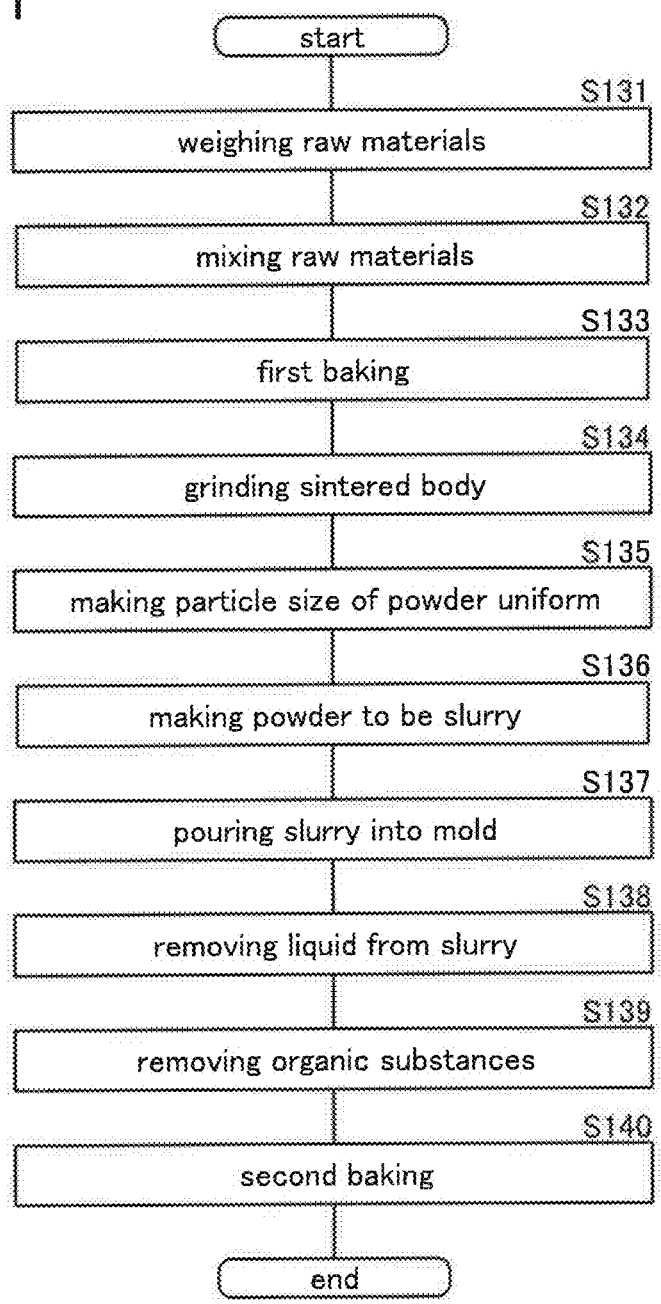
FIG. 11 A flow chart showing an example of a method for manufacturing a sputtering target.

Another method for manufacturing a sputtering target according to one embodiment of the present invention is described below FIG. 11 is a flow chart showing a method for manufacturing a sputtering target.

First, raw materials are weighed (step S131). As the raw materials, first to nth oxide powders (n is a natural number of 2 or more) are used. For example, an indium oxide powder, a gallium oxide powder, and a zinc oxide powder are used. Note that instead of the indium oxide powder, the gallium oxide powder, and/or the zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, or a tungsten oxide powder may be used. For example, the molar ratio of the indium oxide powder to the gallium oxide powder and the zinc oxide powder is set to "2:2:1", "8:4:3", "3:1:1", "1:1:1", "4:2:3", "1:1:2", "3:1:4", "4:2:4.1", "5:5:6", "1:3:2", "1:3:4", or "3:1:2". With such a molar ratio, a sputtering target which includes a polycrystalline oxide with high crystallinity can be obtained easily later.

Note that, raw materials used in this embodiment are not limited to the above raw materials. For example, an indium oxide powder, a gallium oxide powder, a zinc oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, a tungsten oxide powder, an indium oxide powder and a zinc oxide powder, an indium oxide powder and a gallium oxide powder, a gallium oxide powder and a zinc oxide powder, an aluminum oxide powder and a zinc oxide powder, a zinc oxide powder and a tin oxide powder, or an indium oxide powder and a tin oxide powder may be used as the raw materials.

Next, the weighed raw materials are mixed (step S132).

Next, the mixed raw materials are baked (first baking) (step S133). Note that the first baking may be performed in the conditions shown in FIG. 1(B), FIG. 2(A), or FIG. 2(B).

By performing the first baking, an oxide which is a reactive product of the mixed raw materials is obtained. Here, an In—Ga—Zn oxide is obtained. Note that the first baking may be performed plural times with different conditions.

Next, an In—Ga—Zn oxide powder with crystallinity is obtained by grinding the In—Ga—Zn oxide (step S134). A mill machine such as a ball mill may be used for grinding the In—Ga—Zn oxide. For a ball of the ball mill, a substance with a high degree of hardness such as agate, aluminum oxide, zirconium oxide, tungsten carbide, or silicon carbide may be used. There is no particular limitation on a container used for the ball mill. A material that is the same as the ball is preferably used. Note that grinding in the ball mill is preferably performed for longer than or equal to 8 hours and shorter than or equal to 72 hours, preferably longer than or equal to 20 hours and shorter than or equal to 72 hours.

Note that after the step S134, the process returns to the step S133, and the In—Ga—Zn oxide powder may be subjected to the first baking. In that case, after the first baking, the In—Ga—Zn oxide is ground again in the step S134. When the step S133 and the step S134 are repeated plural times, the crystallinity of the In—Ga—Zn oxide powder can be further increased.

Next, the particle size of the obtained In—Ga—Zn oxide powder is made uniform (step S135). Here, treatment is performed so that a particle size of the In—Ga—Zn oxide powder is less than or equal to 1 μm, preferably less than or equal to 0.5 μm, further preferably less than or equal to 0.3

μm. For this treatment, a sieve or a filter through which a particle of less than or equal to 1 μm, preferably less than or equal to 0.5 μm, further preferably less than or equal to 0.3 μm passes may be used. Then, an In—Ga—Zn oxide powder having a particle size less than 0.01 μm, which tends to have low crystallinity, is preferably removed. For the removal, a sieve or a filter through which a particle of less than 0.01 μm passes may be used. In the above manner, an In—Ga—Zn oxide powder whose particle size is greater than or equal to 0.01 μm and less than or equal to 1 μm, greater than or equal to 0.01 μm and less than or equal to 0.5 μm, or greater than or equal to 0.01 μm and less than or equal to 0.3 μm can be obtained.

Next, the In—Ga—Zn oxide, water, and organic substances (a dispersant and a binder) are mixed to give slurry (step S136).

Next, the slurry is poured into a mold (step S137). One or more suction ports are provided at a bottom of the mold, which enables suction of water and the like. In addition, a filter is provided at the bottom of the mold. The filter has a function of inhibiting the raw material powders to pass and allowing water and the organic substance to pass. Specifically, a filter in which a porous resin film is attached over a woven fabric or a felt may be used.

Next, water and the like of the slurry are sucked through the filter provided at the bottom of the mold to remove water and organic substances from the slurry, so that a molded body is formed (step S138). The use of the slurry raw materials makes it possible to form the molded body where the raw materials are mixed homogeneously.

Note that in the obtained molded body, water and the organic substances are slightly left; thus, drying treatment and a removal of the organic substances are performed (step S139). The drying treatment is preferably natural drying because the molded body is less likely to be cracked. Furthermore, heat treatment is performed at a temperature higher than or equal to 300° C. and lower than or equal to 700° C., so that water and organic substance which cannot be eliminated by natural drying can be removed.

Next, the molded body is baked (second baking) to form a sintered body (step S140). Note that the second baking may be performed in the conditions shown in FIG. 1(B), FIG. 2(A), or FIG. 2(B).

The formed sintered body is subjected to finishing treatment, so that a sputtering target is manufactured. Specifically, division or grinding is performed so that the length, the width, and the thickness of the sintered body are adjusted. Furthermore, since abnormal discharge might occur when a surface has minute unevenness, polishing treatment is performed on the surface. The polishing treatment is preferably performed by CMP.

Through the above steps, a sputtering target with a low concentration of impurities such as hydrogen can be manufactured. Furthermore, a sputtering target with a small amount of oxygen vacancies can be manufactured. Since the crystallinity of the oxide powder included in the molded body is high, a sputtering target with higher crystallinity can be manufactured. In addition, since mixing of the raw materials can be performed homogeneously when the molded body is formed, a sputtering target with a higher relative density can be manufactured.

With the use of the manufactured sputtering target, a film with a low impurity concentration can be formed. Alternatively, a film with a low hydrogen concentration can be formed. Alternatively, a film with a small amount of defects can be formed. Alternatively, a film with a low carrier density can be formed. Alternatively, a film with high crystallinity can be formed. Note that a film which is formed using the manufactured sputtering target is a film according to one embodiment of the present invention. In addition, a device including a film formed using the manufactured sputtering target is a device according to one embodiment of the present invention.

<Composition>

The composition of an In-M-Zn oxide which can be used as a sputtering target is described below. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum tungsten, and the like.

Figure 12:
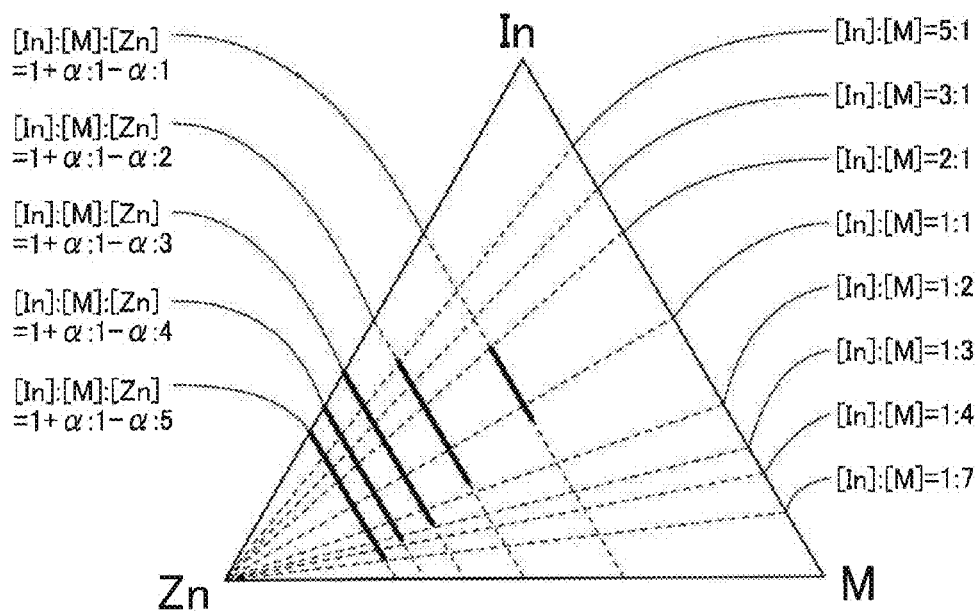
FIG. 12 A ternary diagram illustrating composition of an In-M-Zn oxide.

FIG. 12 is a triangular diagram in which In, M, or Zn is arranged at each vertex. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by the dashed lines denoted as [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5. Note that the bold line on the dashed line represents, for example, the composition that allows an oxide as a raw material mixed and subjected to baking at 1350° C. to be a solid solution.

Thus, when it is close to the above composition that allows it to be a solid solution, the crystallinity can be increased. When an In-M-Zn oxide is deposited by a sputtering method, the composition of a target might be different from the composition of a film. For example, using an In-M-Zn oxide in which an atomic ratio is "1:1:1", "1:1:1.2", "3:1:2", "4:2:4.1", "1:3:2", "1:3:4", or "1:4:5" as a target results in a film having an atomic ratio of "1:1:0.7" (approximately 0.5 to 0.9). "1:1:0.9" (approximately 0.8 to 1.1), "3:1:1.5" (approximately 1 to 1.8), "4:2:3" (approximately 2.6 to 3.6), "1:3:1.5" (approximately 1 to 1.8), "1:3:3" (approximately 2.5 to 3.5), or "1:4:4" (approximately 3.4 to 4.4). Thus, in order to obtain a film with a desired composition, a composition of a target may be selected in consideration of a change in the composition.

<Sputtering Apparatus>

A sputtering apparatus in which a sputtering target according to one embodiment of the present invention can be placed is described below. The following sputtering apparatuses are shown in the state where a substrate, a target, and the like are included, for easy understanding or the explanation of the operation during deposition. Note that the substrate, the target, and the like are provided in a general sputtering apparatus by a user; thus, the sputtering apparatus according to one embodiment of the present invention does not necessarily include the substrate and the target.

Figure 13A:
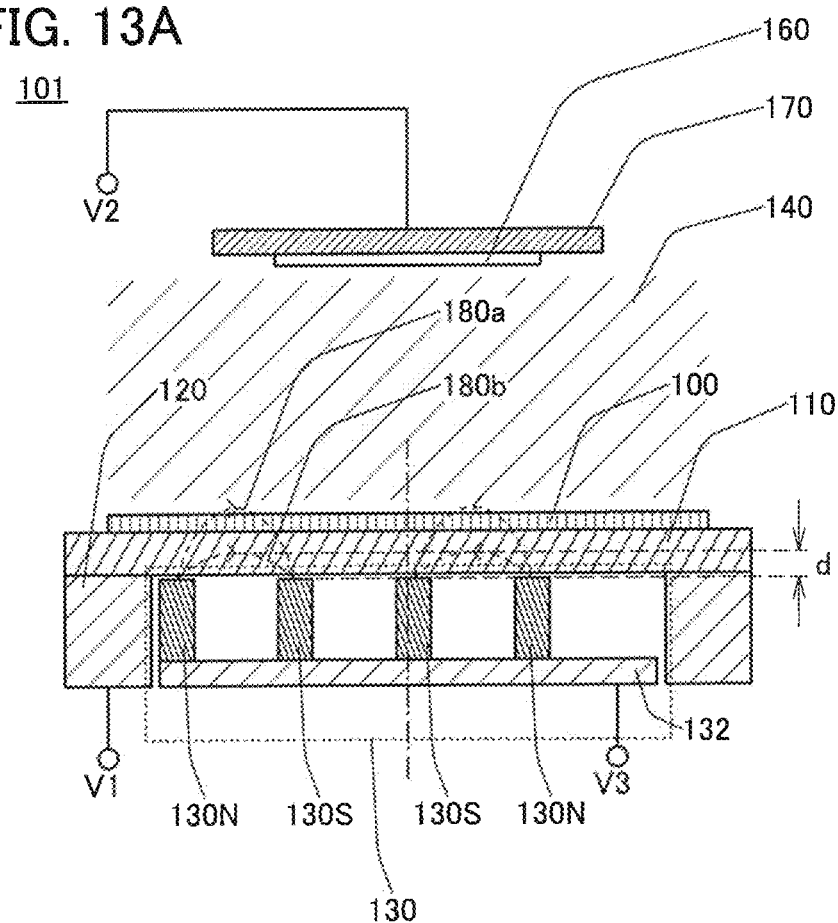
FIG. 13 Diagrams illustrating a sputtering apparatus.

FIG. 13(A) is a cross-sectional view of a deposition chamber 101 that is a parallel-plate-type sputtering apparatus. The deposition chamber 101 illustrated in FIG. 13(A) includes a target holder 120, a backing plate 110, a target 100, a magnet unit 130, and a substrate holder 170. Note that the target 100 is placed over the backing plate 110. The backing plate 110 is placed over the target holder 120. The magnet unit 130 is placed under the target 100 with the backing plate 110 positioned therebetween. The substrate holder 170 is placed to face the target 100. Note that in this specification, a magnet unit means a combination of a plurality of magnets. The magnet unit can also be called a cathode, a cathode magnet, a magnetic member, a magnetic part, or the like. The magnet unit 130 includes a magnet 130N, a magnet 130S, and a magnet holder 132. Note that in the magnet unit 130, the magnet 130N and the magnet 130S are placed over the magnet holder 132. The magnet 130N is spaced from the magnet 130S. When a substrate 160 is carried into the deposition chamber 101, the substrate 160 is placed on the substrate holder 170. Note that a deposition method using a parallel-plate sputtering apparatus can also be referred to as PESP (parallel electrode SP).

The target holder 120 and the backing plate 110 are fixed to each other with a bolt and have the same potential. The target holder 120 has a function of supporting the target 100 with the backing plate 110 positioned therebetween.

The target 100 is fixed to the backing plate 110. The target 100 and the backing plate 110 can be fixed using a bonding agent containing a low-melting-point metal such as indium, for example.

FIG. 13(A) illustrates a magnetic force line 180a and a magnetic force line 180b formed by the magnet unit 130.

The magnetic force line 180a is one of magnetic force lines that form a horizontal magnetic field in the vicinity of a top surface of the target 100. The vicinity of the top surface of the target 100 is a region in which the perpendicular distance from the target 100 is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field to a vertical distance d from the top surface of the magnet unit 130. The vertical distance d is, for example, greater than or equal to 0 mm and less than or equal to 20 mm or greater than or equal to 5 mm and less than or equal to 15 mm.

Here, with the use of the strong magnet 130N and the strong magnet 130S, an intense magnetic field can be generated even in the vicinity of the top surface of the substrate 160. Specifically, the magnetic flux density of the horizontal magnetic field on the top surface of the substrate 160 can be greater than or equal to 10 G and less than or equal to 100 G, preferably greater than or equal to 15 G and less than or equal to 60 G, further preferably greater than or equal to 20 G and less than or equal to 40 G.

Note that the magnetic flux density of the horizontal magnetic field may be measured when the magnetic flux density of the vertical magnetic field is 0 G.

By setting the magnetic flux density in the deposition chamber 101 to be in the above range, an oxide with high density and high crystallinity can be deposited. The obtained oxide is an oxide that hardly includes plural kinds of crystal phases and has a substantially-single crystalline phase.

Figure 13B:
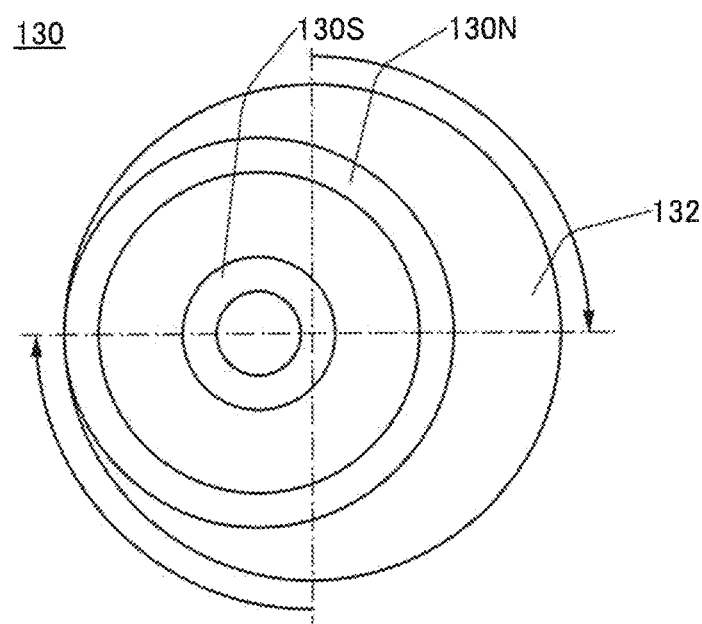

FIG. 13(B) is a top view of the magnet unit 130. In the magnet unit 130, the circular or substantially circular magnet 130N and the circular or substantially circular magnet 130S are fixed to the magnet holder 132. The magnet unit 130 can be rotated about a normal vector at the center or substantially at the center of the top surface of the magnet unit 130. For example, the magnet unit 130 may be rotated with a beat (also referred to as rhythm, pulse, frequency, period, cycle, or the like) of greater than or equal to 0.1 Hz and less than or equal to 1 kHz.

Thus, a region where a magnetic field on the target 100 is intense changes as the magnet unit 130 is rotated. The region with an intense magnetic field is a high-density plasma region; thus, a sputtering phenomenon of the target 100 easily occurs in the vicinity thereof. For example, when the region with an intense magnetic field is a specific region, only a specific region of the target 100 is used. In contrast, when the magnet unit 130 is rotated as illustrated in FIG. 13(B), the target 100 can be uniformly used. In addition, when the magnet unit 130 is rotated, a film with a uniform thickness and uniform quality can be deposited.

By rotating the magnet unit 130, the direction of the magnetic force line on the top surface of the substrate 160 can also be changed.

Although the magnet unit 130 is rotated in this example, one embodiment of the present invention is not limited to this. For example, the magnet unit 130 may be oscillated up and down and/or right and left. For example, the magnet unit 130 may be moved with a beat of greater than or equal to 0.1 Hz and less than or equal to 1 kHz. Alternatively, the target 100 may be rotated or moved. For example, the target 100 may be rotated or moved with a beat of greater than or equal to 0.1 Hz and less than or equal to 1 kHz. Further alternatively, the direction of a magnetic force line on the top surface of the substrate 160 may be changed relatively by rotating the substrate 160. Further alternatively, these may be combined.

The deposition chamber 101 may have a water channel inside or under the backing plate 110. By making fluid (air, nitrogen, a rare gas, water, oil, or the like) flow through the water channel, discharge anomaly due to an increase in the temperature of the target 100 or damage to the deposition chamber 101 due to deformation of a member can be prevented in the sputtering. In that case, the backing plate 110 and the target 100 are preferably adhered to each other with a bonding agent because the cooling capability is increased.

A gasket is preferably provided between the target holder 120 and the backing plate 110, in which case an impurity is less likely to enter the deposition chamber 101 from the outside, the water channel, or the like.

In the magnet unit 130, the magnet 130N and the magnet 130S are placed so that different polarities face the target 100 side. Here, the case where the magnet 130N is placed so that the north pole is on the target 100 side and the magnet 130S is placed so that the south pole is on the target 100 side is described. Note that the layout of the magnets and the poles in the magnet unit 130 are not limited to this layout. In addition, it is not limited to the layout in FIG. 13(A).

In the deposition, a potential V1 applied to a terminal V1 connected to the target holder 120 is, for example, a potential lower than a potential V2 applied to a terminal V2 connected to the substrate holder 170. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminal V1, the terminal V2, and the terminal V3 are not limited to the above potentials. Not all the target holder 120, the substrate holder 170, and the magnet holder 132 are necessarily supplied with potentials. For example, the substrate holder 170 may be electrically floating. Note that although an example of what is called DC sputtering, in which the potential V1 is applied to the terminal V1 connected to the target holder 120, is illustrated in FIG. 13(A), one embodiment of the present invention is not limited thereto. For example, it is possible to employ what is called an RF sputtering method, in which a high-frequency power supply with a frequency of 13.56 MHz or 27.12 MHz, for example, is connected to the target holder 120.

Although an example where the backing plate 110 and the target holder 120 are not electrically connected to the magnet unit 130 and the magnet holder 132 is illustrated in FIG. 13(A), it is not limited thereto. For example, the backing plate 110 and the target holder 120, and the magnet unit 130 and the magnet holder 132 may be electrically connected to each other and may have the same potential.

To increase the crystallinity of the oxide to be obtained, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., further preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole is less than 50 vol %, preferably less than or equal to 33 vol %, further preferably less than or equal to 20 vol %, still further preferably less than or equal to 15 vol %.

The vertical distance between the target 100 and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. The short vertical distance between the target 100 and the substrate 160 within the above-described range can suppress a decrease in the energy of the sputtered particles until the sputtered particles reach the substrate 160, in some cases. The long vertical distance between the target 100 and the substrate 160 within the above-described range allows the incident direction of the sputtered particles to be approximately vertical to the substrate 160, so that damage to the substrate 160 caused by collision of the sputtered particles can be reduced in some cases.

Figure 14A:
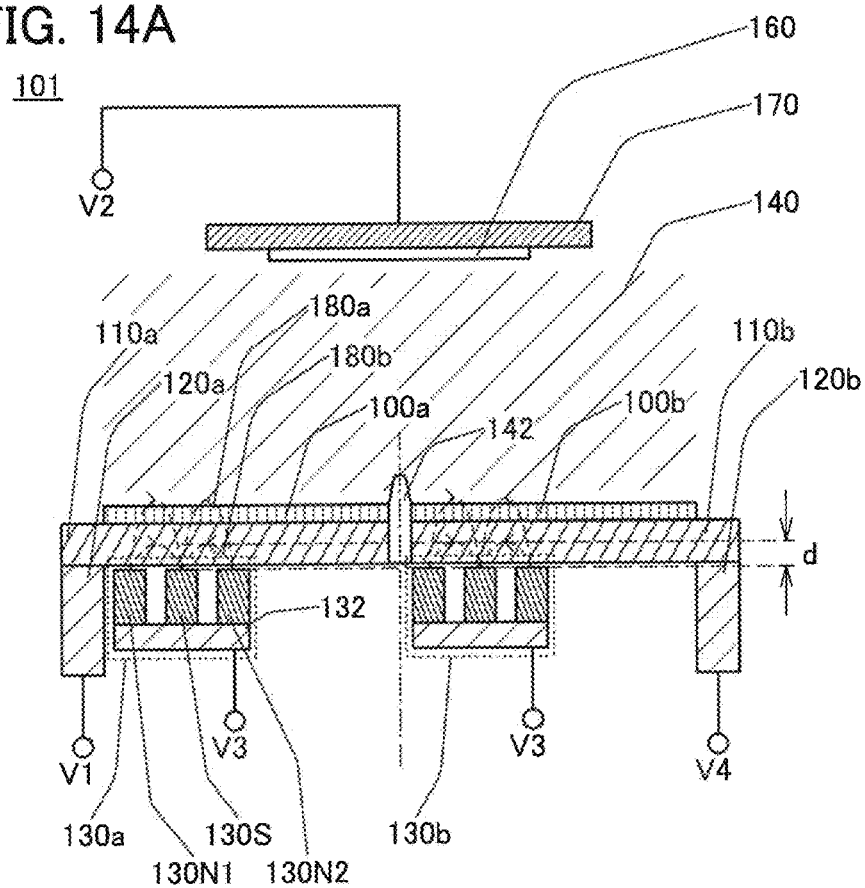
FIG. 14 Diagrams illustrating a sputtering apparatus.

FIG. 14(A) illustrates an example of a deposition chamber different from that in FIG. 13(A).

The deposition chamber 101 in FIG. 14(A) includes a target holder 120a, a target holder 120b, a backing plate 110a, a backing plate 110b, a target 100a, a target 100b, a magnet unit 130a, a magnet unit 130b, a member 142, and the substrate holder 170. Note that the target 100a is placed over the backing plate 110a. The backing plate 110a is placed over the target holder 120a. The magnet unit 130a is placed under the target 100a with the backing plate 110a positioned therebetween. The target 100b is placed over the backing plate 110b. The backing plate 110b is placed over the target holder 120b. The magnet unit 130b is placed under the target 100b with the backing plate 110b positioned therebetween.

The magnet unit 130a includes a magnet 130N1, a magnet 130N2, the magnet 130S, and the magnet holder 132. Note that in the magnet unit 130a, the magnet 130N 1, the magnet 130N2, and the magnet 130S are placed over the magnet holder 132. The magnet 130N1 and the magnet 130N2 are spaced from the magnet 130S. Note that the magnet unit 130b has a structure similar to that of the magnet unit 130a. When the substrate 160 is carried into the deposition chamber 101, the substrate 160 is placed on the substrate holder 170.

The target 100a, the backing plate 110a, and the target holder 120a are separated from the target 100b, the backing plate 110b, and the target holder 120b by the member 142. Note that the member 142 is preferably an insulator. The member 142 may be a conductor or a semiconductor. The member 142 may be a conductor or a semiconductor whose surface is covered with an insulator.

The target holder 120a and the backing plate 110a are fixed to each other with a bolt and have the same potential. The target holder 120a has a function of supporting the target 100a with the backing plate 110a positioned therebetween. The target holder 120b and the backing plate 110b are fixed to each other with a bolt and have the same potential. The target holder 120b has a function of supporting the target 100b with the backing plate 110b positioned therebetween.

The backing plate 110a has a function of fixing the target 100a. The backing plate 110b has a function of fixing the target 100b.

FIG. 14(A) illustrates the magnetic force line 180a and the magnetic force line 180b formed by the magnet unit 130a.

The magnetic force line 180a is one of magnetic force lines that form a horizontal magnetic field in the vicinity of a top surface of the target 100a. The vicinity of the top surface of the target 100a is a region in which the vertical distance from the target 100a is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field to the vertical distance d from the top surface of the magnet unit 130a. The vertical distance d is, for example, greater than or equal to 0 mm and less than or equal to 20 mm or greater than or equal to 5 mm and less than or equal to 15 mm.

Here, with the use of the strong magnet 130N1, the strong magnet 130N2, and the strong magnet 130S, an intense magnetic field can be generated in the vicinity of the top surface of the substrate 160. Specifically, the magnetic flux density of the horizontal magnetic field on the top surface of the substrate 160 can be greater than or equal to 10 G and less than or equal to 100 G, preferably greater than or equal to 15 G and less than or equal to 60 G, further preferably greater than or equal to 20 G and less than or equal to 40 G.

By setting the magnetic flux density of the magnetic field in the deposition chamber 101 to be in the above range, an oxide with high density and high crystallinity can be deposited. The obtained oxide is an oxide that hardly includes plural kinds of crystal phases and has a substantially-single crystalline phase.

Note that the magnet unit 130b forms a magnetic force line similar to that formed by the magnet unit 130a.

Figure 14B:
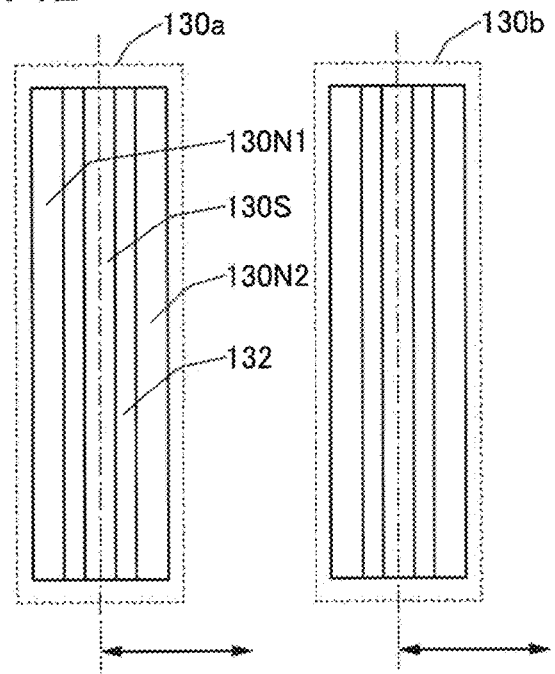

FIG. 14(B) is a top view of the magnet unit 130a and the magnet unit 130b. In the magnet unit 130a, the rectangular or substantially rectangular magnet 130N 1, the rectangular or substantially rectangular magnet 130N2, and the rectangular or substantially rectangular magnet 130S are fixed to the magnet holder 132. The magnet unit 130a can be oscillated right and left as illustrated in FIG. 14(B). For example, the magnet unit 130a may be oscillated with a beat of greater than or equal to 0.1 Hz and less than or equal to 1 kHz.

Thus, a region where a magnetic field on the target 100a is intense changes as the magnet unit 130a is oscillated. The region with an intense magnetic field is a high-density plasma region; thus, a sputtering phenomenon of the target 100a easily occurs in the vicinity of the region. For example, when the region with an intense magnetic field is a specific region, only a specific region of the target 100a is used. In contrast, when the magnet unit 130a is oscillated as illustrated in FIG. 14(B), the target 100a can be uniformly used. By oscillating the magnet unit 130a, a film with a uniform thickness and uniform quality can be deposited.

By oscillating the magnet unit 130a, the state of the magnetic force line on the top surface of the substrate 160 can also be changed. The same applies to the magnet unit 130b.

Although an example in which the magnet unit 130a and the magnet unit 130b are oscillated is described in this example, one embodiment of the present invention is not limited to this. For example, the magnet unit 130a and the magnet unit 130b may be rotated. For example, the magnet unit 130a and the magnet unit 130b may be rotated with a cycle of greater than or equal to 0.1 Hz and less than or equal to 1 kHz. Alternatively, the target 100 may be rotated or moved. For example, the target 100 may be rotated or moved with a cycle of greater than or equal to 0.1 Hz and less than or equal to 1 kHz. Further alternatively, the state of a magnetic force line on the top surface of the substrate 160 may be changed relatively by rotating the substrate 160. Further alternatively, these may be combined.

The deposition chamber 101 may have a water channel inside or under the backing plate 110a and the backing plate 110b. By making fluid (air, nitrogen, a rare gas, water, oil, or the like) flow through the water channel, discharge anomaly due to an increase in the temperature of the target 100a and the target 100b or damage to the deposition chamber 101 due to deformation of a member can be prevented in the sputtering. In that case, the backing plate 110a and the target 100a are preferably adhered to each other with a bonding agent because the cooling capability is increased. Furthermore, the backing plate 110b and the target 100b are preferably adhered to each other with a bonding agent because the cooling capability is increased.

A gasket is preferably provided between the target holder 120a and the backing plate 110a, in which case an impurity is less likely to enter the deposition chamber 101 from the outside, the water channel, or the like. A gasket is preferably provided between the target holder 120b and the backing plate 110b, in which case an impurity is less likely to enter the deposition chamber 101 from the outside, the water channel, or the like.

In the magnet unit 130a, the magnets 130N1 and 130N2 and the magnet 130S are placed such that their surfaces on the target 100a side have opposite polarities. Here, the case where the pole of each of the magnet 130N1 and the magnet 130N2 on the target 100a side is the north pole and the pole of the magnet 130S on the target 100a side is the south pole is described. Note that the layout of the magnets and the poles in the magnet unit 130a are not limited to this layout. In addition, it is not limited to the layout in FIG. 14(A). The same applies to a magnet unit 103b.

In the deposition, a potential whose level is switched between high and low may be alternately applied between the terminal V1 connected to the target holder 120a and the terminal V4 connected to the target holder 120b. The potential V2 applied to the terminal V2 connected to the substrate holder 170 is, for example, the ground potential. A potential V3 applied to a terminal V3 connected to the magnet holder 132 is, for example, the ground potential. Note that the potentials applied to the terminal V1, the terminal V2, the terminal V3, and the terminal V4 are not limited to the above potentials. Not all the target holder 120a, the target holder 120b, the substrate holder 170, and the magnet holder 132 are necessarily supplied with potentials. For example, the substrate holder 170 may be electrically floating. Note that although an example of what is called AC sputtering, in which the potential whose level is switched between high and low is alternately applied between the terminal V1 connected to the target holder 120a and the terminal V4 connected to the target holder 120b, is illustrated in FIG. 14(A), one embodiment of the present invention is not limited thereto.

In addition, although an example in which the backing plate 110a and the target holder 120a are not electrically connected to the magnet unit 130a and the magnet holder 132 is illustrated in FIG. 14(A), it is not limited thereto. For example, the backing plate 110a and the target holder 120a, and the magnet unit 130a and the magnet holder 132 may be electrically connected to each other and may have the same potential. In addition, although an example in which the backing plate 110b and the target holder 120b are not electrically connected to the magnet unit 130b and the magnet holder 132 is illustrated, it is not limited thereto. For example, the backing plate 110b and the target holder 120b, and the magnet unit 130b and the magnet holder 132 may be electrically connected to each other and may have the same potential.

To increase the crystallinity of the oxide to be obtained, the temperature of the substrate 160 may be set high. By setting the temperature of the substrate 160 high, migration of sputtered particles at the top surface of the substrate 160 can be promoted. Thus, an oxide with higher density and higher crystallinity can be deposited. Note that the temperature of the substrate 160 is, for example, higher than or equal to 100° C. and lower than or equal to 450° C., preferably higher than or equal to 150° C. and lower than or equal to 400° C., further preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used. For example, the proportion of oxygen in the whole is less than 50 vol %, preferably less than or equal to 33 vol %, further preferably less than or equal to 20 vol %, still further preferably less than or equal to 15 vol %.

The vertical distance between the target 100a and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. The short vertical distance between the target 100a and the substrate 160 within the above-described range can suppress a decrease in the energy of the sputtered particles until the sputtered particles reach the substrate 160, in some cases. The long vertical distance between the target 100a and the substrate 160 within the above-described range allows the incident direction of the sputtered particles to be approximately vertical to the substrate 160, so that damage to the substrate 160 caused by collision of the sputtered particles can be reduced in some cases.

The vertical distance between the target 100b and the substrate 160 is greater than or equal to 10 mm and less than or equal to 600 mm, preferably greater than or equal to 20 mm and less than or equal to 400 mm, further preferably greater than or equal to 30 mm and less than or equal to 200 mm, still further preferably greater than or equal to 40 mm and less than or equal to 100 mm. The short vertical distance between the target 100b and the substrate 160 within the above-described range can suppress a decrease in the energy of the sputtered particles until the sputtered particles reach the substrate 160, in some cases. The long vertical distance between the target 100b and the substrate 160 within the above-described range allows the incident direction of the sputtered particles to be approximately vertical to the substrate 160, so that damage to the substrate 160 caused by collision of the sputtered particles can be reduced in some cases.

Figure 15A:
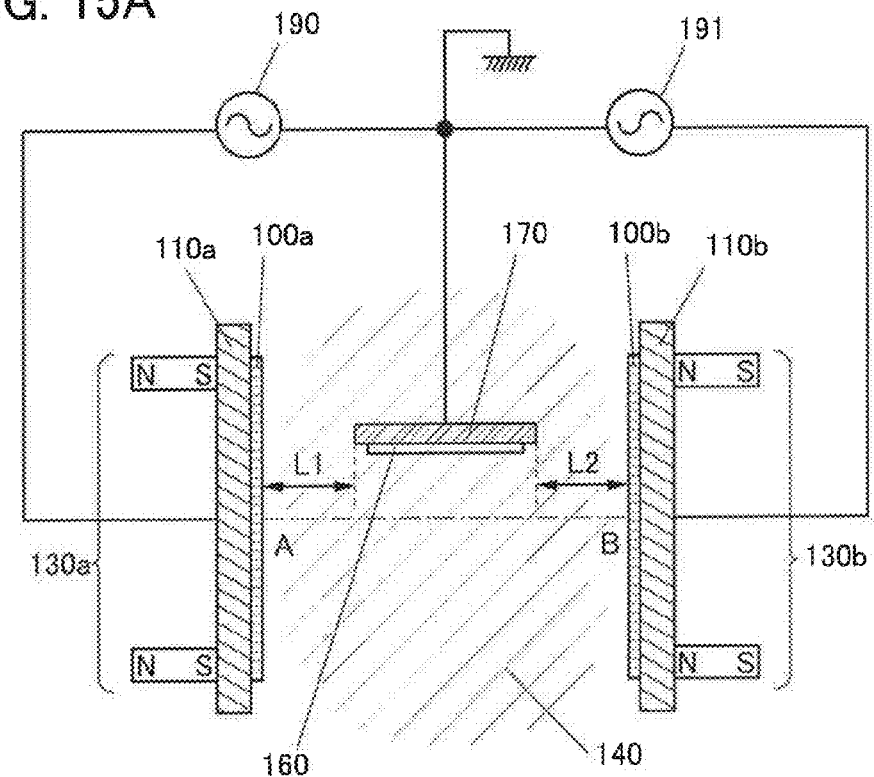
FIG. 15 Diagrams illustrating a sputtering apparatus.

FIG. 15(A) illustrates an example of a cross-sectional view of a deposition chamber different from those in FIG. 13(A) and FIG. 14(A).

FIG. 15(A) illustrates a facing-targets sputtering apparatus. A deposition method using the facing-target-type sputtering apparatus can also be referred to as VDSP (vapor deposition SP).

FIG. 15(A) is a schematic cross-sectional view of a deposition chamber of the sputtering apparatus. The deposition chamber illustrated in FIG. 15(A) includes the target 100a and the target 100b; the backing plate 110a and the backing plate 110b which respectively hold the target 100a and the target 100b; and the magnet unit 130a and the magnet unit 130b which are respectively placed on back sides of the target 100a and the target 100b with the backing plate 110a and the backing plate 110b positioned therebetween. The substrate holder 170 is placed between the target 100a and the target 100b. When the substrate 160 is put into the deposition chamber, the substrate 160 is fixed with the substrate holder 170.

As illustrated in FIG. 15(A), a power source 190 and a power source 191 for applying potentials are connected to the backing plate 110a and the backing plate 110b. It is preferable to use what is called an AC power source, which alternately applies a potential whose level is switched between high and low, between the power source 190 connected to the backing plate 110a and the power source 191 connected to the backing plate 110b. Although an example in which AC power sources are used as the power source 190 and the power source 191 illustrated in FIG. 15 is shown, it is not limited thereto. For example, RF power sources, DC power sources, or the like can be used as the power source 190 and the power source 191. Alternatively, different kinds of power sources may be used as the power source 190 and the power source 191.

The substrate holder 170 is preferably connected to GND. The substrate holder 170 may be in a floating state.

Figure 15B:
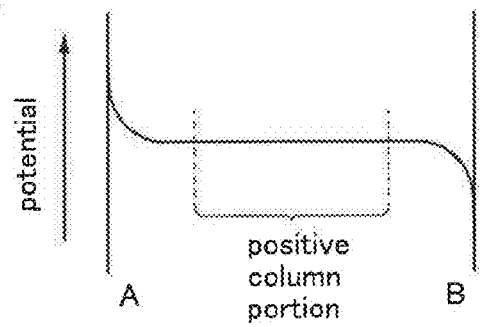
Figure 15C:
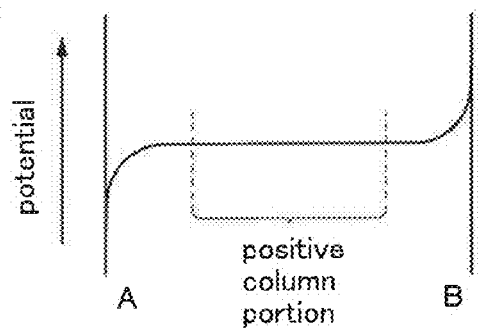

FIG. 15(B) and FIG. 15(C) show potential distribution of plasma 140 along dashed-dotted line A-B in FIG. 15(A). The potential distribution in FIG. 15(B) shows the state where a high potential is applied to the backing plate 110a and a low potential is applied to the backing plate 110b. That is, a cation is accelerated toward the target 100b. The potential distribution in FIG. 15(C) shows the state where a low potential is applied to the backing plate 110a and a high potential is applied to the backing plate 110b. That is, a cation is accelerated toward the target 100b. Deposition can be performed in such a manner that the states in FIG. 15(B) and FIG. 15(C) are alternated.

The deposition is preferably performed while the plasma 140 sufficiently reaches the surface of the substrate 160. For example, the substrate holder 170 and the substrate 160 are preferably placed in the plasma 140 as illustrated in FIG. 15(A). It is particularly preferable that the substrate holder 170 and the substrate 160 be placed so as to be in a positive column of the plasma 140. The region of the positive column in the plasma 140 is, in the potential distribution illustrated in FIG. 15(B) and FIG. 15(C), a region where the gradient of the potential distribution is small. In other words, when the substrate 160 is placed in the region of the positive column of the plasma 140 as illustrated in FIG. 15(A), the substrate 160 is not exposed to a high electric field portion in the plasma 140; thus, the substrate 160 has less damage due to the plasma 140 and has reduced defects.

It is preferable that deposition be performed in the state where the substrate holder 170 and the substrate 160 are placed in the plasma 140 as illustrated in FIG. 15(A) because utilization efficiencies of the target 100a and the target 100b are increased.

As illustrated in FIG. 15(A), the horizontal distance between the substrate holder 170 and the target 100a is referred to as L1 and the horizontal distance between the substrate holder 170 and the target 100b is referred to as L2. The lengths of L1 and L2 are each preferably as long as the length of the substrate 160. In addition, it is preferable that the distances of L1 and L2 be adjusted as appropriate so that the substrate 160 is placed in the region of the positive column of the plasma 140 as described above. L1 and L2 can each be, for example, greater than or equal to 10 mm and less than or equal to 200 mm.

In the structure illustrated FIG. 15(A), the target 100a and the target 100b are placed parallel to each other to face each other. Moreover, the magnet unit 130a and the magnet unit 130b are placed so that different poles face each other. In that case, magnetic force lines are from the magnet unit 130b toward the magnet unit 130a. Thus, the plasma 140 is confined by magnetic fields formed by the magnet unit 130a and the magnet unit 130b during deposition. The substrate holder 170 and the substrate 160 are placed in a region between the target 100a and the target 100b which face each other (also referred to as a region between targets). Note that although the substrate holder 170 and the substrate 160 are placed parallel to the direction in which the target 100a and the target 100b face each other in FIG. 15(A), they may be inclined. By inclination of the substrate holder 170 and the substrate 160 at 30° or more and 60° or less (typified by 45°), for example, the proportion of sputtered particles that perpendicularly reach the substrate 160 during deposition can be increased.

Figure 16:
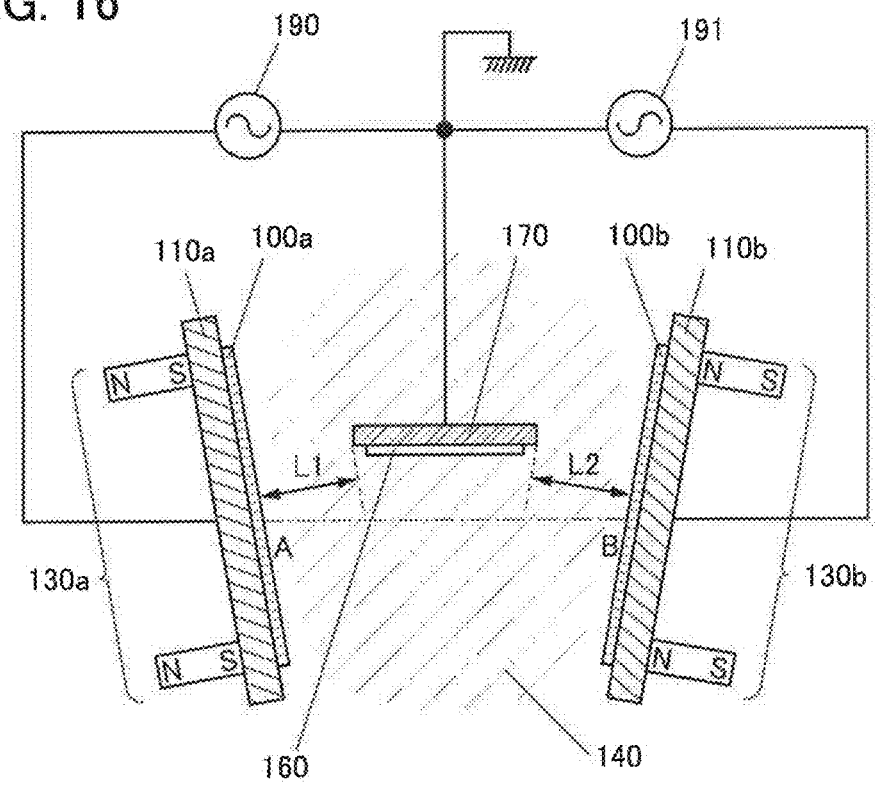
FIG. 16 A diagram illustrating a sputtering apparatus.

A structure illustrated in FIG. 16 is different from the structure illustrated in FIG. 15(A) in that the target 100a and the target 100b are not parallel but inclined to each other (in a V-shape). Thus, the description for FIG. 15(A) is referred to for that except for the positions of the targets. The magnet unit 130a and the magnet unit 130b are placed so that different poles face each other. The substrate holder 170 and the substrate 160 are placed in a region between targets. With the targets 100a and 100b placed as illustrated in FIG. 16, the proportion of sputtered particles that reach the substrate 160 can be increased; accordingly, the deposition rate can be increased.

Figure 17:
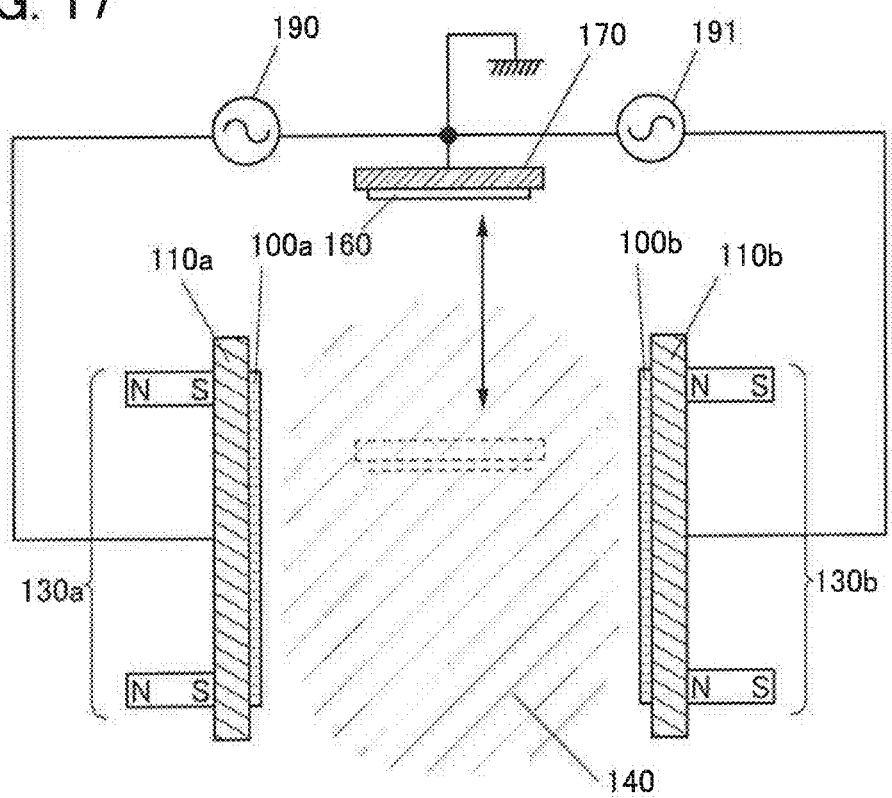
FIG. 17 A diagram illustrating a sputtering apparatus.

Although the state where the substrate holder 170 and the substrate 160 are placed in the plasma 140 is illustrated in FIG. 15(A), it is not limited thereto. The substrate holder 170 and the substrate 160 may be placed outside the plasma 140 as illustrated in FIG. 17, for example. The substrate 160 is not exposed to a high electric field region of the plasma 140, leading to a reduction in damage due to the plasma 140. Note that the utilization efficiencies of the target 100a and the target 100b are decreased as the distance between the plasma 140 and the substrate 160 is increased. It is preferable that the position of the substrate holder 170 be adjustable as illustrated in FIG. 17.

The substrate holder 170 may be placed above the region between targets, or may be placed below the region. Alternatively, it may be placed above and below the region. When the substrate holders 170 are provided above and below the region, deposition on two or more substrates can be performed at once, leading to an increase in productivity. Note that the position above and/or below the region where the target 100a and the target 100b face each other can also be referred to as the side of the region where the target 100a and the target 100b face each other.

The facing-targets sputtering apparatus can stably generate plasma even in high vacuum. Deposition can be performed at higher than or equal to 0.005 Pa and lower than or equal to 0.09 Pa, for example. As a result, the concentration of impurities contained during deposition can be reduced.

Since the use of the facing-target sputtering apparatus makes it possible to deposit a film in high vacuum, a film with high crystallinity can be deposited even in the case where the temperature of the substrate 160 is low. For example, a film with high crystallinity can be deposited even when the temperature of the substrate 160 is higher than or equal to 10° C. and lower than 100° C.

Figure 18A:
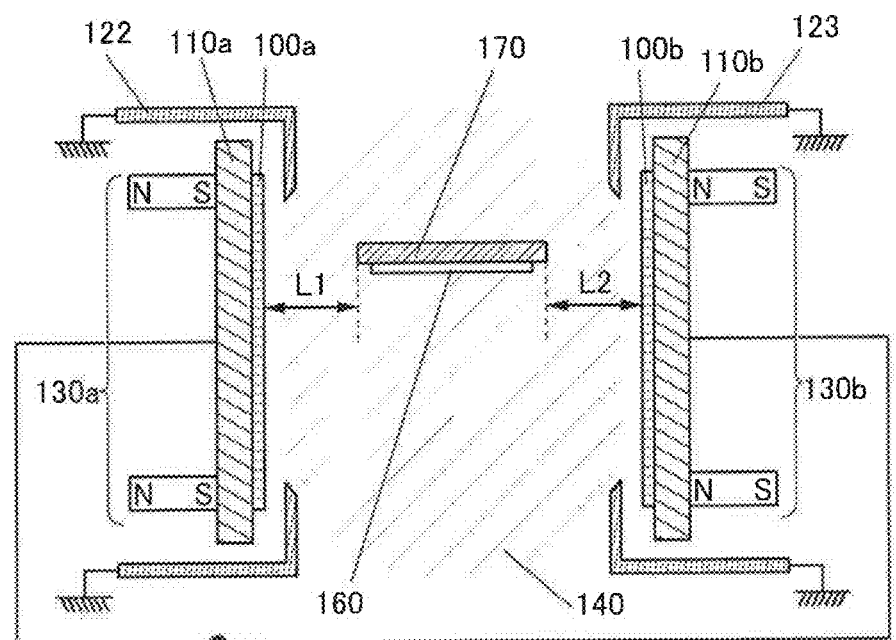
FIG. 18 Diagrams illustrating a sputtering apparatus.

FIG. 18(A) illustrates another example of a facing-targets sputtering apparatus.

FIG. 18(A) is a schematic cross-sectional view of a deposition chamber of a facing-targets sputtering apparatus. Unlike in the deposition chamber illustrated in FIG. 15(A), a target shield 122 and a target shield 123 are provided. The power source 191 connected to the backing plates 110a and 110b is also provided.

A target shield 122a and a target shield 122b are connected to GND as illustrated in FIG. 18(A). That is, the plasma 140 is formed by a potential difference applied between the backing plates 110a and 110b to which the potential of the power source 191 is applied and the target shields 122a and 122b to which GND is applied.

The deposition is preferably performed while the plasma 140 sufficiently reaches the surface of the substrate 160. For example, the substrate holder 170 and the substrate 160 are preferably placed in the plasma 140 as illustrated in FIG. 18(A). It is particularly preferable that the substrate holder 170 and the substrate 160 be placed so as to be in a positive column of the plasma 140. The region of the positive column in the plasma is a region where the gradient of the potential distribution is small. In other words, when the substrate 160 is placed in the region of the positive column of the plasma 140 as illustrated in FIG. 18(A), the substrate is not exposed to a high electric field portion in the plasma 140; thus, damage to the substrate 160 due to the plasma 140 can be reduced and an oxide with a favorable film quality can be obtained.

It is preferable that deposition be performed in the state where the substrate holder 170 and the substrate 160 are placed in the plasma 140 as illustrated in FIG. 18(A) because utilization efficiencies of the target 100a and the target 100b are increased.

As illustrated in FIG. 18(A), the horizontal distance between the substrate holder 170 and the target 100a is referred to as L1 and the horizontal distance between the substrate holder 170 and the target 100b is referred to as L2. The lengths of L1 and L2 are each preferably as long as the size of the substrate 160. In addition, it is preferable that the distances of L1 and L2 be adjusted as appropriate so that the substrate 160 is placed in the region of the positive column of the plasma 140 as described above.

Figure 18B:
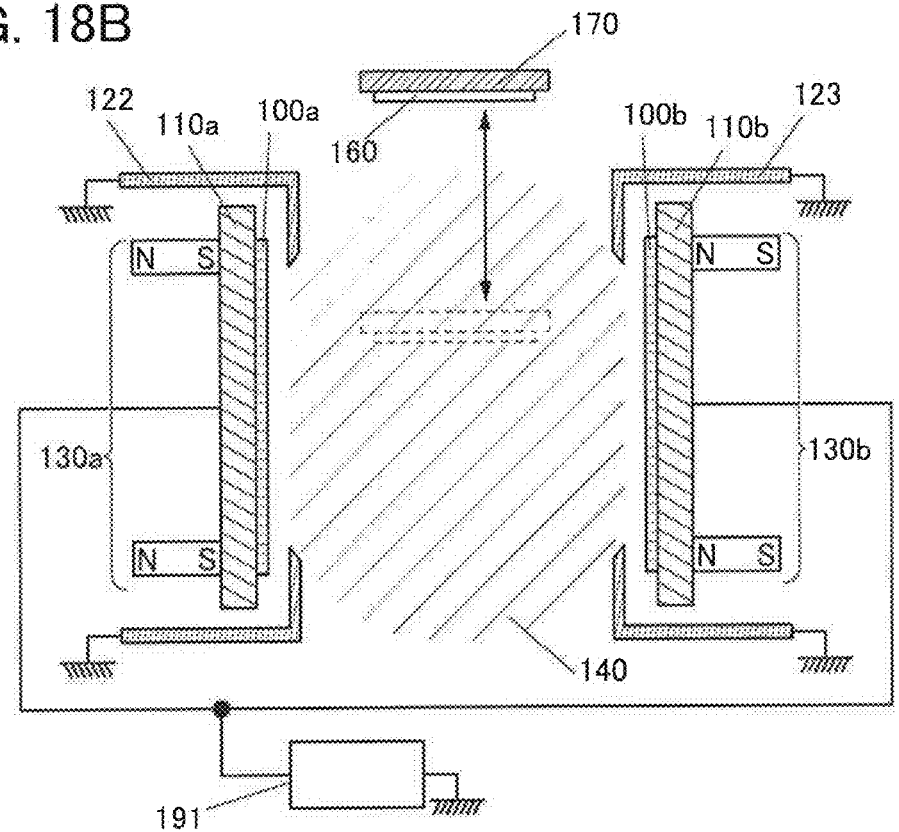

Although the state where the substrate holder 170 and the substrate 160 are placed in the plasma 140 is illustrated in FIG. 18(A), it is not limited thereto. The substrate holder 170 and the substrate 160 may be placed outside the plasma 140 as illustrated in FIG. 18(B), for example. The substrate 160 is not exposed to a high electric field region of the plasma 140, leading to a reduction in damage due to the plasma 140. Note that the utilization efficiencies of the target 100a and the target 100b are decreased as the distance between the plasma 140 and the substrate 160 is increased. It is preferable that the position of the substrate holder 170 be adjustable as illustrated in FIG. 18(B).

Although the substrate holder 170 is placed above a region where the target 100a and the target 100b face each other as illustrated in FIG. 18(B), it may be placed below the region. Alternatively, it may be placed above and below the region. When the substrate holders 170 are provided above and below the region, deposition on two or more substrates can be performed at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in high vacuum enables the concentration of impurities contained in the film to be reduced.

Note that a parallel-plate-type sputtering apparatus or an ion beam sputtering apparatus may be used in the deposition chamber.

<Deposition Apparatus>

A deposition apparatus including a deposition chamber in which a sputtering target according to one embodiment of the present invention can be placed is described below.

First, a structure of a deposition apparatus in which the amount of impurities entering a film during the deposition or the like is small is described with reference to FIG. 19 and FIG. 20.

Figure 19:
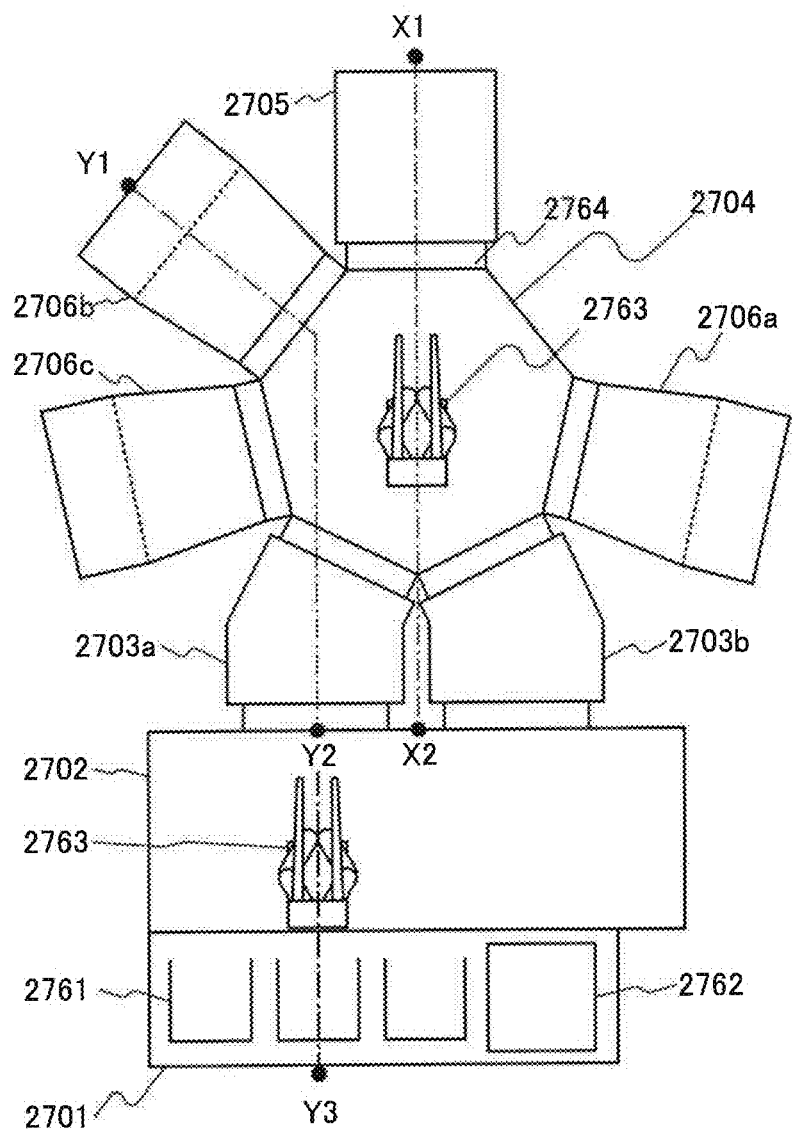
FIG. 19 A top view illustrating an example of a deposition apparatus.

FIG. 19 is a top view schematically illustrating a single wafer multi-chamber deposition apparatus 2700. The deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of which a sputtering target is placed for deposition. Note that for the deposition chambers 2706a, 2706b, and 2706c, the structure of the above-described deposition chamber can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705, the deposition chamber 2706a, the deposition chamber 2706b, and the deposition chamber 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. The atmosphere-side substrate supply chamber 2702 and the transfer chamber 2704 include transfer robots 2763 and can transfer substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, and the like can be freely determined. Note that the numbers of transfer chambers, deposition chambers, load lock chambers, unload lock chambers, and substrate heating chambers are not limited to the numbers described above, and optimal numbers can be set as appropriate depending on the space for installation or the process conditions.

Next, cross-sectional views taken along dashed-dotted line X1-X2, dashed-dotted line Y1-Y2, and dashed-dotted line Y2-Y3 in the deposition apparatus 2700 illustrated in FIG. 19 are illustrated in FIG. 20.

Figure 20A:
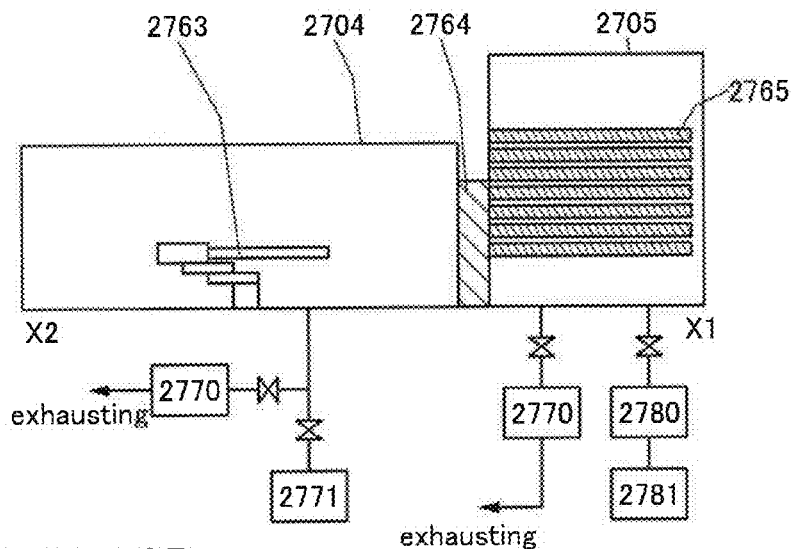
FIG. 20 Diagrams illustrating an example of a structure of a deposition apparatus.

FIG. 20(A) is a cross section of the substrate heating chamber 2705 and the transfer chamber 2704, and the substrate heating chamber 2705 includes a plurality of heating stages 2765 which can hold a substrate. Note that the substrate heating chamber 2705 is connected to a vacuum pump 2770 through a valve. As the vacuum pump 2770, a dry pump and a mechanical booster pump can be used, for example.

As a heating mechanism that can be used for the substrate heating chamber 2705, a heating mechanism which performs heating with a resistance heater may be used, for example. Alternatively, for example, a heating mechanism which performs heating by utilizing heat conduction or heat radiation from a medium such as a heated gas or the like may be used. For example, an RTA (Rapid Thermal Annealing) such as a GRTA (Gas Rapid Thermal Annealing) or an LRTA (Lamp Rapid Thermal Annealing) can be employed. In the LRTA, an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

The substrate heating chamber 2705 is connected to a refiner 2781 through a mass flow controller 2780. Note that although the mass flow controller 2780 and the refiner 2781 are provided for each of a plurality of kinds of gases, only one is illustrated for easy understanding. As the gas introduced to the substrate heating chamber 2705, a gas whose dew point is −80° C. or lower, preferably −100° C. or lower can be used; for example, an oxygen gas, a nitrogen gas, and a rare gas (an argon gas or the like) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, the transfer chamber 2704 is exhausted from the atmospheric pressure to low or medium vacuum (approximately 0.1 Pa to several hundred pascals) with the use of the vacuum pump 2770, and then, after the valves are switched, it is exhausted from the medium vacuum to high or ultra-high vacuum (0.1 Pa to $1 \times 10^{-7}$ Pa) with the use of the cryopump 2771.

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

Figure 20B:
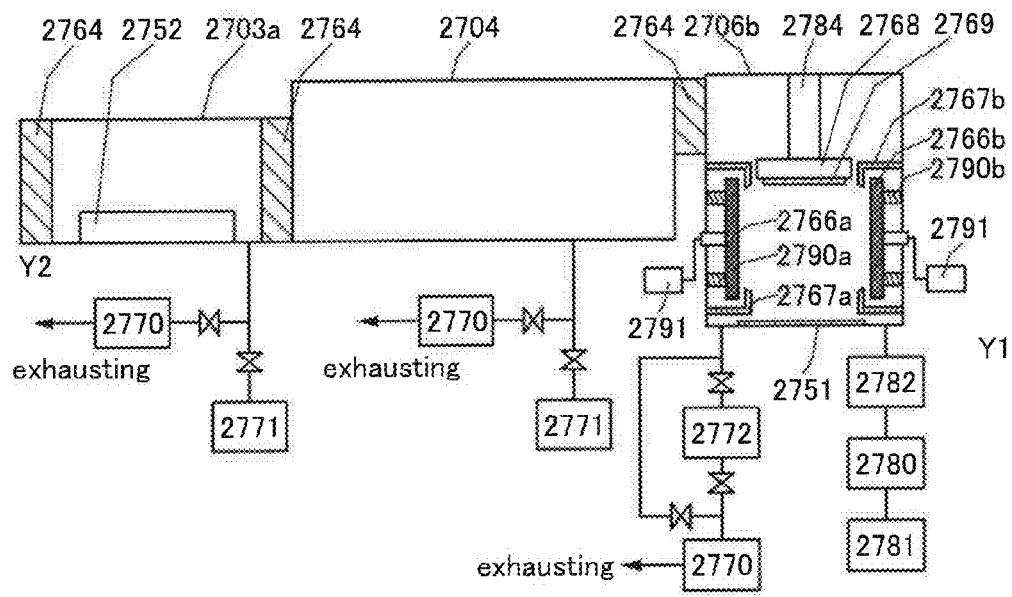

FIG. 20(B) is a cross section of the deposition chamber 2706b, the transfer chamber 2704, and the load lock chamber 2703a.

Here, the details of the deposition chamber (sputtering chamber) are described with reference to FIG. 20(B). The deposition chamber 2706b illustrated in FIG. 20(B) includes a target 2766a, a target 2766b, a target shield 2767a, a target shield 2767b, a magnet unit 2790a, a magnet unit 2790b, a substrate holder 2768, and power sources 2791. Although not illustrated, each of the target 2766a and the target 2766b is fixed to a target holder with a backing plate provided therebetween. The power source 2791 is electrically connected to each of the target 2766a and the target 2766b. The magnet unit 2790a is placed on a back side of the target 2766a and the magnet unit 2790b is placed on a back side of the target 2766b. The target shield 2767a is placed so as to surround an end portion of the target 2766a and the target shield 2767b is placed so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the targets 2766a and 2766b (also referred to as a region between targets). Placing the substrate holder 2768 supporting the substrate 2769 in the region between targets can reduce damage due to plasma in some cases, for example. Although not illustrated, the substrate holder 2768 may include a substrate holding mechanism which holds the substrate 2769, a rear heater which heats the substrate 2769 from the back surface, or the like.

The target shield 2767a and the target shield 2767b can suppress deposition of a particle which is sputtered from the target 2766a and the target 2766b on a region where deposition is not needed. Moreover, a target shield 2767 and the target shield 2767b are preferably processed to prevent accumulated sputtered particles from being separated. For example, blasting treatment that increases surface roughness, or roughness may be formed on the surfaces of the target shield 2767 and the target shield 2767b.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas that is introduced to the deposition chamber 2706b can be heated to higher than or equal to 40° C. and lower than or equal to 400° C., preferably higher than or equal to 50° C. and lower than or equal to 200° C. Note that although the gas heating mechanism 2782, the mass flow controller 2780, and the refiner 2781 can be provided for each of a plurality of kinds of gases, only one is illustrated for easy understanding. As the gas introduced to the deposition chamber 2706b, a gas whose dew point is −80° C. or lower, preferably −100° C. or lower can be used; for example, an oxygen gas, a nitrogen gas, and a rare gas (an argon gas or the like) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Further, a high-performance ultra-compact metal gasket joint (a UPG joint) is preferably used as a joint of the pipe. A structure where all the materials of the pipe are metal is preferably employed, in which case the effect of the generated released gas or the external leakage can be reduced compared with a structure where resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism that can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperatures of a first-stage refrigerator may be set to lower than or equal to 100 K, and a second-stage refrigerator may be set to lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited thereto, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b that are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Moreover, the transfer chamber 2704, the substrate heating chamber 2705, and the deposition chamber 2706b that are described above preferably have a small amount of external leakage or internal leakage.

For example, in the transfer chamber 2704, the substrate heating chamber 2705, and the deposition chamber 2706b that are described above, the leakage rate is less than or equal to $3\times10^{-6}$ Pa·m$^3$/s, preferably less than or equal to $1\times10^6$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface be thinly covered with iron fluoride, aluminum oxide, chromium oxide, or the like so as to suppress release of gas.

When an adsorbate is present in the deposition chamber, the adsorbate does not affect the pressure in the deposition chamber because it is adsorbed onto an inner wall or the like; however, it causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promotion of desorption of the adsorbate. By the baking, the rate of desorption of the adsorbate can be increased about tenfold. The baking can be performed at a temperature greater than or equal to 100° C. and less than or equal to 450° C. At this time, when the adsorbate is removed while an inert gas is introduced to the deposition chamber, the desorption rate of water or the like, which is difficult to desorb simply by exhaust, can be further increased. Note that when the inert gas that is introduced is heated to substantially the same temperature as the baking temperature, the desorption rate of the adsorbate can be further increased. Here, a rare gas is preferably used as the inert gas. Depending on the kind of a film to be formed, oxygen or the like may be used instead of an inert gas. For example, in deposition of an oxide, the use of oxygen that is a main component of the oxide is preferable in some cases. The baking is preferably performed using a lamp.

Alternatively, treatment for evacuating the inside of the deposition chamber is preferably performed again a certain period of time after heated oxygen, a heated inert gas such as a heated rare gas, or the like is introduced to increase a pressure in the deposition chamber. The introduction of the heated gas can desorb the adsorbate in the deposition chamber, and the impurities present in the deposition chamber can be reduced. Note that an advantageous effect can be achieved when this treatment is repeated greater than or equal to twice and less than or equal to 30 times, preferably greater than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced, so that the pressure in the deposition chamber can be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa, and a period during which the pressure is kept can be longer than or equal to 1 minute and shorter than or equal to 300 minutes, preferably longer than or equal to 5 minutes and shorter than or equal to 120 minutes. After that, the deposition chamber is evacuated for a period longer than or equal to 5 minutes and shorter than or equal to 300 minutes, preferably longer than or equal to 10 minutes and shorter than or equal to 120 minutes.

The rate of desorption of the adsorbate can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbate on the inner wall of the deposition chamber are confined in the film. As the dummy substrate, a substrate that releases a smaller amount of gas is preferably used. By performing dummy deposition, the concentration of impurities in a film to be formed later can be reduced. Note that the dummy deposition may be performed at the same time as baking.

Figure 20C:
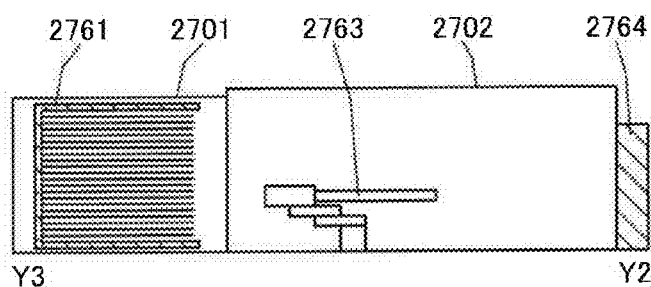

Next, the details of the transfer chamber 2704 and the load lock chamber 2703a illustrated in FIG. 20(B) and the atmosphere-side substrate transfer chamber 2702 and the atmosphere-side substrate supply chamber 2701 illustrated in FIG. 20(C) are described. Note that FIG. 20(C) is a cross section of the atmosphere-side substrate transfer chamber 2702 and the atmosphere-side substrate supply chamber 2701.

For the transfer chamber 2704 illustrated in FIG. 20(B), the description of the transfer chamber 2704 illustrated in FIG. 20(A) can be referred to.

The load lock chamber 2703a includes a substrate delivery stage 2752. When a pressure in the load lock chamber 2703a becomes atmospheric pressure by being increased from reduced pressure to the atmosphere, the substrate delivery stage 2752 receives a substrate from the transfer robot 2763 provided in the atmosphere-side substrate transfer chamber 2702. After that, the load lock chamber 2703a is evacuated into vacuum so that the pressure becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 19 can have a structure similar to that in the load lock chamber 2703a.

The atmosphere-side substrate transfer chamber 2702 includes the transfer robot 2763. By the transfer robot 2763, a substrate can be delivered between the cassette port 2761 and the load lock chamber 2703a. Furthermore, a mechanism for cleaning dust or a particle, such as an HEPA filter (High Efficiency Particulate Air Filter), may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In fact, a plurality of targets are arranged with as few spaces as possible to obtain a large shape; however, a tiny space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$.

Furthermore, an oxide semiconductor whose nitrogen concentration by SIMS is lower than $5 \times 10^{19}$ atoms/cm$^3$, preferably lower than or equal to $1 \times 10^{18}$ atoms/cm$^3$, further preferably lower than or equal to $5 \times 10^{18}$ atoms/cm$^3$, and still further preferably lower than or equal to $1 \times 10^{18}$ atoms/cm$^3$ can be deposited.

Moreover, an oxide semiconductor whose carbon concentration by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$ can be deposited.

Furthermore, an oxide semiconductor can be deposited in which the released amount of each of a gas molecule (atom) having a mass-to-charge ratio (m/z) of 2 (a hydrogen molecule or the like), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44 by thermal desorption spectroscopy (TDS) is less than or equal to $1 \times 10^{19}$/cm$^3$ and preferably less than or equal to $1 \times 10^{18}$/cm$^3$.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact with the oxide semiconductor can be suppressed.

<Deposition Method>

An example of a deposition model of a CAAC-OS using a sputtering method is described below.

Figure 21A:
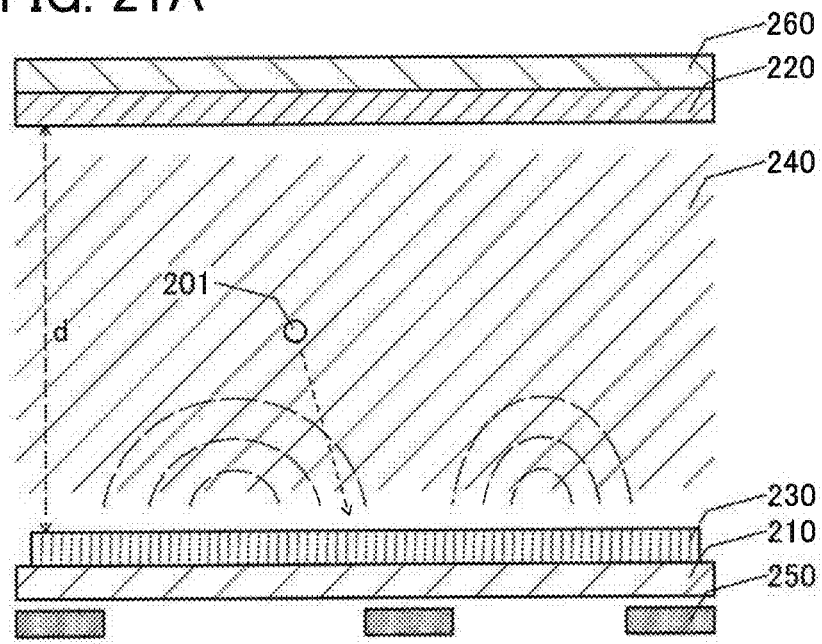
FIG. 21 Diagrams illustrating a deposition method of a CAAC-OS.
Figure 21B:
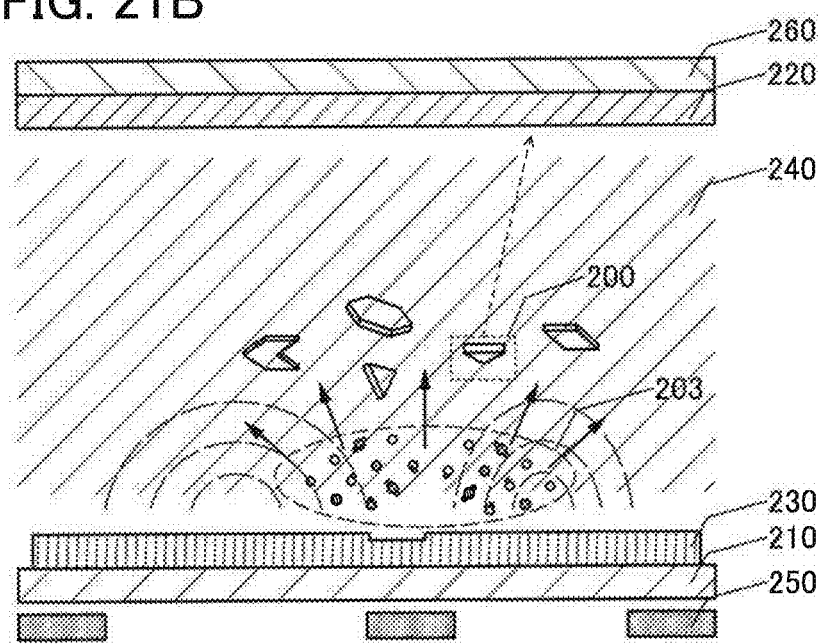

As shown in FIG. 21(A), a substrate 220 and a target 230 are arranged to face each other. The distance d between the substrate 220 and the target 230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., oxygen, argon, or a mixed gas containing oxygen at 5 vol % or higher) and is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 230, and the plasma 240 can be observed. The magnetic field forms a high-density plasma region in the vicinity of the target 230. In the high-density plasma region, the deposition gas is ionized, so that an ion 201 is generated. Examples of the ion 201 include an oxygen cation (O$^+$) and an argon cation (Ar$^+$). A heating mechanism 260 is under the substrate 220.

The target 230 is attached to a backing plate 210. A magnet 250 is placed to face the target 230 with the backing plate 210 positioned therebetween. A sputtering method in which the deposition rate is increased by utilizing a magnetic field of magnets is referred to as a magnetron sputtering method.

Figure 22A:
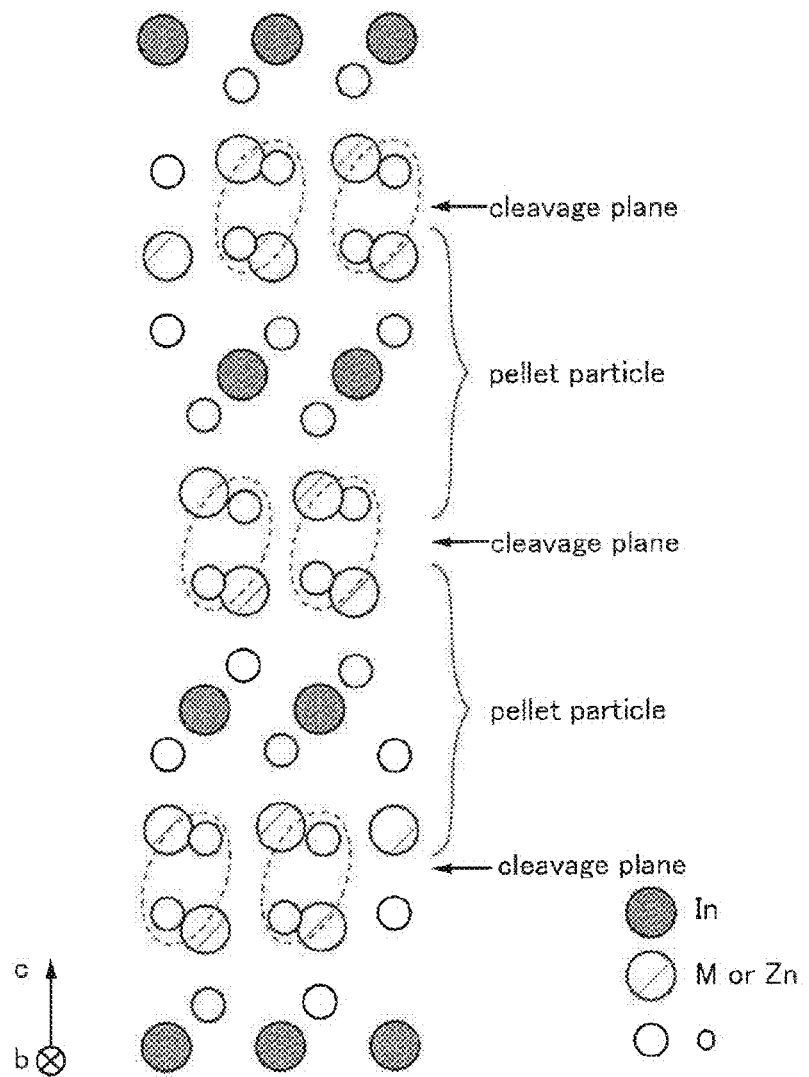
FIG. 22 Diagrams illustrating a crystal of $InMZnO_4$ and a pellet.

Here, the target 230 has a polycrystalline structure which includes a plurality of crystal grains. FIG. 22(A) illustrates a crystal structure of InMZnO$_4$ (the element M is, for example, aluminum, gallium, yttrium, or tin) included in the target 230 as an example. Note that FIG. 22(A) illustrates the crystal structure of InMZnO$_4$ observed from a direction parallel to the b-axis. In the crystal of InMZnO$_4$, oxygen atoms have negative charge, whereby repulsive force is generated between the two adjacent M-Zn—O layers. Thus, the InMZnO$_4$ crystal has a cleavage plane between the two adjacent M-Zn—O layers.

The ion 201 generated in the high-density plasma region is accelerated toward the target 230 side by an electric field, and then collides with the target 230. At this time, a pellet 200, which is a flat-plate-like or pellet-like sputtered particle, is separated from the cleavage plane. Note that along with the separation of the pellet 200, particles 203 are sputtered from the target 230. The particles 203 each have an atom or an aggregate of several atoms. Thus, the particles 203 can be referred to as atomic particles.

Figure 22B:
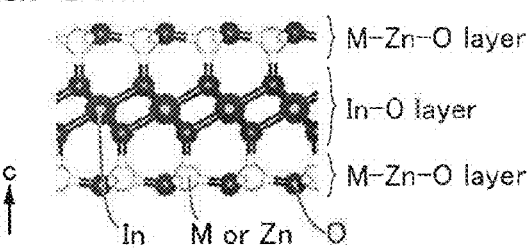
Figure 22C:
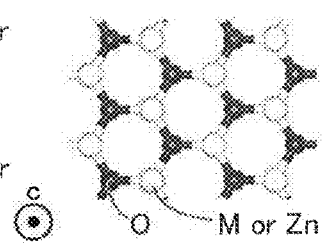
Figure 23A:
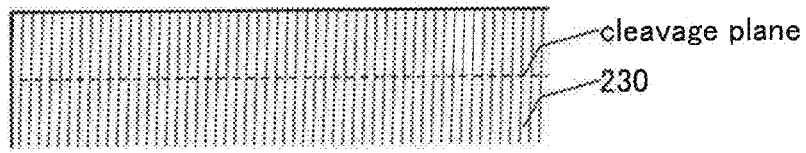
FIG. 23 Diagrams illustrating a deposition method of a CAAC-OS.
Figure 23B:
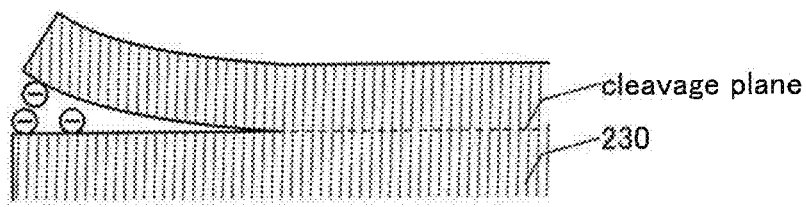
Figure 23C:
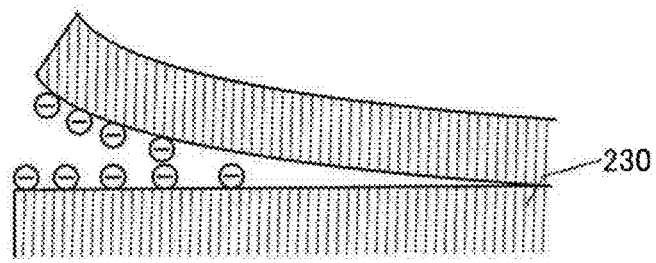
Figure 23D:
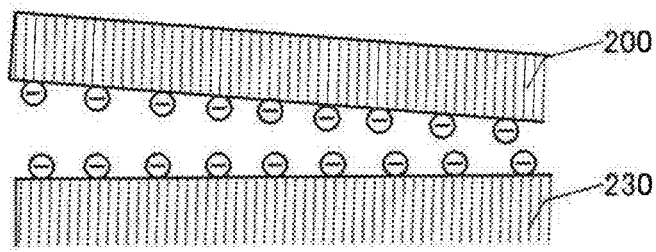

The state of cleavage at a surface of the target is described with reference to cross-sectional views in FIG. 23. FIG. 23(A) is a cross-sectional view of the target 230 having a cleavage plane (a dashed line portion). When the ion 201 collides with the target 230, bonds are sequentially cut from an end portion of the cleavage plane (see FIG. 23(B)). The cleaved surfaces repel each other because of the existence of charges with the same polarity. For this reason, rebinding does not occur once the bond is cut. As repellency due to charges proceeds, a region where bonds are cut gradually expands (see FIG. 23(C)). In the end, the pellet 200 is separated from the target 230 (see FIG. 23(D)). The pellet 200 is a portion sandwiched between the two cleavage planes shown in FIG. 22(A). Thus, when only the pellet 200 is picked up, the cross-section thereof is as shown in FIG. 22(B), and the top surface thereof is as shown in FIG. 22(C). Note that the structure of the pellet 200 may be distorted by an impact of collision with the ion 201.

The pellet 200 is a flat-plate-like or pellet-like sputtered particle having a triangle plane, e.g., a regular triangle plane. Alternatively, the pellet 200 is a flat-plate-like or pellet-like sputtered particle having a hexagon plane, for example, regular hexagon plane. However, the shape of the pellet 200 is not limited to a triangle or a hexagon. For example, it may have a shape formed by combining two or more triangles. For example, a quadrangle (e.g., rhombus) may be formed by combining two triangles (e.g., regular triangles).

The thickness of the pellet 200 is determined depending on the kind of deposition gas and the like. The thickness of the pellet 200 is, for example, greater than or equal to 0.4 nm and less than or equal to 1 nm, preferably greater than or equal to 0.6 nm and less than or equal to 0.8 nm. In addition, the width of the pellet 200 is, for example, greater than or equal to 1 nm and less than or equal to 3 nm, preferably greater than or equal to 1.2 nm and less than or equal to 2.5 nm.

A surface of the pellet 200 might be negatively or positively charged when the pellet 200 receives a charge from the plasma 240. For example, the pellet 200 receives a negative charge from $O^{2-}$ in the plasma 240. In that case, oxygen atoms on the surfaces of the pellet 200 are negatively charged. A lateral growth might occur when the particles 203 are attached and bonded to a side surface of the pellet 200 in the plasma 240.

The pellet 200 and the particle 203 that have passed through the plasma 240 reach the surface of the substrate 220. Note that some of the particles 203 are discharged to the outside by a vacuum pump or the like because of their smallness in mass.

Figure 24A:
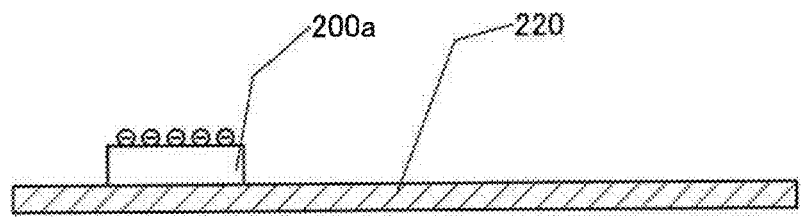
FIG. 24 Diagrams illustrating a deposition method of a CAAC-OS.
Figure 24B:
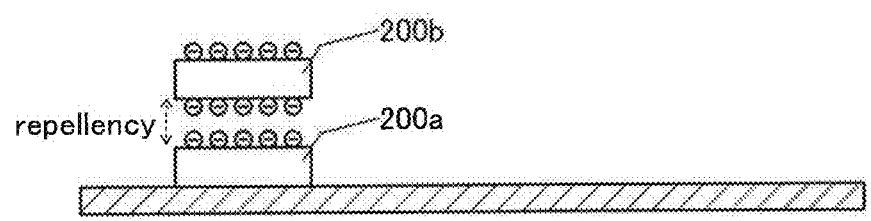

Next, deposition of the pellets 200 and the particles 203 on the surface of the substrate 220 is described with reference to FIG. 24.

First, a pellet 200a, which is the first of the pellets 200, is deposited on a substrate 220. Since the pellet 200a has a flat-plate-like shape, it is deposited so that the flat plane faces a surface of the substrate 220 (FIG. 24(A)). Here, a charge on a surface of the pellet 200a on the substrate 220 side is lost through the substrate 220.

Next, a pellet 200b, which is the second of the pellets 200, reaches the substrate 220. At that time, since a surface of the pellet 200a and a surface of the pellet 200b are charged, a force by which they repel each other is generated (FIG. 24(B)).

Figure 24C:
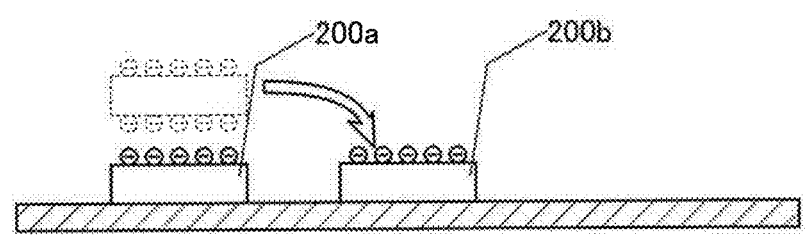

As a result, the pellet 200b avoids being deposited over the pellet 200a, and is deposited with its flat plane facing the surface of the substrate 220 so as to be a little distance away from the pellet 200a (FIG. 24(C)). With repetition of this, millions of the pellets 200 are deposited on the surface of the substrate 220 to have a thickness of one layer. A region where no pellet 200 is deposited is generated between adjacent pellets 200.

Figure 25A:
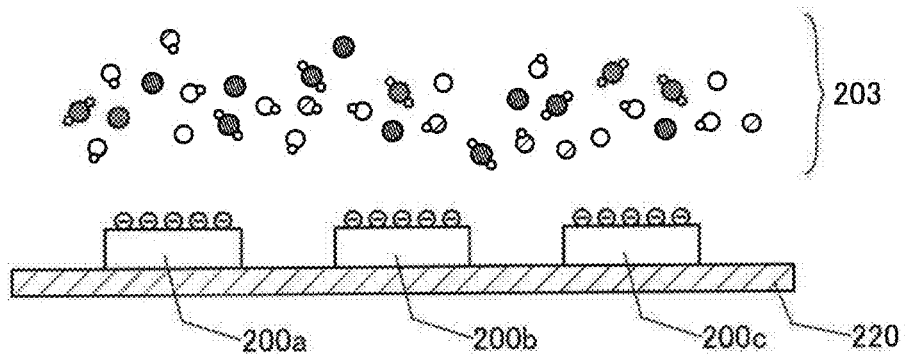
FIG. 25 Diagrams illustrating a deposition method of a CAAC-OS.

Then, a pellet 200c, which is the third of the pellets 200, is deposited with its flat plane facing the surface of the substrate 220. Then, the particles 203 that have received energy from the plasma 240 reach the surface of the substrate 220 (see FIG. 25(A)).

Figure 25B:
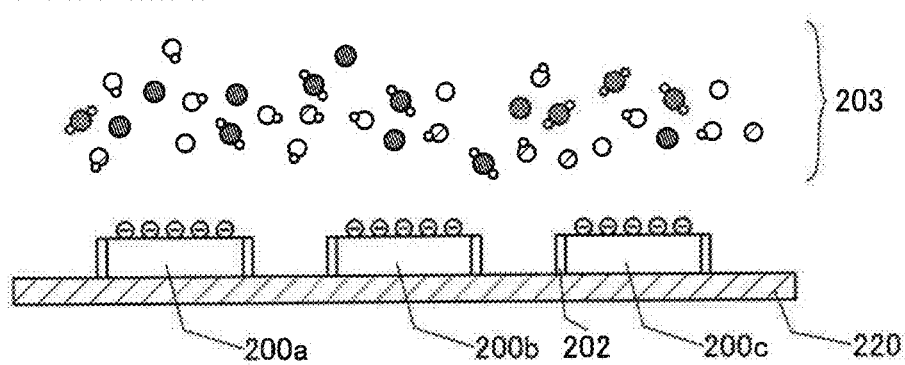
Figure 25C:
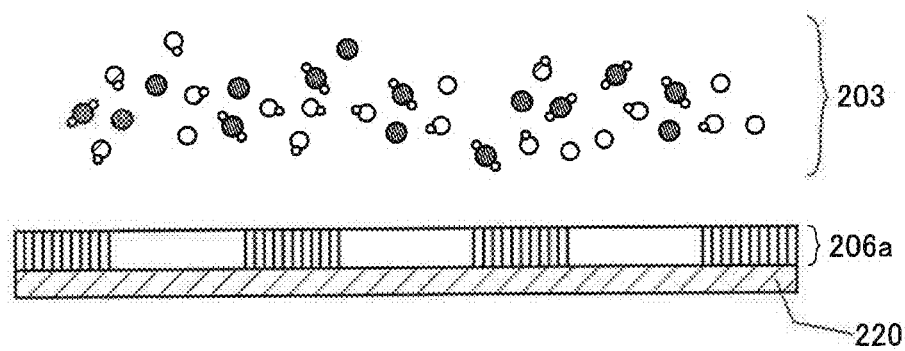

The particle 203 cannot be deposited over an active region such as the surface of the pellet 200. For this reason, the particles 203 are deposited so as to fill a region where no pellet 200 is deposited. Then, the particles 203 are attached between the pellets 200. Since a bond of the particle 203 is activated by energy received from the plasma 240, the particle 203 is chemically bonded to the pellet 200 to form a lateral growth portion 202 (see FIG. 25(B)). The lateral growth portion 202 then further grow laterally (also referred to as lateral growth) so that the pellets 200 are anchored to each other, whereby a layer 206a is formed (see FIG. 25(C)). In this manner, the particles 203 are deposited until they fill regions where no pellet 200 is deposited. This mechanism is similar to a deposition mechanism of an atomic layer deposition (ALD) method.

Accordingly, even when the plurality of pellets 200 which are deposited with their flat planes facing the surface of the substrate 220 are oriented in different directions, the particles 203 cause a lateral growth to fill regions between the plurality of pellets 200; thus, no clear grain boundary is formed. In addition, as the particles 203 make a smooth connection between the plurality of pellets 200, a crystal structure different from single crystal and polycrystal structures is formed. In other words, a crystal structure including distortion between minute crystal regions (pellets 200) is formed. The regions filling between the crystal regions are distorted crystal regions, and thus, it will not be appropriate to say that the regions have an amorphous structure.

Figure 26A:
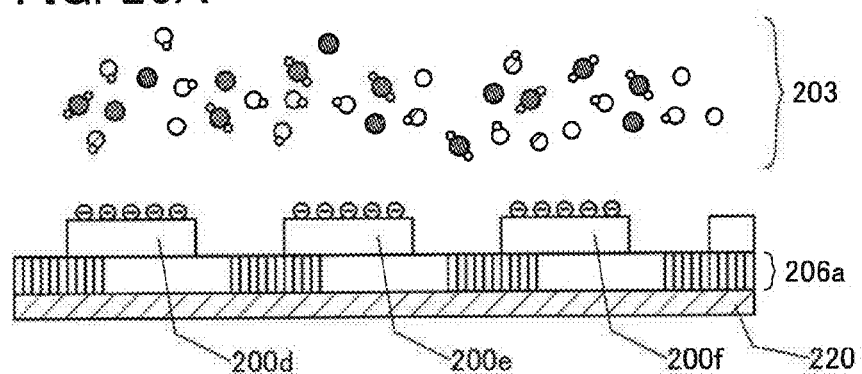
FIG. 26 Diagrams illustrating a deposition method of a CAAC-OS.
Figure 26B:
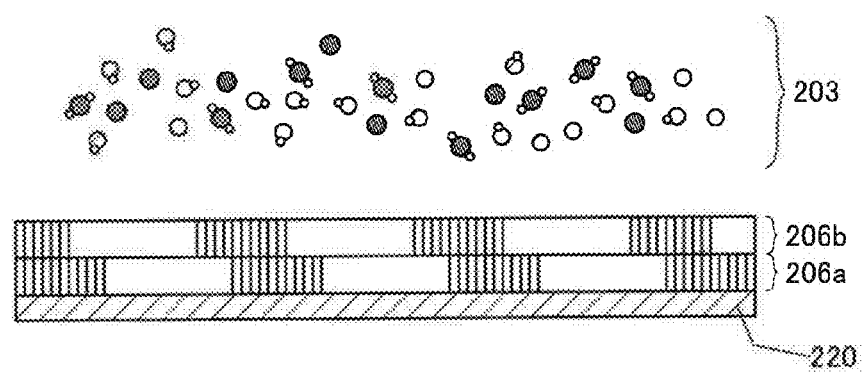
Figure 26C:
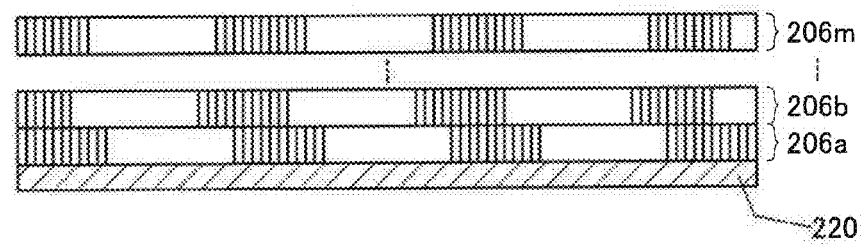

Then, pellets 206d, 206e, and 206f, which are new pellets 200, are deposited with their flat planes facing a surface of the layer 206a (see FIG. 26(A)). After that, the particles 203 are deposited so as to fill a region where no pellet 200 is deposited. In such a manner, the particles 203 are attached to side surfaces of the pellets 200 and the lateral growth portion 202 causes a lateral growth so that the pellets 200 are anchored to each other, whereby a layer 206b is formed (see FIG. 26(B)). Deposition continues until an m-th layer 206m (m is an integer of two or more) is formed; as a result, a thin film structure including a stack is obtained (see FIG. 26(C)).

A deposition way of the pellets 200 changes according to the surface temperature of the substrate 220 or the like. For example, if the surface temperature of the substrate 220 is high, migration of the pellets 200 occurs on the surface of the substrate 220. As a result, the proportion of the pellets 200 that are directly connected with each other without the particles 203 increases, whereby a CAAC-OS with high orientation is made. The surface temperature of the substrate 220 for deposition of the CAAC-OS is higher than or equal to 100° C. and lower than 500° C., preferably higher than or equal to 140° C. and lower than 450° C. and further preferably higher than or equal to 170° C. and lower than 400° C. Therefore, even when a large-sized substrate of the 8th generation or more is used as the substrate 220, a warp or the like due to the deposition of the CAAC-OS hardly occurs.

In contrast, if the surface temperature of the substrate 220 is low, the migration of the pellets 200 does not easily occur on the substrate 220. As a result, the pellets 200 are stacked to form an nc-OS (nanocrystalline Oxide Semiconductor) or the like with low orientation. In the nc-OS, the pellets 200 are possibly deposited with certain gaps when the pellets 200 are negatively charged. Therefore, it has low orientation but some regularity, and thus it has a denser structure than an amorphous oxide semiconductor.

When spaces between the pellets are extremely small in a CAAC-OS, a large pellet may be formed. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are considered to be deposited on a surface of a substrate according to such deposition models. A CAAC-OS can be deposited even when a formation surface does not have a crystal structure, which indicates that the above-described deposition models, which are growth mechanisms different from an epitaxial growth, have high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), a CAAC-OS can be formed, for example.

In addition, even when the surface of the substrate (formation surface) has an uneven shape, the pellets are aligned along the shape.

The above-described deposition model suggests that a CAAC-OS with high crystallinity can be deposited in the following manner. First, deposition is performed in a high vacuum to have a long mean free path. Then, plasma energy is weakened to reduce damage around a substrate. Next, thermal energy is applied to a formation surface to repair damage due to plasma during deposition.

The above is the description of the case where a pellet has a flat-plate-like shape. In the case of a cubic pellet or a columnar pellet that has a small width, for example, pellets that reached a surface of a substrate are oriented in various directions. Then, particles are attached to side surfaces of the deposited pellets while the orientations of the pellets are varied, and lateral growth portions cause a lateral growth. There is possibility that the crystal orientation in the resulting thin film is not uniform.

The above-described deposition model is not limited to the case where a target has a polycrystalline structure of a composite oxide with a plurality of crystal grains, such as an In-M-Zn oxide, and any of the crystal grains have a cleavage plane. It can be applied to the case where, for example, a target of a mixture containing indium oxide, an oxide of the element M, and zinc oxide is used.

Since a target of a mixture has no cleavage plane, atomic particles are separated from the target by sputtering. During deposition, a high electric field region of plasma is formed around a target. Because of the high electric field region of plasma, atomic particles separated from the target are anchored to each other to cause a lateral growth. For example, the lateral growth occurs first in such a manner that the atomic particles of indium are bonded to each other to be a nanocrystal formed of an In—O layer. Then, M-Zn—O layers are bonded to the top and bottom to complement it. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. Also in that case, a lateral growth of an atomic particle might occur on the substrate surface. However, since the orientations of atomic particles are not the same, the crystal orientation in the resulting thin film is not uniform. As a result, an nc-OS or the like is obtained.

<Lateral Growth>

The following description explains that a lateral growth occurs when the particles 203 are attached to (bonded to or adsorbed on) the pellet 200 laterally.

FIG. 27(A), FIG. 27(B), FIG. 27(C), FIG. 27(D), and FIG. 27(E) illustrate the structure of the pellet 5200 and positions to which metal ions are attached. A model assumed as the pellet 200 is a cluster model with 84 atoms which are extracted from an InGaZnO$_4$ crystal structure while a constant stoichiometric composition is maintained. FIG. 27(F) illustrates the structure of the pellet 200 seen in the direction parallel to the c-axis. FIG. 27(G) illustrates the structure of the pellet 200 seen in the direction parallel to the a-axis.

The positions to which metal ions are attached are represented as a position A, a position B, a position a, a position b, and a position c. The position A is an upper part of an interstitial site surrounded by one gallium and two zinc on the top surface of the pellet 200. The position B is an upper part of an interstitial site surrounded by two gallium and one zinc on the top surface of the pellet 200. The position a is in an indium site on a side surface of the pellet 200. The position b is in an interstitial site between an In—O layer and a Ga—Zn—O layer on a side surface of the pellet 200. The position c is in a gallium site on a side surface of the pellet 200.

The relative energy was estimated from first principles calculation for the cases where a metal ion was located in the assumed position A, position B, position a, position b, and the position c. In the first principles calculation, VASP (Vienna Ab initio Simulation Package) was used. For the exchange-correlation potential, PBE (Perdew-Burke-Ernzerhof) type generalized gradient approximation (GGA) was used, and for the ion potential, a PAW (Projector Augmented Wave) method was used. The cut-off energy was 400 eV, and k-point sampling was only Γ point used. The table below shows the relative energies in the case where an indium ion ($In^{3+}$), a gallium ion ($Ga^{3+}$), and a zinc ion ($Zn^{2+}$) are located at the position A, the position B, the position a, the position b, and the position c. Note that the relative energy is a relative value under the condition where the energy of the model with the lowest energy among the calculated models is set to 0 eV.

TABLE 1

| | Relative energy [eV] | | | | |
|---|---|---|---|---|---|
| | Top surface of pellet | | Side surface of pellet | | |
| Ion | A | B | a | b | c |
| $In^{3+}$ | 2.1 | 1.5 | 0.0 | 1.8 | 1.9 |
| $Ga^{3+}$ | 3.7 | 3.0 | 0.6 | 0.0 | 3.5 |
| $Zn^{2+}$ | 2.3 | 1.8 | 0.0 | 0.6 | 2.9 |

As a result, it is found that any metal ion is more likely to be attached to the side surface of the pellet 200 than to the top surface thereof. It is also found that a zinc ion as well as an indium ion is most likely to be attached to the indium site at the position a.

Similarly, ease of oxygen ion ($O^{2-}$) attachment to the pellet 200 was examined. FIG. 28(A), FIG. 28(B), FIG. 28(C), FIG. 28(D), and FIG. 28(E) illustrate the structure of the pellet 200 and positions to which oxygen ions can be attached. FIG. 28(F) illustrates the structure of the pellet 200 seen in the direction parallel to the c-axis. FIG. 28(G) illustrates the structure of the pellet 200 seen in the direction parallel to the b-axis.

The positions to which oxygen ions are attached are represented as a position C, a position D, a position d, a position e, and a position f. The position C is a position for bonding with gallium on the top surface of the pellet 200. The position D is a position for bonding with zinc on the top surface of the pellet 200. The position d is a position for bonding with indium on the side surface of the pellet 200. The position e is a position for bonding with gallium on the side surface of the pellet 200. The position f is a position for bonding with zinc on the side surface of the pellet 200.

The relative energy was estimated from first principles calculation for the cases where an oxygen ion was located in the assumed position C, position D, position d, position e, and position f. The table below shows the relative energies in the case where oxygen ions ($O^{2-}$) are located at the position C, the position D, the position d, the position e, and the position f.

TABLE 2

| | Relative energy [eV] | | | | |
|---|---|---|---|---|---|
| | Top surface of pellet | | Side surface of pellet | | |
| Ion | C | D | d | e | f |
| $O^{2-}$ | 3.9 | 3.6 | 0.0 | 0.5 | 1.5 |

As a result, it is found that the oxygen ion is also likely to be attached to the side surface of the pellet 200 than to the top surface thereof.

Accordingly, it is found that the particle 203 that has approached the pellet 200 is preferentially attached to the side surface of the pellet 200. This suggests that the deposition model in which a lateral growth of the pellet 200 occurs owing to the particles 203 attached to the side surface of the pellet 200 has high validity.

<Structure of Oxide Semiconductor>

The structure of an oxide semiconductor is described below.

Oxide semiconductors are classified into a single crystal oxide semiconductor and a non-single-crystal oxide semiconductor. Examples of a non-single-crystal oxide semiconductor include a CAAC-OS (C Axis Aligned Crystalline Oxide Semiconductor), a polycrystalline oxide semiconductor, an nc-OS (nanocrystalline Oxide Semiconductor), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, it is a structure which has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, it has physical properties similar to those of an amorphous oxide semiconductor.

<CAAC-OS>

First, a CAAC-OS is described.

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 56A:
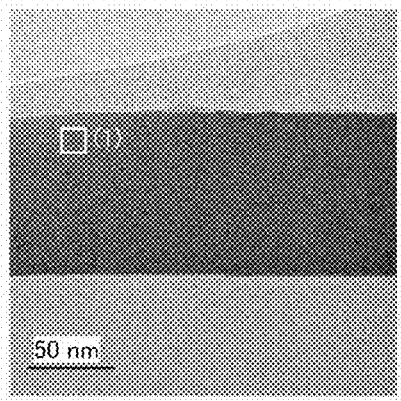
FIG. 56 Cs-corrected high-resolution TEM images of a cross section of a CAAC-OS and a cross-sectional schematic view of a CAAC-OS.

The CAAC-OS observed with a TEM is described below. FIG. 56(A) shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 56B:
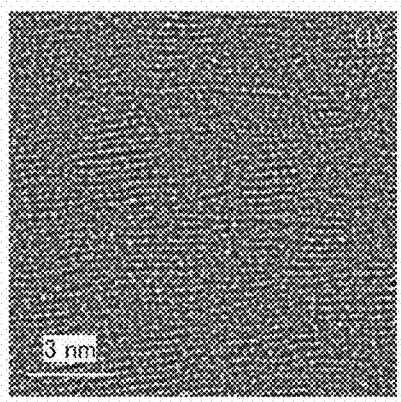

FIG. 56(B) is an enlarged Cs-corrected high-resolution TEM image of a region (1) in FIG. 56(A). FIG. 56(B) shows that metal atoms are arranged in a layered manner in a pellet. Each metal atom layer has a configuration reflecting unevenness of a surface over which the CAAC-OS is formed (also referred to as a formation surface) or a top surface of the CAAC-OS, and is arranged parallel to the formation surface or the top surface of the CAAC-OS.

Figure 56C:
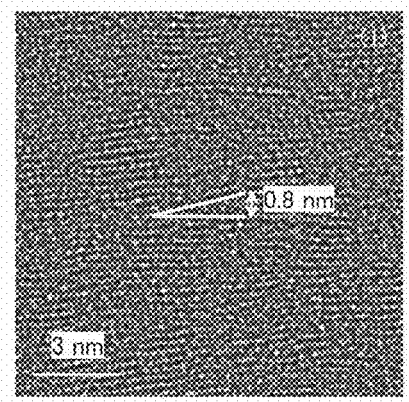

As shown in FIG. 56(B), the CAAC-OS has a characteristic atomic arrangement. The characteristic atomic arrangement is denoted by an auxiliary line in FIG. 56(C). FIG. 56(B) and FIG. 56(C) prove that the size of a pellet is approximately 1 nm to 3 nm, and that the size of a space caused by tilt of the pellets is approximately 0.8 nm. Therefore, the pellet can also be referred to as a nanocrystal (nc). Furthermore, the CAAC-OS can also be referred to as an oxide semiconductor including CANC (C-Axis Aligned nanocrystals).

Figure 56D:
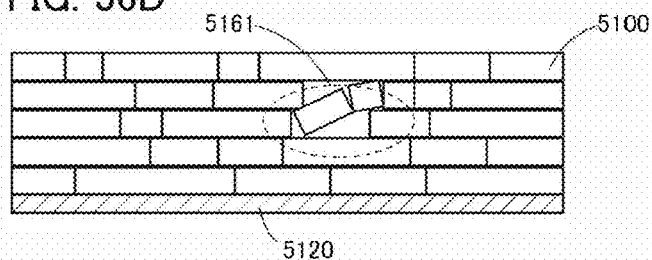

Here, according to the Cs-corrected high-resolution TEM images, the schematic arrangement of pellets 5100 of a CAAC-OS over a substrate 5120 is illustrated by such a structure in which bricks or blocks are stacked (see FIG. 56(D)). The part in which the pellets are tilted as observed in FIG. 56(C) corresponds to a region 5161 shown in FIG. 56(D).

FIG. 57(A) show a Cs-corrected high-resolution TEM image of a plane of the CAAC-OS observed from a direction substantially perpendicular to the sample surface. FIG. 57(B). FIG. 57(C), and FIG. 57(D) are enlarged Cs-corrected high-resolution TEM images of a region (1), a region (2), and a region (3) in FIG. 57(A), respectively. FIG. 57(B), FIG. 57(C), and FIG. 57(D) indicate that metal atoms are arranged in a triangular, quadrangular, or hexagonal configuration in a pellet. However, there is no regularity of arrangement of metal atoms between different pellets.

Figure 58A:
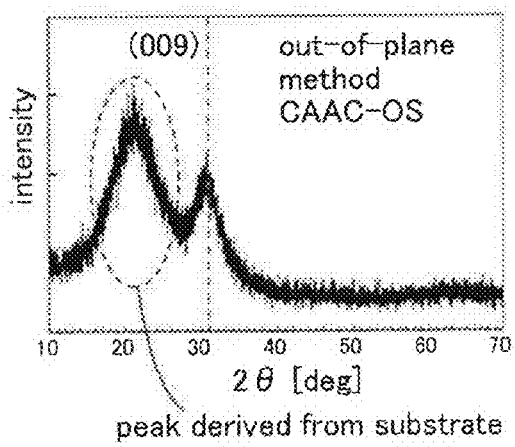
FIG. 58 Diagrams illustrating structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 58(A). This peak is derived from the (009) plane of the InGaZnO$_4$ crystal, which indicates that crystals in the CAAC-OS have c-axis alignment, and that the c-axes are aligned in the direction substantially perpendicular to the formation surface or the top surface.

Note that in structural analysis of the CAAC-OS by an out-of-plane method, another peak may appear when 2θ is around 36°, in addition to the peak at 2θ of around 310. The peak at 2θ of around 36° indicates that a crystal having no c-axis alignment is included in part of the CAAC-OS. In a preferable CAAC-OS whose structure is analyzed by an out-of-plane method, a peak appears when 2θ is around 31° and no peak appears when 2θ is around 36°.

Figure 58B:
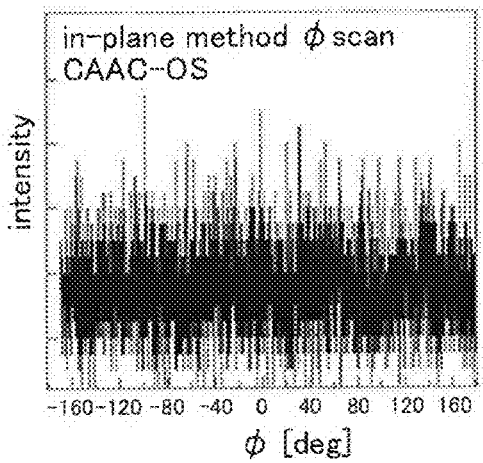
Figure 58C:
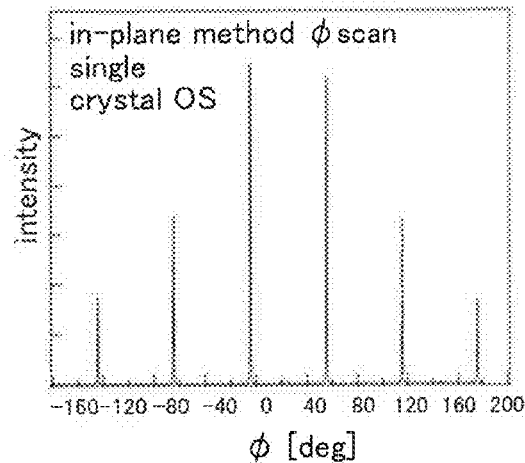

On the other hand, in structural analysis of the CAAC-OS by an in-plane method in which an X-ray is incident on a sample in the direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated about a normal vector of the sample surface as an axis (φ axis), as shown in FIG. 58(B), a clear peak is not observed. In contrast, in the case of a single crystal oxide semiconductor of InGaZnO$_4$, when φ scan is performed with 2θ fixed at around 56°, six peaks which are derived from crystal planes equivalent to the (110) plane are observed as shown in FIG. 58(C). Accordingly, the structural analysis using XRD shows that the directions of a-axes and b-axes are irregularly oriented in the CAAC-OS.

Figure 59A:
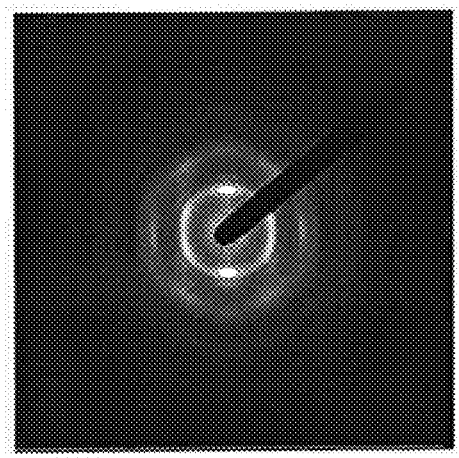
FIG. 59 Diagrams illustrating electron diffraction patterns of a CAAC-OS.
Figure 59B:
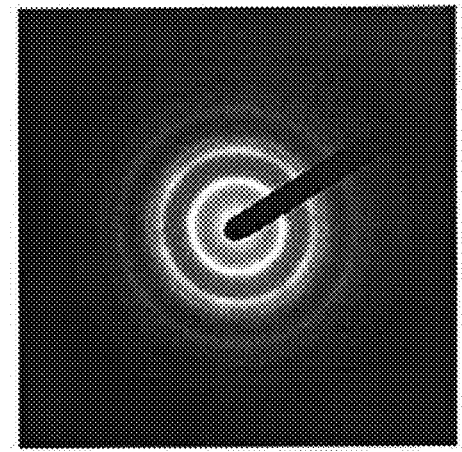

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 59(A) may appear. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 59(B) shows a diffraction pattern obtained in such a manner that an electron beam with a probe diameter of 300 nm is incident on the same sample in a direction perpendicular to the sample surface. As shown in FIG. 59(B), a ring-like diffraction pattern is observed. Thus, the electron diffraction also indicates that the a-axes and b-axes of the pellets included in the CAAC-OS do not have regular alignment. The first ring in FIG. 59(B) is considered to be derived from the (010) plane, the (100) plane, and the like of the InGaZnO$_4$ crystal. The second ring in FIG. 59(B) is considered to be derived from the (110) plane and the like.

As described above, the CAAC-OS is an oxide semiconductor with high crystallinity. Entry of impurities, formation of defects, or the like might decrease the crystallinity of an oxide semiconductor; therefore, it can be said that the CAAC-OS has small amounts of impurities and defects (oxygen vacancies and the like).

Note that the impurity means an element other than the main components of the oxide semiconductor, such as hydrogen, carbon, silicon, or a transition metal element. For example, an element having higher strength of bonding to oxygen than a metal element included in an oxide semiconductor, such as silicon, extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with a low carrier density. Specifically, it can be an oxide semiconductor with a carrier density of lower than $8\times10^{11}/cm^3$, preferably lower than $1\times10^{11}/cm^3$, further preferably lower than $1\times10^{11}/cm^3$, and higher than or equal to $1\times10^{-9}/cm^3$. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is shown in a ring-like region in some cases.

Since there is no regularity of crystal orientation between the pellets (nanocrystals) as mentioned above, the nc-OS can also be referred to as an oxide semiconductor including RANC (Random Aligned nanocrystals) or an oxide semiconductor including NANC (Non-Aligned nanocrystals).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 60:
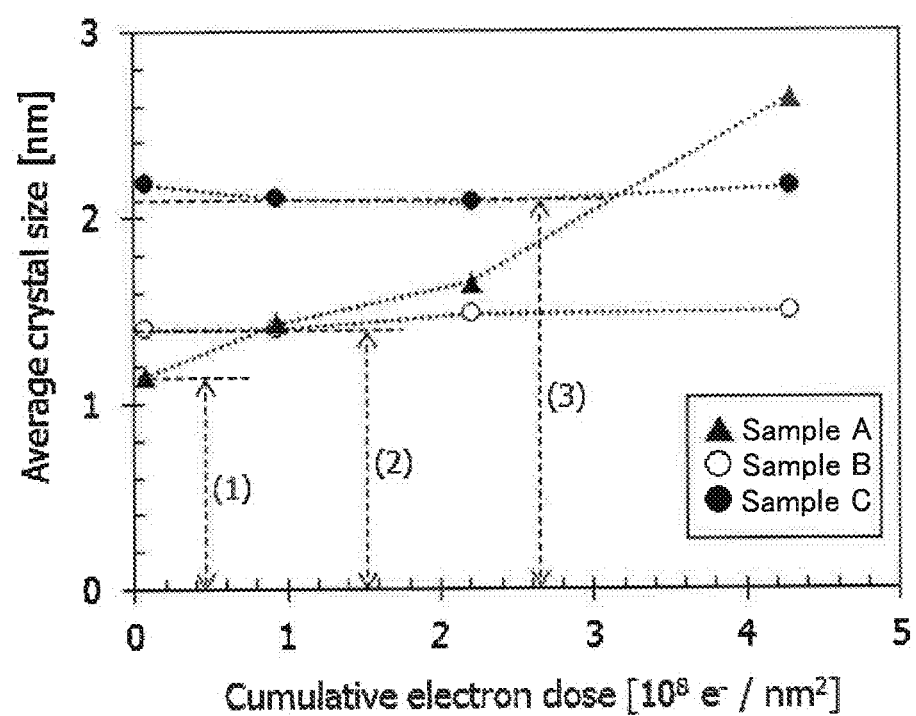
FIG. 60 A diagram showing a change in crystal part of an In—Ga—Zn oxide by electron irradiation.
Figure 61:
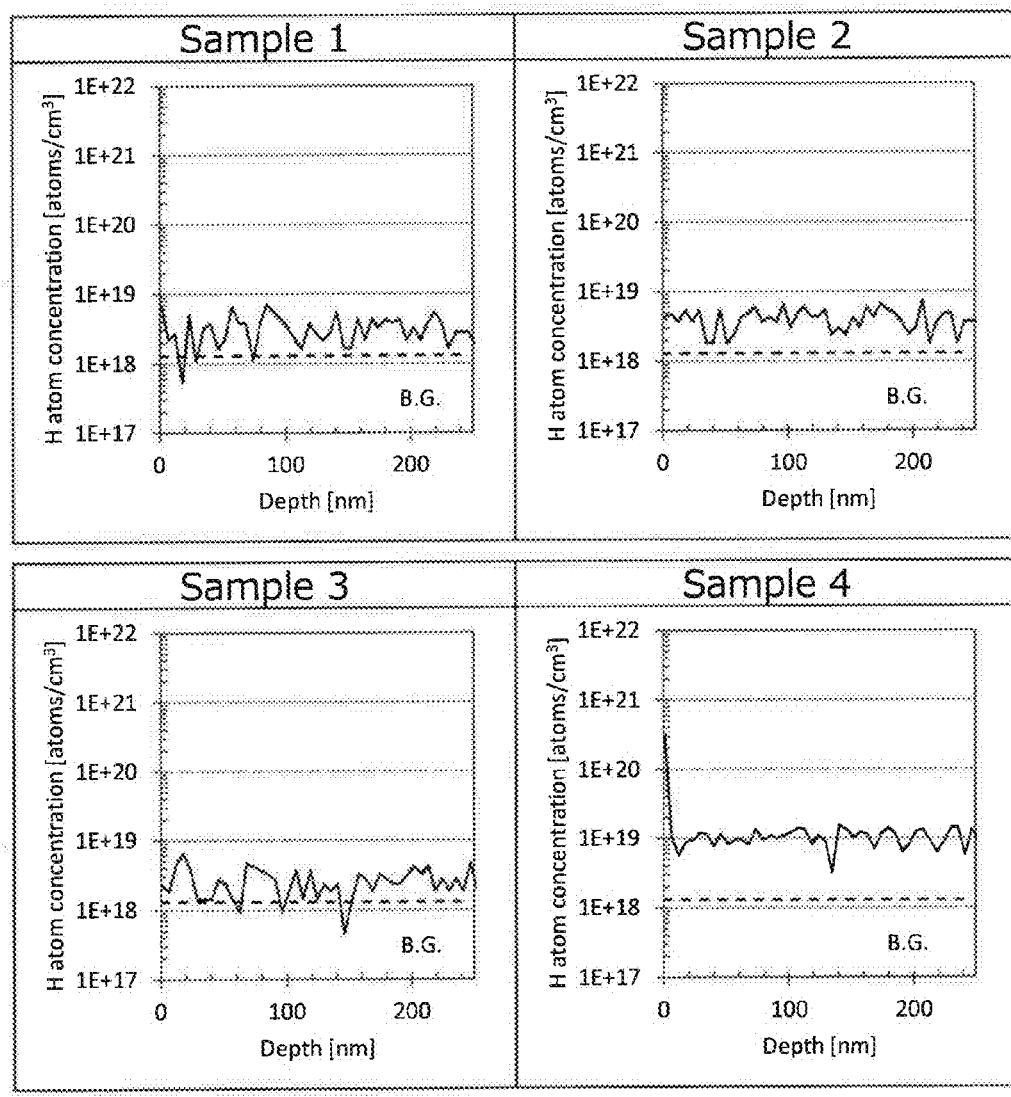
FIG. 61 Diagrams showing hydrogen concentrations.

FIG. 60 shows change in the average size of crystal parts (at 22 points to 45 points) in each sample. Note that the crystal part size corresponds to the length of a lattice fringe. FIG. 60 indicates that the crystal part size in the a-like OS increases with an increase in the cumulative electron dose. Specifically, as shown by (1) in FIG. 60, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 60, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor with In:Ga:Zn=1:1:1 [atomic ratio], the density of single crystal InGaZnO$_4$ with a rhombohedral crystal structure is 6.357 g/cm$^3$. Accordingly, in the case of the oxide semiconductor with In:Ga:Zn=1:1:1 [atomic ratio], the density of the a-like OS is higher than or equal to 5.0 g/cm$^3$ and lower than 5.9 g/cm$^3$. For example, in the case of the oxide semiconductor with In:Ga:Zn=1:1:1 [atomic ratio], the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Transistor 1>

Figure 28A:
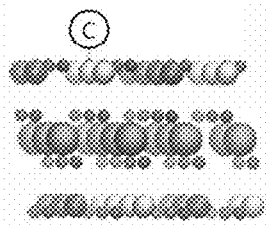
FIG. 28 Diagrams illustrating a position where a particle is attached to a pellet.
Figure 28B:
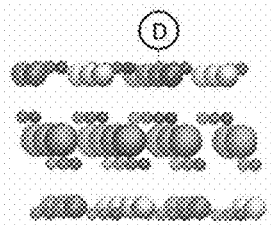
Figure 28C:
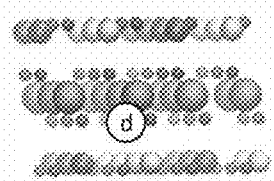
Figure 28D:
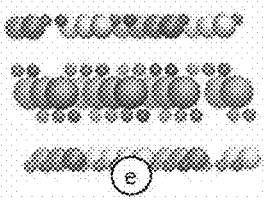
Figure 28E:
Figure 28F:
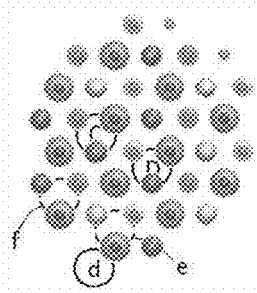
Figure 28G:
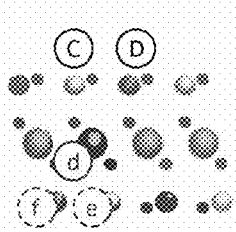
Figure 29A:
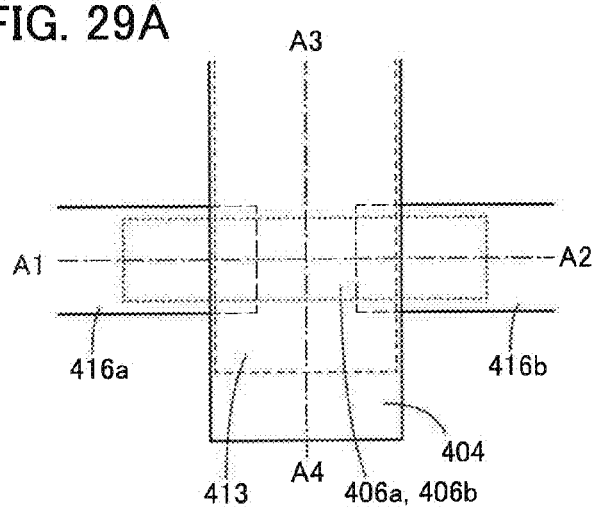
FIG. 29 A top view and a cross-sectional view illustrating a transistor according to one embodiment of the present invention.
Figure 29B:
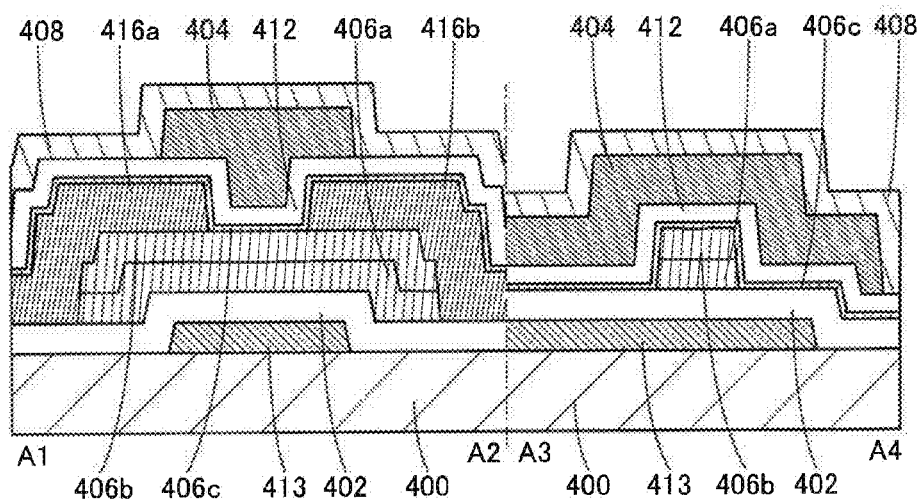

FIGS. 28(A) and 29(B) are a top view and a cross-sectional view illustrating a transistor according to one embodiment of the present invention. FIG. 29(A) is a plan view and FIG. 29(B) is a cross-sectional view taken along dashed-dotted line A1-A2 and dashed-dotted line A3-A4 in FIG. 29(A). Note that for simplification of the drawing, some components are not illustrated in the top view in FIG. 29(A).

The transistor in FIG. 29(A) and FIG. 29(B) includes a conductor 413 over a substrate 400, an insulator 402 over the substrate 400 and the conductor 413, a semiconductor 406a over the insulator 402, a semiconductor 406b over the semiconductor 406a, a conductor 416a and a conductor 416b which are in contact with a top surface and a side surface of the semiconductor 406b and which are distanced from each other, a semiconductor 406c over the semiconductor 406b, the conductor 416a, and the conductor 416b, an insulator 412 over the semiconductor 406c, a conductor 404 over the insulator 412, and an insulator 408 over the conductor 404. Although the conductor 413 is part of the transistor here, it is not limited thereto. For example, the conductor 413 may be a component independent of the transistor.

The conductor 404 includes a region that faces the top surface and the side surface of the semiconductor 406b with the insulator 412 provided therebetween in the cross section taken along line A3-A4. The conductor 413 includes a region which faces the bottom surface of the semiconductor 406b with the insulator 402 provided therebetween.

The semiconductor 406b has a function of a channel formation region of the transistor. The conductor 404 has a function of a first gate electrode (also referred to as a front gate electrode) of the transistor. The conductor 413 has a function of a second gate electrode (also referred to as a back gate electrode) of the transistor. The conductor 416a and the conductor 416b have functions of a source electrode and a drain electrode of the transistor.

As illustrated in FIG. 29(B), the semiconductor 406b can be electrically surrounded by an electric field of the conductor 404 and/or the conductor 413 (a structure in which a semiconductor is electrically surrounded by an electric field of a conductor is referred to as a surrounded channel (s-channel) structure). Therefore, a channel is formed in the entire semiconductor 406b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 406b. Therefore, as the semiconductor 406b has a larger thickness, a channel region becomes larger. In other words, the thicker the semiconductor 406b is, the larger the on-state current of the transistor is. In addition, when the semiconductor 406b is thicker, the proportion of the region with a high carrier controllability increases, leading to a smaller subthreshold swing value. For example, the semiconductor 406b has a region with a thickness of greater than or equal to 20 nm, preferably greater than or equal to 40 nm, further preferably greater than or equal to 60 nm, still further preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased.

The s-channel structure is suitable for a miniaturized transistor because a high on-state current can be obtained. Since the transistor can be miniaturized, a semiconductor device including the transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a device over a flexible substrate, there is a method in which the device is formed over a non-flexible substrate and then the device is separated and transferred to the substrate 400 which is a flexible substrate. In that case, a separation layer is preferably provided between the non-flexible substrate and the device. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 mm and less than or equal to 700 mm, preferably greater than or equal to 10 mm and less than or equal to 500 mm, or further preferably greater than or equal to 15 mm and less than or equal to 300 mm. When the substrate 400 is thinned, the weight of the semiconductor device can be reduced. When the substrate 400 is thinned, even in the case of using glass or the like, it may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The substrate 400 that is a flexible substrate preferably has a lower coefficient of linear expansion because deformation due to an environment is suppressed. The substrate 400 that is a flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

As the conductor 413, a single layer or a stacked of a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

As the insulator 402, a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. As the insulator 402, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

The insulator 402 preferably contains excess oxygen in the case where the semiconductor 406b is an oxide semiconductor.

As the conductor 416a and the conductor 416b, a single layer or a stacked of a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

As the insulator 412, a single layer or a stack of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used, for example. As the insulator 402, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used, for example.

The insulator 412 preferably contains excess oxygen in the case where the semiconductor 406b is an oxide semiconductor.

As the conductor 404, a single layer or a stack of a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

The insulator 408 is, for example, an insulator having a low hydrogen-transmitting property (i.e., a hydrogen barrier property).

Hydrogen is likely to be diffused in an insulator (i.e., the diffusion coefficient is large) because the atomic radius or the like is small. For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include inorganic insulators such as silicon oxide or silicon oxynitride and organic insulators such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator containing crystal grain boundaries can have a high hydrogen-transmitting property. In other words, hydrogen is less likely transmitted through an insulator containing no crystal grain boundaries (or few crystal grain boundaries). For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of the device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The insulator 408 is, for example, an insulator having a low oxygen-transmitting property (i.e., an oxygen barrier property).

The insulator 408 is, for example, an insulator having a low water-transmitting property (i.e., a water barrier property).

Figure 30A:
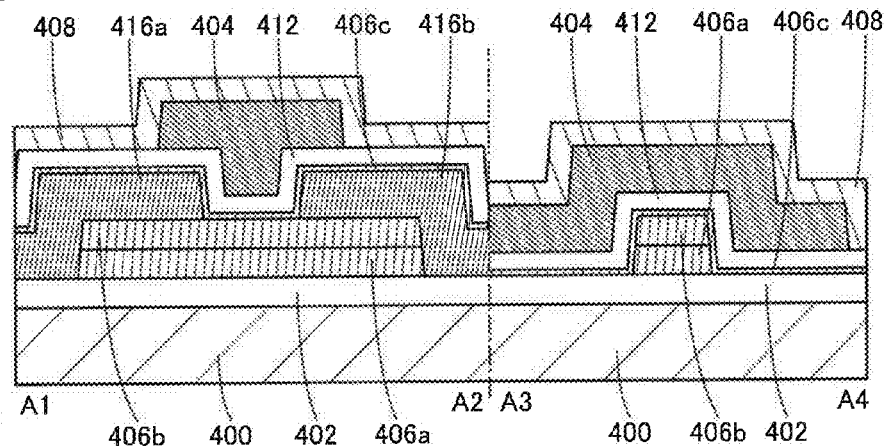
FIG. 30 Cross-sectional views of transistors according to one embodiment of the present invention.
Figure 30B:
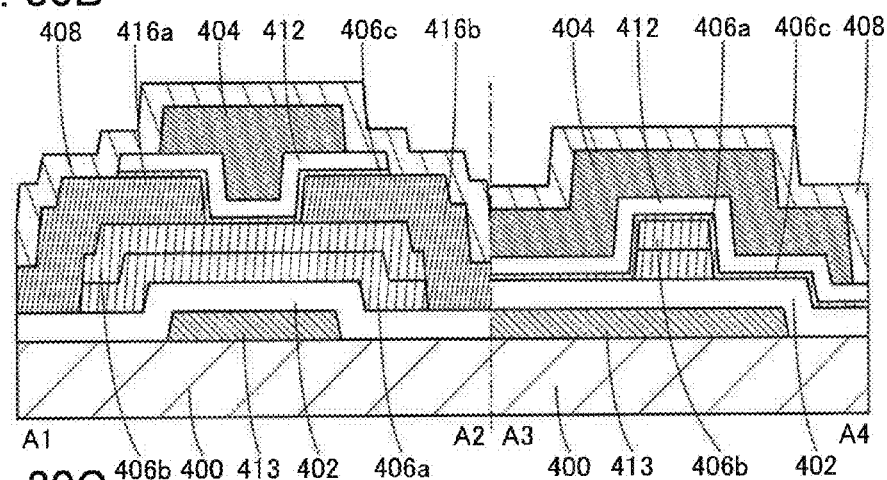
Figure 30C:
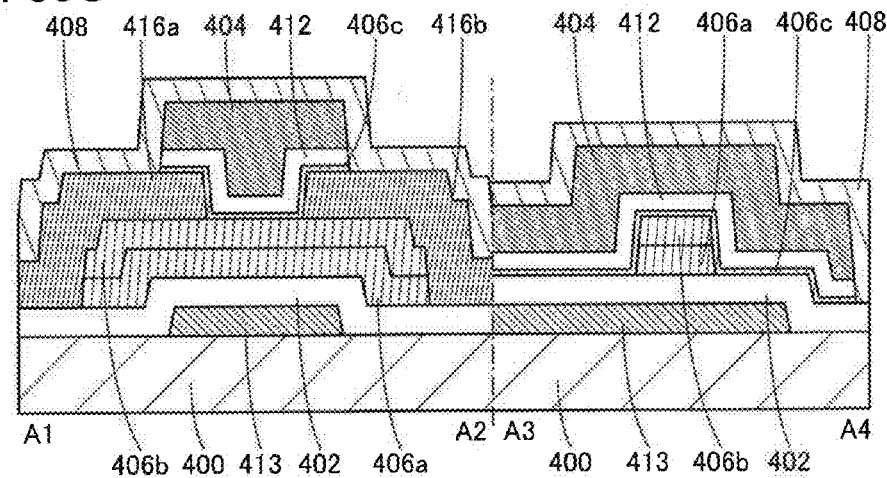
Figure 31A:
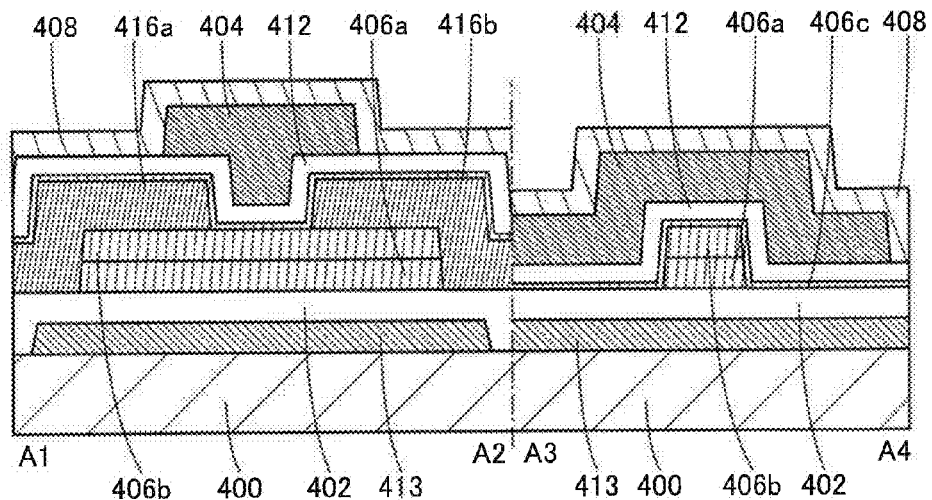
FIG. 31 Cross-sectional views of transistors according to one embodiment of the present invention.
Figure 31B:
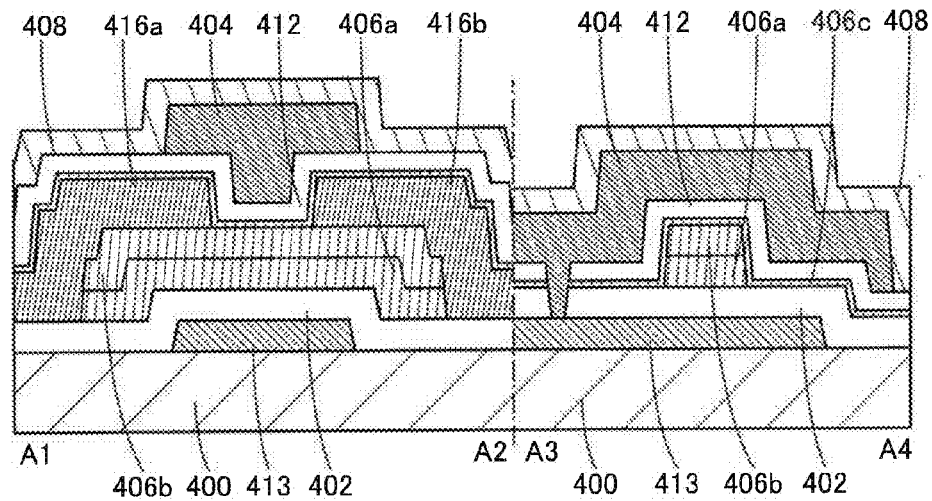
Figure 31C:
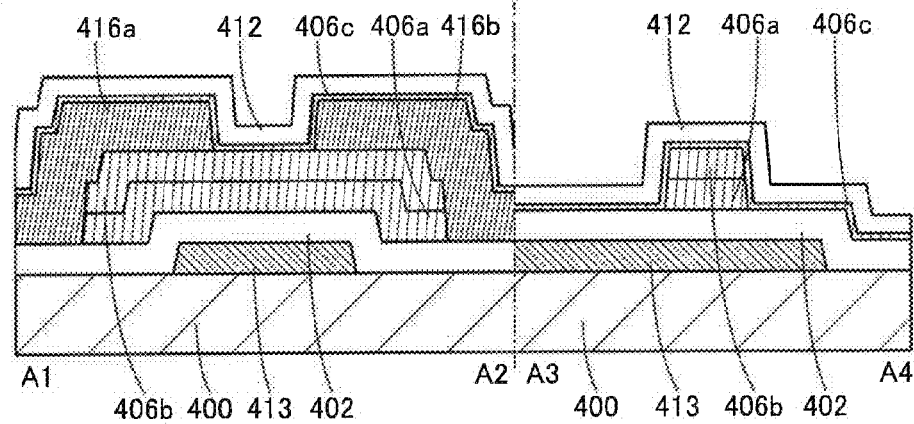

Note that the conductor 413 is not necessarily formed (see FIG. 30(A)). The insulator 412 and the semiconductor 406c may extend beyond the conductor 404 (see FIG. 30(B)). The insulator 412 and the semiconductor 406c do not necessarily extend beyond the conductor 404 (see FIG. 30(C)). In the A1-A2 cross section, the width of the conductor 413 may be larger than that of the semiconductor 406b (see FIG. 31(A)). The conductor 413 and the conductor 404 may be in contact with each other through an opening (see FIG. 31(B)). The conductor 404 is not necessarily formed (see FIG. 31(C)).

<Semiconductor>

The semiconductor 406a, the semiconductor 406b, and the semiconductor 406c are described below.

By placing the semiconductor 406a and the semiconductor 406c over and under the semiconductor 406b, electrical characteristics of the transistor can be increased in some cases.

The semiconductor 406b is an oxide semiconductor containing indium, for example. The semiconductor 406b has high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 406b preferably contains zinc. When the oxide semiconductor contains zinc, it is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c include one or more elements, or two or more elements other than oxygen included in the semiconductor 406b. Since the semiconductor 406a and the semiconductor 406c include one or more elements, or two or more elements other than oxygen included in the semiconductor 406b, a defect state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case where the semiconductor 406a is an In-M-Zn oxide, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case where the semiconductor 406b is an In-M-Zn oxide, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case where the semiconductor 406c is an In-M-Zn oxide, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is a type the same as that of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406b, and the semiconductor 406c are not necessarily simple ratios of integers.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has a small electron affinity and an excellent oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 406b having the highest electron affinity in the semiconductor 406a, the semiconductor 406b, and the semiconductor 406c.

Figure 32:
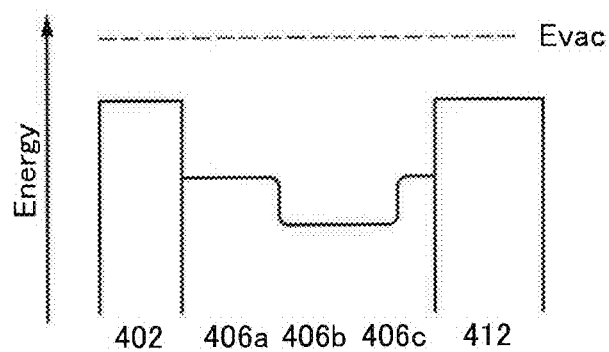
FIG. 32 A band diagram of a region including an oxide semiconductor according to one embodiment of the present invention.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of defect states. For that reason, in a band diagram of a stack including the semiconductor 406a, the semiconductor 406b, and the semiconductor 406c (see FIG. 32), energy changes continuously at each interface and in the vicinity of the interface (also referred to as continuous junction). Note that boundaries of the semiconductor 406a, the semiconductor 406b, and the semiconductor 406c are not clear in some cases.

At this time, electrons move mainly in the semiconductor 406b, not in the semiconductor 406a and the semiconductor 406c. As described above, when the density of defect states at the interface between the semiconductor 406a and the semiconductor 406b and the density of defect states at the interface between the semiconductor 406b and the semiconductor 406c are decreased, electron movement in the semiconductor 406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 µm×1 µm of a top surface or a bottom surface of the semiconductor 406b (a formation surface; here, the semiconductor 406a) is less than 1 nm, preferably less than 0.6 nm, further preferably less than 0.5 nm, or still further preferably less than 0.4 nm). The average surface roughness (also referred to as Ra) with the measurement area of 1 µm×1 µm is less than 1 nm, preferably less than 0.6 nm, further preferably less than 0.5 nm, still more preferably less than 0.4 nm. The maximum difference (P-V) with the measurement area of 1 µm×1 µm is less than 10 nm, preferably less than 9 nm, further preferably less than 8 nm, still further preferably less than 7 nm. RMS roughness, Ra, and P-V can be measured using, for example, a scanning probe microscope SPA-500 manufactured by SII Nano Technology Inc.

Moreover, the thickness of the semiconductor 406c is preferably as small as possible to increase the on-state current of the transistor. The semiconductor 406c has a region with a thickness of less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The semiconductor 406c has a region with a thickness of greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. The semiconductor 406a has a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

A region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406a, for example. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406c.

The semiconductor 406b has a region in which the hydrogen concentration measured by SIMS is greater than or equal to $1\times10^{16}$ atoms/cm$^3$ and less than or equal to $2\times10^{20}$ atoms/cm$^3$, preferably greater than or equal to $1\times10^{16}$ atoms/cm$^3$ and less than or equal to $5\times10^{19}$ atoms/cm$^3$, more preferably greater than or equal to $1\times10^{16}$ atoms/cm$^3$ and less than or equal to $1\times10^{19}$ atoms/cm$^3$, or still more preferably greater than or equal to $1\times10^{16}$ atoms/cm$^3$ and less than or equal to $5\times10^{18}$ atoms/cm$^3$. It is preferable to reduce the concentration of hydrogen in the semiconductor 406a and the semiconductor 406c in order to reduce the concentration of hydrogen in the semiconductor 406b. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. The semiconductor 406b has a region in which the nitrogen concentration measured by SIMS is greater than or equal to $1\times10^{15}$ atoms/cm$^3$ and less than or equal to $5\times10^{19}$ atoms/cm$^3$, preferably greater than or equal to $1\times10^{15}$ atoms/cm$^3$ and less than or equal to $5\times10^{18}$ atoms/cm$^3$, more preferably greater than or equal to $1\times10^{15}$ atoms/cm$^3$ and less than or equal to $1\times10^{18}$ atoms/cm$^3$, or still more preferably greater than or equal to $1\times10^{15}$ atoms/cm$^3$ and less than or equal to $5\times10^{17}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) may be employed in which one or more of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

<Transistor 2>

Figure 33A:
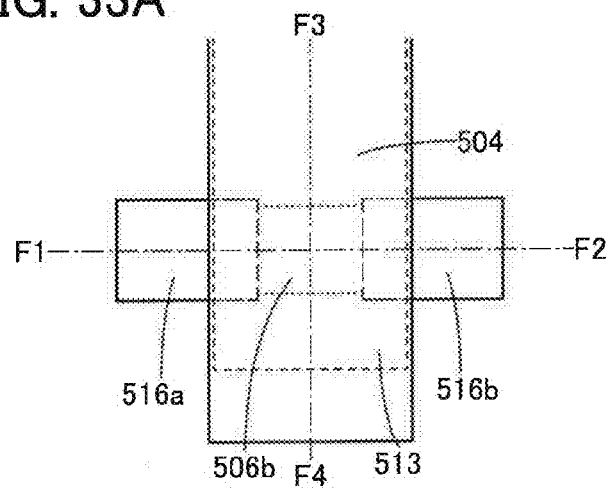
FIG. 33 A top view and a cross-sectional view illustrating a transistor according to one embodiment of the present invention.
Figure 33B:
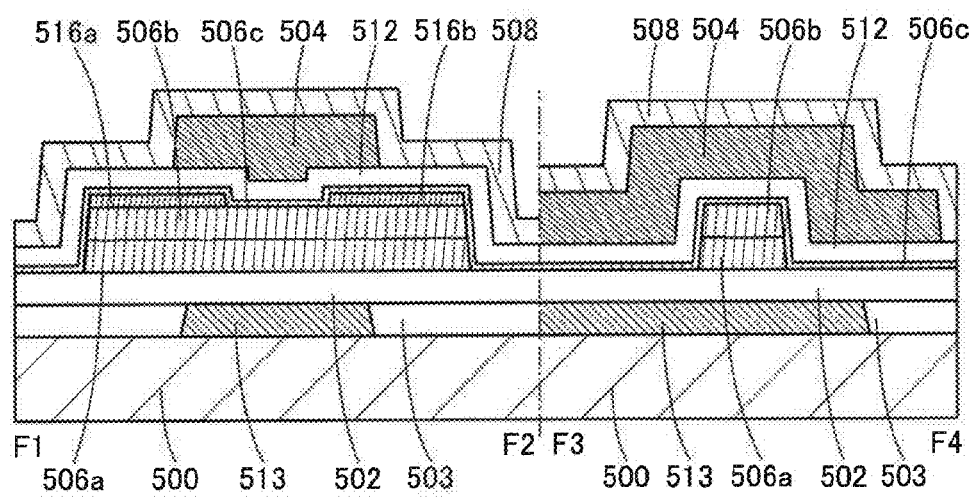

FIG. 33(A) and FIG. 33(B) are a top view and a cross-sectional view illustrating a transistor according to one embodiment of the present invention. FIG. 33(A) is a top view and FIG. 33(B) is a cross-sectional view taken along dashed-dotted line F1-F2 and dashed-dotted line F3-F4 in FIG. 33(A). Note that for simplification of the drawing, some components are not illustrated in the top view in FIG. 33(A).

A transistor illustrated in FIG. 33(A) and FIG. 33(B) includes a conductor 513 over a substrate 500; an insulator 503 that is over an insulator 502 and is level with the conductor 513; the insulator 502 over the conductor 513 and the insulator 503: a semiconductor 506a over the insulator 502; a semiconductor 506b over the semiconductor 506a a conductor 516a and a conductor 516b which are in contact with a top surface of the semiconductor 506b and distanced from each other; a semiconductor 506c over the insulator 502, the semiconductor 506b, the conductor 516a, and the conductor 516b; an insulator 512 over the semiconductor 506c; a conductor 504 over the insulator 512: and an insulator 508 over the conductor 504. Although the conductor 513 is part of the transistor in this case, it is not limited thereto. The conductor 513 may be a component independent of the transistor, for example.

For the substrate 500, refer to the description of the substrate 400. For the conductor 513, the description of the conductor 413 is referred to. For the insulator 502, the description of the insulator 402 is referred to. For the semiconductor 506a, the description of the semiconductor 406a is referred to. For the semiconductor 506b, the description of the semiconductor 406b is referred to. For the conductor 516a, the description of the conductor 416a is referred to. For the conductor 516b, the description of the conductor 416b is referred to. For the semiconductor 506c, the description of the semiconductor 406c is referred to. For the insulator 512, the description of the insulator 412 is referred to. For the conductor 504, the description of the conductor 404 is referred to. For the insulator 508, the description of the insulator 408 is referred to.

As the insulator 503, a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. As the insulator 503, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used, for example.

As illustrated in FIG. 33(B), the transistor has an s-channel structure. The electric field from the conductor 504 and the conductor 513 is less likely to be inhibited by the conductor 516a, the conductor 516b, and the like at the side surface of the semiconductor 506b.

Figure 34A:
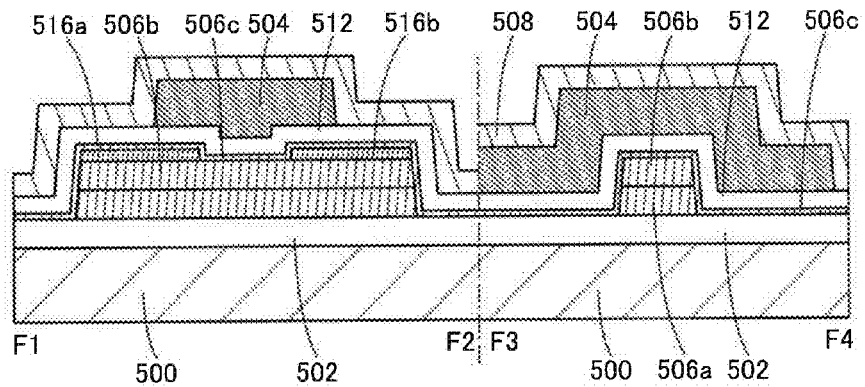
FIG. 34 Cross-sectional views of transistors of one embodiment according to the present invention.
Figure 34B:
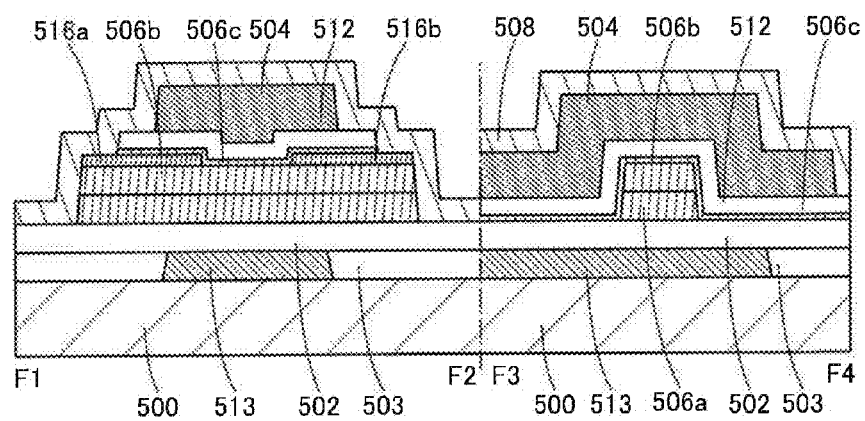
Figure 34C:
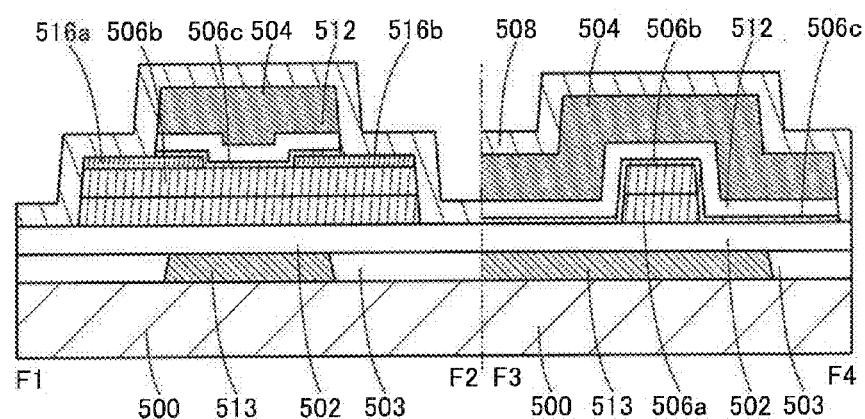
Figure 35A:
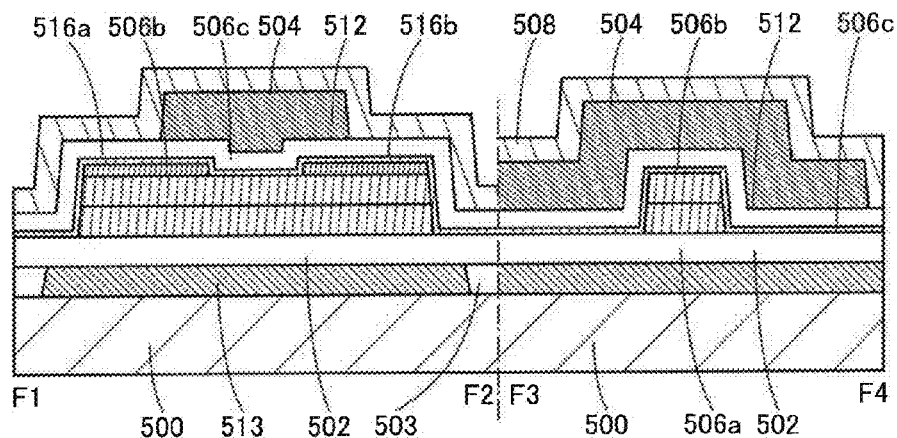
FIG. 35 Cross-sectional views of transistors according to one embodiment of the present invention.

Note that the conductor 513 is not necessarily formed (see FIG. 34(A)). The insulator 512 and the semiconductor 506c may extend beyond the conductor 504 (see FIG. 34(B)). The insulator 512 and the semiconductor 506c do not necessarily extend beyond the conductor 504 (see FIG. 34(C)). In the F1-F2 cross section, the width of the conductor 513 may be larger than that of the semiconductor 506b (see FIG. 35(A)).

Figure 35B:
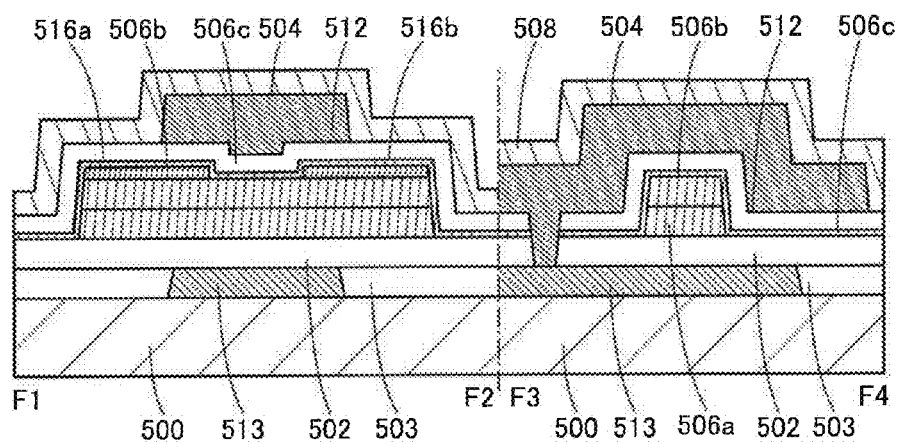
Figure 35C:
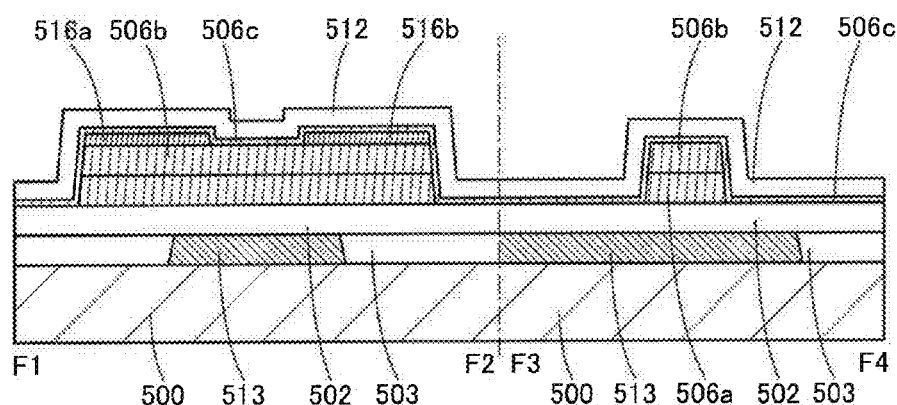

The conductor 513 and the conductor 504 may be in contact with each other through an opening (see FIG. 35(B)). The conductor 504 is not necessarily formed (see FIG. 35(C)).

<Circuit>

An example of a circuit of a semiconductor device according to one embodiment of the present invention is described below.

<CMOS Inverter>

Figure 36A:
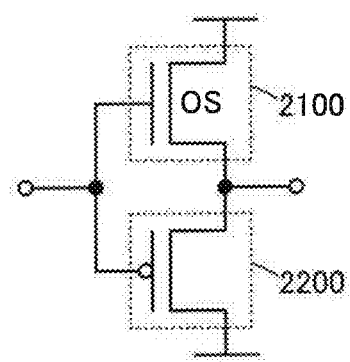
FIG. 36 Circuit diagrams illustrating a semiconductor device according to one embodiment of the present invention.

A circuit diagram in FIG. 36(A) shows a configuration of a so-called CMOS inverter in which a p-channel transistor 2200 and an n-channel transistor 2100 are connected to each other in series and in which gates of them are connected to each other.

<Structure 1 of Semiconductor Device>

Figure 37A:
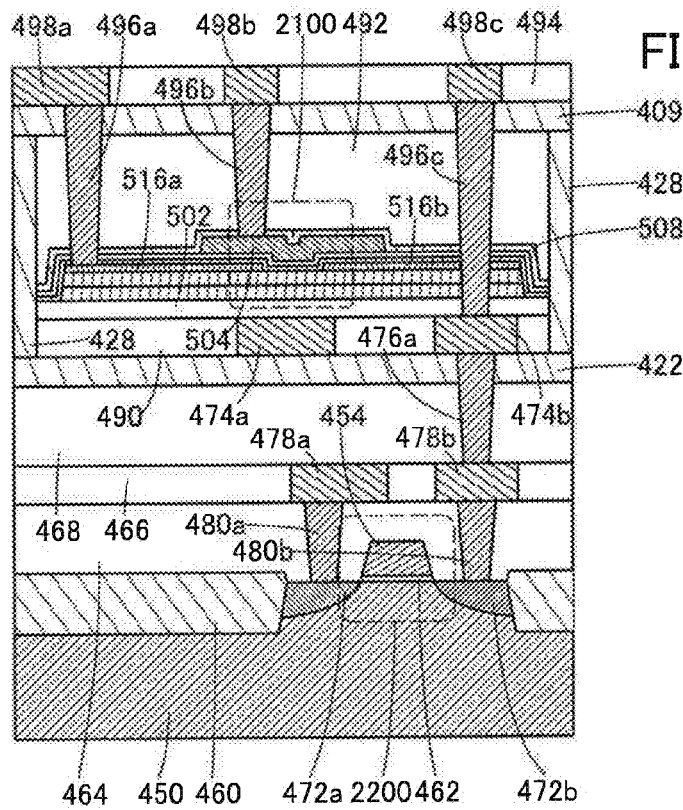
FIG. 37 Cross-sectional views illustrating a semiconductor device according to one embodiment of the present invention.
Figure 37B:
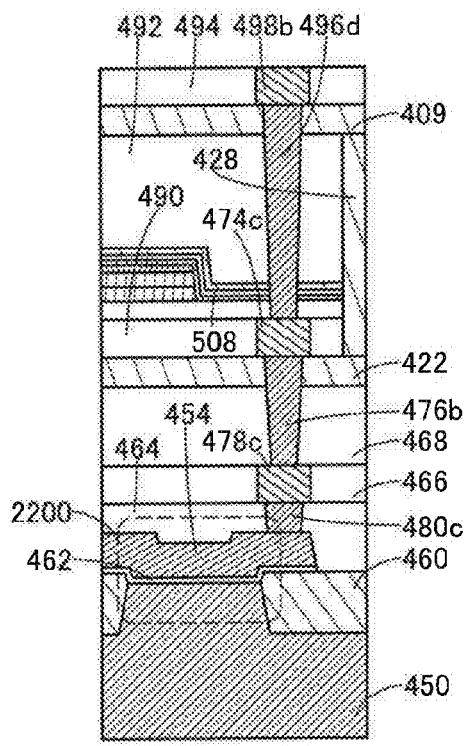
Figure 37C:
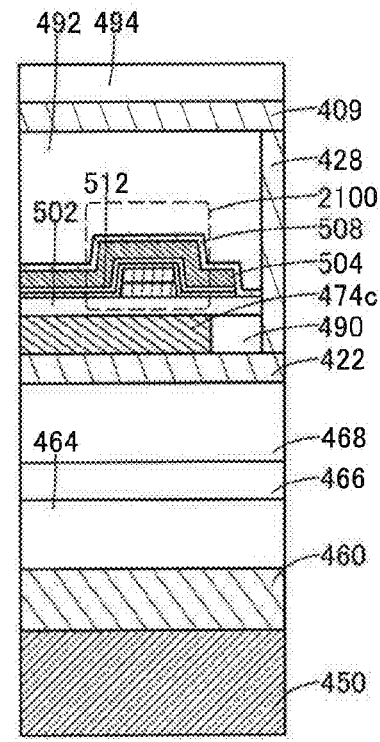

FIG. 37 is a cross-sectional view of the semiconductor device corresponding to FIG. 36(A). The semiconductor device shown in FIG. 37 includes the transistor 2200 and the transistor 2100. The transistor 2100 is provided over the transistor 2200. Although an example where the transistor illustrated in FIG. 33 is used as the transistor 2100 is shown, a semiconductor device according to one embodiment of the present invention is not limited thereto. For example, the transistors illustrated in FIG. 29, FIG. 30, FIG. 31, FIG. 34, FIG. 35, and the like may be used as the transistor 2100. Therefore, the description regarding the above-mentioned transistors is referred to for the transistor 2100 as appropriate. Note that FIG. 37(A), FIG. 37(B), and FIG. 37(C) are cross-sectional views of different portions.

The transistor 2200 shown in FIG. 37 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the region 472a and the region 472b have functions of a source region and a drain region. The insulator 462 has a function of a gate insulator. The conductor 454 has a function of a gate electrode. Therefore, the resistance of a channel formation region can be controlled by a potential applied to the conductor 454. In other words, conduction or non-conduction between the region 472a and the region 472b can be controlled by the potential applied to the conductor 454.

As the semiconductor substrate 450, a single material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity is provided in a region which is to be the transistor 2200. Alternatively, the semiconductor substrate 450 may be an i-type.

A top surface of the semiconductor substrate 450 preferably has a (110) plane. Then, on-state characteristics of the transistor 2200 can be improved.

The region 472a and the region 472b are regions including impurities imparting the p-type conductivity. Accordingly, the transistor 2200 has a structure of a p-channel transistor.

Note that the transistor 2200 is separated from an adjacent transistor by the region 460 and the like. The region 460 is an insulating region.

The semiconductor device shown in FIG. 37 includes an insulator 464, an insulator 466, an insulator 468, an insulator 422, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, the insulator 502, an insulator 492, an insulator 428, an insulator 409, and an insulator 494.

Here, the insulator 422, the insulator 428, and the insulator 409 are insulators having barrier properties. This means that the semiconductor device illustrated in FIG. 37 has a structure in which the transistor 2100 is surrounded by the insulators having barrier properties. Note that one or more of the insulator 422, the insulator 428, and the insulator 409 are not necessarily provided.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In each of the openings, the conductor 480a, the conductor 480b, or the conductor 480c is embedded.

In addition, the insulator 466 includes an opening reaching the conductor 480a, an opening reaching the conductor 480b, and an opening reaching the conductor 480c. In each of the openings, the conductor 478a, the conductor 478b, or the conductor 478c is embedded.

The insulator 468 and the insulator 422 include an opening reaching the conductor 478b and an opening reaching the conductor 478c. In each of the openings, the conductor 476a or the conductor 476b is embedded.

The insulator 490 includes an opening overlapping a channel formation region of the transistor 2100, an opening reaching the conductor 476a, and an opening reaching the conductor 476b. In each of the openings, the conductor 474a, the conductor 474b, or the conductor 474c are embedded.

The conductor 474a may have a function of a gate electrode of the transistor 2100. The electrical characteristics of the transistor 2100, such as the threshold voltage, may be controlled by application of a constant potential to the conductor 474a, for example. Alternatively, the conductor 474a and the conductor 404 having a function of the gate electrode of the transistor 2100 may be electrically connected to each other, for example. Thus, the on-state current of the transistor 2100 can be increased. In addition, a punch-through phenomenon can be suppressed, thus, the electrical characteristics in the saturation region of the transistor 2100 can be stabilized.

The insulator 409 and the insulator 492 include an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In each of the openings, the conductor 496a, the conductor 496b, the conductor 496c, or the conductor 496d is embedded. Note that in some cases, each of the openings is provided through any of components of the transistor 2100 or the like.

In addition, the insulator 494 includes an opening reaching the conductor 496a, an opening reaching the conductor 496b and the conductor 496d, and an opening reaching the conductor 496c. In each of the openings, the conductor 498a, the conductor 498b, or the conductor 498c is embedded.

As the insulator 464, the insulator 466, the insulator 468, the insulator 490, the insulator 492, and the insulator 494, a single layer or a stack of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. As the insulator 401, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

One or more of the insulator 464, the insulator 466, the insulator 468, the insulator 490, the insulator 492, and the insulator 494 preferably include an insulator having a barrier property.

As an insulator with a function of blocking oxygen and impurities such as hydrogen, a single layer or a stack of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used, for example.

As the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c, a single layer or a stack of a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used. One or more of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c preferably include a conductor having a barrier property.

Note that a semiconductor device in FIG. 38 is the same as the semiconductor device in FIG. 37 except the structure of the transistor 2200. Therefore, the description of the semiconductor device in FIG. 37 is referred to for the semiconductor device in FIG. 38. Specifically, in the semiconductor device in FIG. 38, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved. Note that FIG. 38(A), FIG. 38(B), and FIG. 38(C) are cross-sectional views of different portions.

Figure 39A:
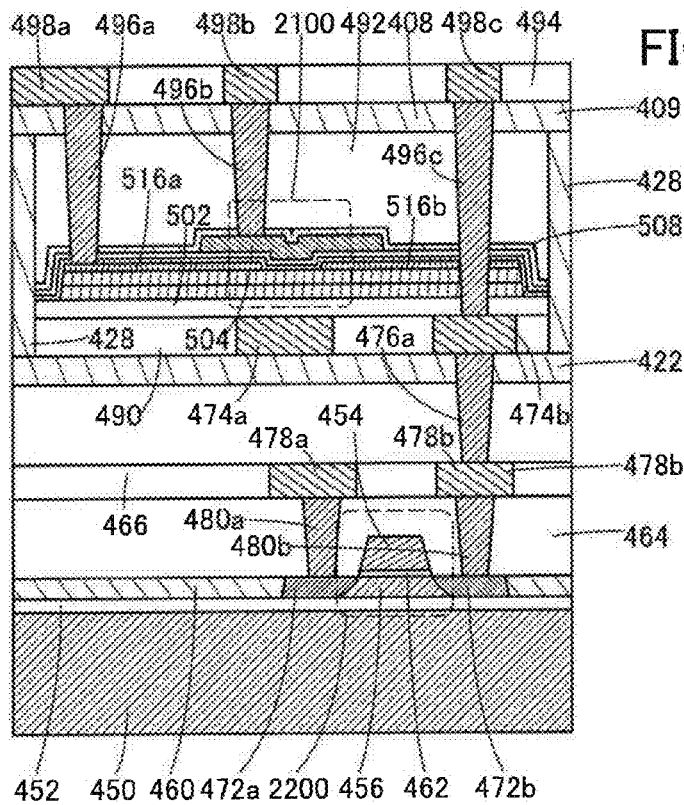
FIG. 39 Cross-sectional views illustrating a semiconductor device according to one embodiment of the present invention.
Figure 39B:
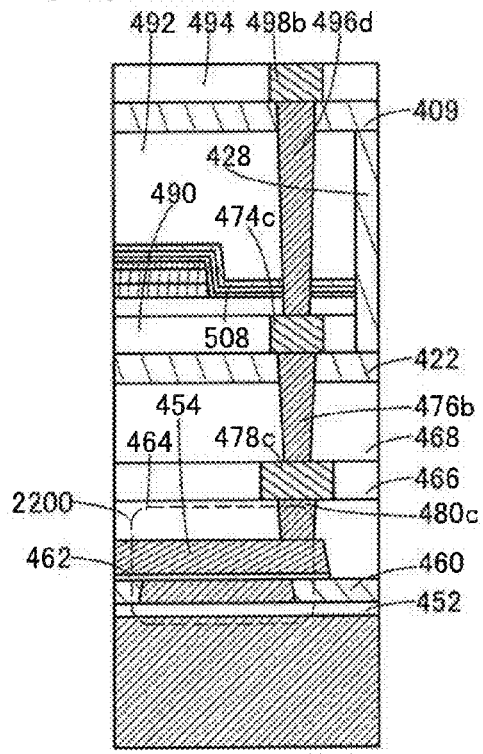
Figure 39C:
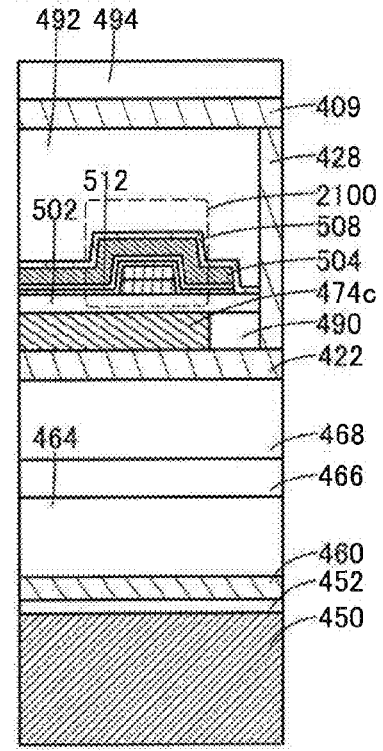

Note that a semiconductor device in FIG. 39 differs from the semiconductor device in FIG. 37 only in the structure of the transistor 2200. Therefore, the description of the semiconductor device in FIG. 37 is referred to for the semiconductor device in FIG. 39. Specifically, in the semiconductor device in FIG. 39, the transistor 2200 is formed using an SOI substrate. In the structure in FIG. 39, a region 456 is apart from the semiconductor substrate 450 with an insulator 452 provided therebetween. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. For example, silicon oxide can be used as the insulator 452. Note that FIG. 39(A), FIG. 39(B), and FIG. 39(C) are cross-sectional views of different portions.

In the semiconductor devices shown in FIG. 37 to FIG. 39, a p-channel transistor is formed utilizing a semiconductor substrate, and an n-channel transistor is formed thereover; therefore, an occupation area of the element can be reduced. That is, the integration degree of the semiconductor device can be improved. In addition, the process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps for LDD (Lightly Doped Drain) regions, a shallow trench structure, distortion design, and the like can be omitted in some cases. Therefore, the productivity and yield of the semiconductor device can be increased in some cases, compared to that in which an n-channel transistor is formed utilizing the semiconductor substrate.

<CMOS Analog Switch>

Figure 36B:
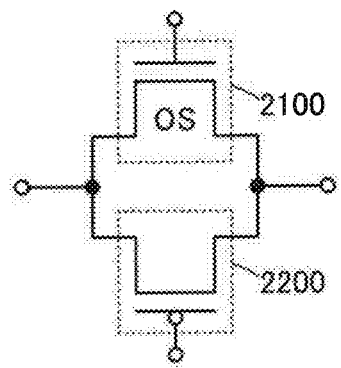

A circuit diagram in FIG. 36(B) shows a configuration in which sources of the transistors 2100 and 2200 are connected to each other and drains thereof are connected to each other. With such a configuration, the transistors can function as a so-called CMOS analog switch.

<Memory Device 1>

An example of a semiconductor device (memory device) which uses the transistor according to one embodiment of the present invention, which can retain stored data even when not supplied with power, and which has an unlimited number of write cycles is shown in FIG. 40.

Figure 40A:
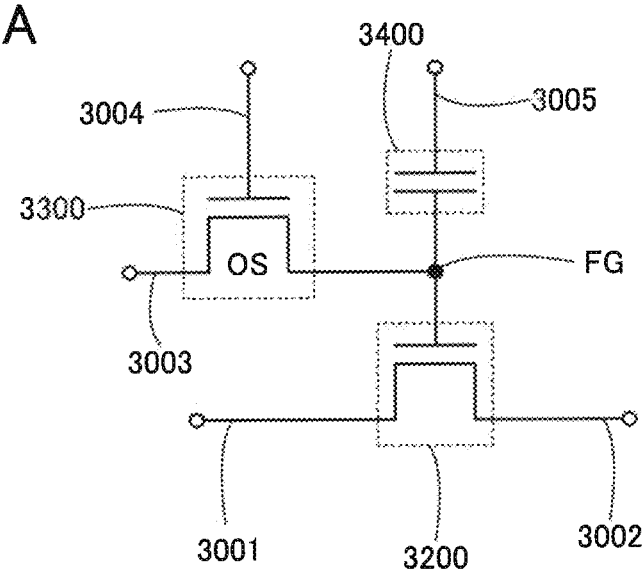
FIG. 40 Circuit diagrams illustrating a memory device according to one embodiment of the present invention.

The semiconductor device illustrated in FIG. 40(A) includes a transistor 3200 using a first semiconductor material, a transistor 3300 using a second semiconductor material, and a capacitor 3400. Note that the above-described transistors can be used as the transistor 3300.

The transistor 3300 is preferably a transistor with low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be low because refresh operation becomes unnecessary or the frequency of refresh operation can be extremely low.

In FIG. 40(A), a first wiring 3001 is electrically connected to a source of the transistor 3200, and a second wiring 3002 is electrically connected to a drain of the transistor 3200. A third wiring 3003 is electrically connected to one of a source and a drain of the transistor 3300, and a fourth wiring 3004 is electrically connected to a gate of the transistor 3300. A gate of the transistor 3200 and the other of the source and the drain of the transistor 3300 are electrically connected to one electrode of the capacitor 3400, and a fifth wiring 3005 is electrically connected to the other electrode of the capacitor 3400.

The semiconductor device in FIG. 40(A) has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to "turn on" the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is "turned on". On the other hand, in the case where the low-level charge is supplied to the node FG in writing, even when the potential of the fifth wiring 3005 is $V_0$ ($<V_{th\_L}$), the transistor 3200 remains "off". Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is "turned off" regardless of the charge supplied to the node FG, that is, a potential lower than $V_{th\_H}$. Alternatively, the fifth wiring 3005 may be supplied with a potential at which the transistor 3200 is "turned on" regardless of the charge supplied to the node FG, that is, a potential higher than $V_{th\_L}$.

<Structure 2 of Semiconductor Device>

Figure 41A:
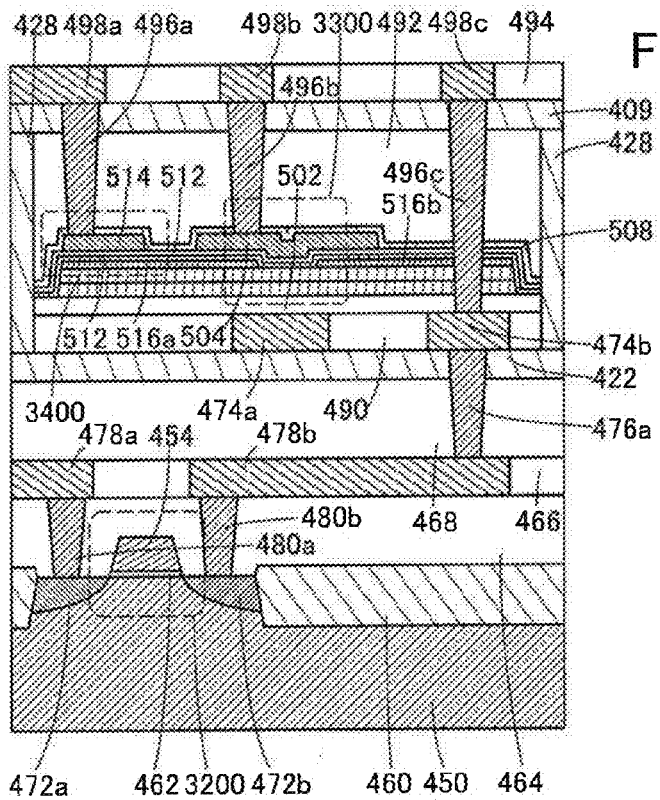
FIG. 41 Cross-sectional views illustrating a semiconductor device according to one embodiment of the present invention.
Figure 41B:
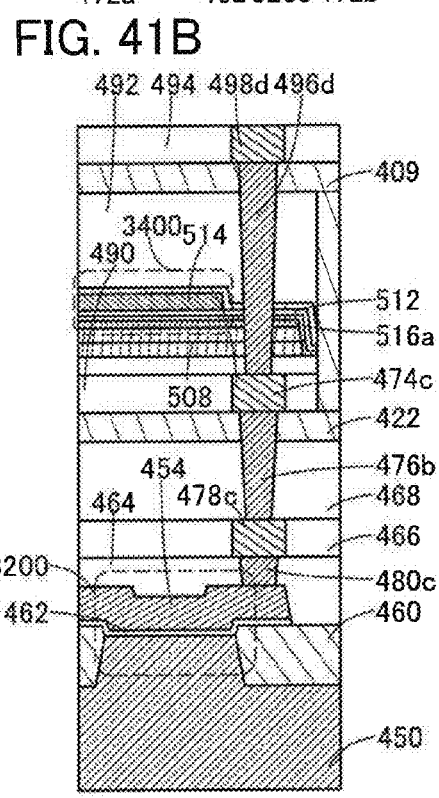
Figure 41C:
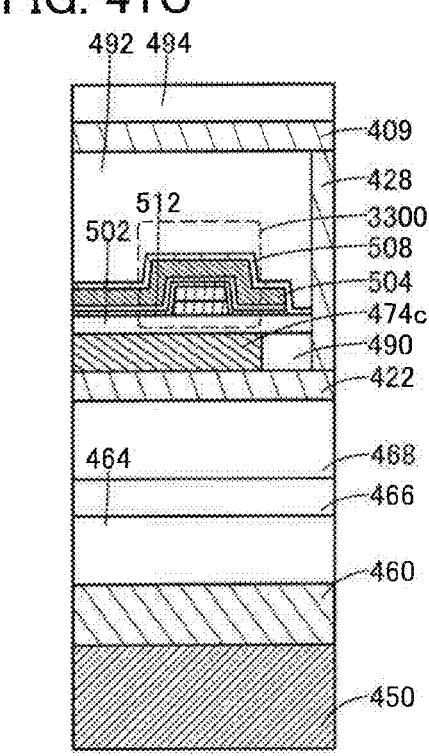

FIG. 41 is cross-sectional views of the semiconductor device corresponding to FIG. 40(A). The semiconductor device shown in FIG. 41 includes the transistor 3200, the transistor 3300, and the capacitor 3400. The transistor 3300 and the capacitor 3400 are provided over the transistor 3200. The description of the transistor 2100 is referred to for the transistor 3300. Furthermore, for the transistor 3200, the description of the transistor 2200 in FIG. 37 is referred to. Note that although the transistor 2200 is illustrated as a p-channel transistor in FIG. 37, the transistor 3200 may be an n-channel transistor. Note that FIG. 41(A), FIG. 41(B), and FIG. 41(C) are cross-sectional views of different portions.

The transistor 3200 illustrated in FIG. 41 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 41 includes the insulator 464, the insulator 466, the insulator 468, the insulator 422, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 490, the insulator 502, the insulator 492, the insulator 428, the insulator 409, and the insulator 494.

Here, the insulator 422, the insulator 428, and the insulator 409 are insulators which have barrier properties. This means that the semiconductor device illustrated in FIG. 41 has a structure in which the transistor 3300 is surrounded by the insulators having barrier properties. Note that one or more of the insulator 422, the insulator 428, and the insulator 409 are not necessarily provided.

The insulator 464 is placed over the transistor 3200. The insulator 466 is placed over the insulator 464. The insulator 468 is placed over the insulator 466. The insulator 422 is provided over the insulator 468. The insulator 490 is provided over the insulator 422. The transistor 3300 is provided over the insulator 490. The insulator 492 is provided over the transistor 3300. The insulator 494 is placed over the insulator 492.

The insulator 464 includes an opening reaching the region 472a, an opening reaching the region 472b, and an opening reaching the conductor 454. In each of the openings, the conductor 480a, the conductor 480b, or the conductor 480c is embedded.

In addition, the insulator 466 includes an opening reaching the conductor 480a, an opening reaching the conductor 480b, and an opening reaching the conductor 480c. In each of the openings, the conductor 478a, the conductor 478b, or the conductor 478c is embedded.

The insulator 468 and the insulator 422 include an opening reaching the conductor 478b and an opening reaching the conductor 478c. In each of the openings, the conductor 476a or the conductor 476b is embedded.

The insulator 490 includes an opening overlapping the channel formation region of the transistor 3300, an opening reaching the conductor 476a, and an opening reaching the conductor 476b. In each of the openings, the conductor 474a, the conductor 474b, or the conductor 474c is embedded.

The conductor 474a may have a function of a bottom gate electrode of the transistor 3300. The electric characteristics of the transistor 3300, such as the threshold voltage, may be controlled by application of a constant potential to the conductor 474a, for example. Alternatively, the conductor 474a and the conductor 404 that is the top gate electrode of the transistor 3300 may be electrically connected to each other, for example. Thus, the on-state current of the transistor 3300 can be increased. In addition, a punch-through phenomenon can be suppressed; thus, the electrical characteristics in the saturation region of the transistor 3300 can be stabilized.

The insulator 409 and the insulator 492 include an opening reaching the conductor 474b through the conductor 516b that is one of a source electrode and a drain electrode of the transistor 3300, an opening reaching a conductor 514 that overlaps with the conductor 516a that is the other of the source electrode and the drain electrode of the transistor 3300, with the insulator 512 positioned therebetween, an opening reaching the conductor 504 that is the gate electrode of the transistor 3300, and an opening reaching the conductor 474c through the conductor 516a that is the other of the source electrode and the drain electrode of the transistor 3300. In each of the openings, the conductor 496a, the conductor 496b, the conductor 496c, or the conductor 496d is embedded. Note that in some cases, each of the openings is provided through any of components of the transistor 3300 or the like.

In addition, the insulator 494 includes an opening reaching the conductor 496a, an opening reaching the conductor 496b, an opening reaching the conductor 496c, and an opening reaching the conductor 496d. In each of the openings, the conductor 498a, the conductor 498b, the conductor 498c, or the conductor 498d is embedded.

At least one of the insulators 464, 466, 468, 490, 492, and 494 preferably includes an insulator having a barrier property.

As the conductor 498d, a single layer or a stack of a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used. The conductor 498d preferably includes a conductor having a barrier property.

The source or drain of the transistor 3200 is electrically connected to the conductor 516b that is one of the source electrode and the drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 514, and the insulator 512. Because the insulator 512 can be formed by the same step as the insulator 512 that functions as a gate insulator of the transistor 3300, productivity can be increased. When a layer formed by the same step as the conductor 504 that functions as a gate electrode of the transistor 3300 is used as the conductor 514, productivity can be increased.

For other structures, the description of FIG. 37 and the like can be referred to as appropriate.

Figure 42A:
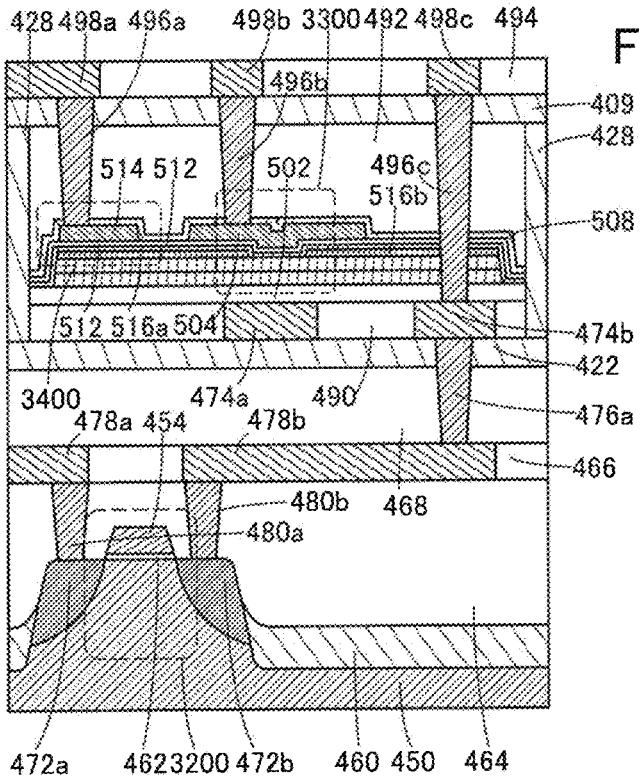
FIG. 42 Cross-sectional views illustrating a semiconductor device according to one embodiment of the present invention.
Figure 42B:
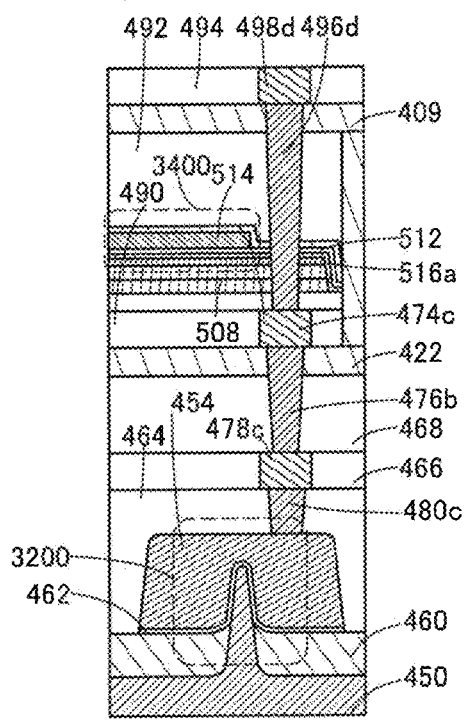
Figure 42C:
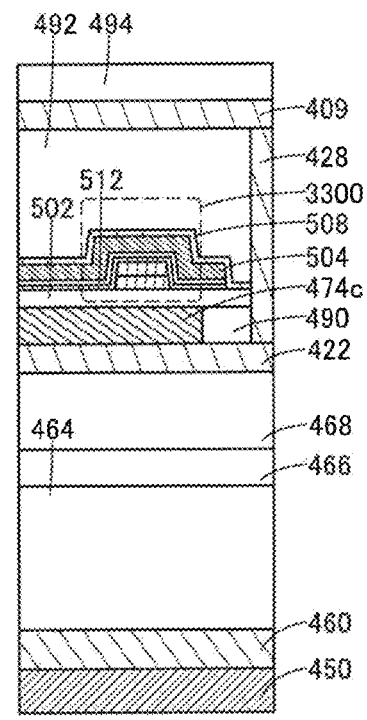

A semiconductor device in FIG. 42 differs from the semiconductor device in FIG. 41 only in the structure of the transistor 3200. Therefore, the description of the semiconductor device in FIG. 41 is referred to for the semiconductor device in FIG. 42. Specifically, in the semiconductor devices in FIG. 42, the transistor 3200 is a Fin-type transistor. For the Fin-type transistor 3200, the description of the transistor 2200 in FIG. 38 is referred to. Note that although the transistor 2200 is illustrated as a p-channel transistor in FIG. 38, the transistor 3200 may be an n-channel transistor. Note that FIG. 42(A), FIG. 42(B), and FIG. 42(C) are cross-sectional views of different portions.

Figure 43A:
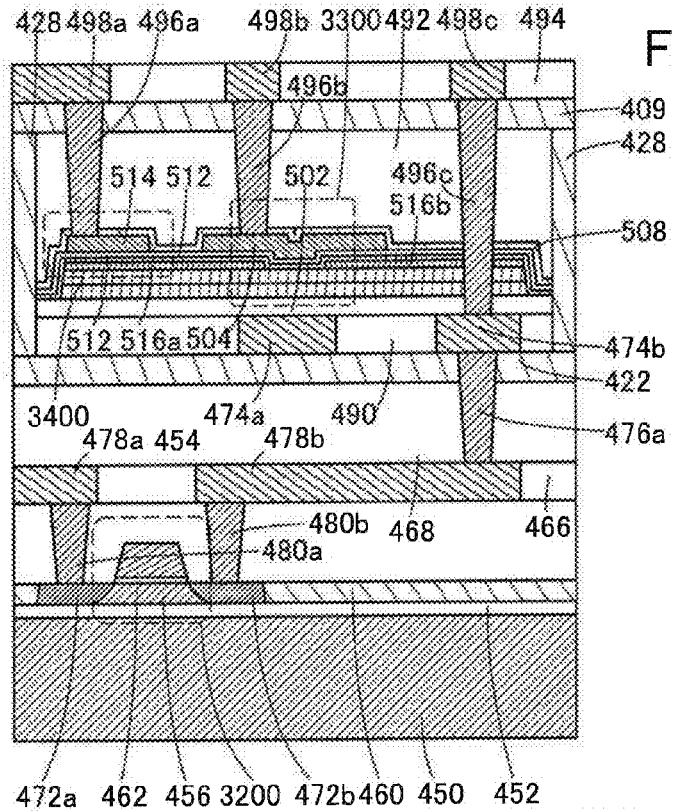
FIG. 43 Cross-sectional views illustrating a semiconductor device according to one embodiment of the present invention.
Figure 43B:
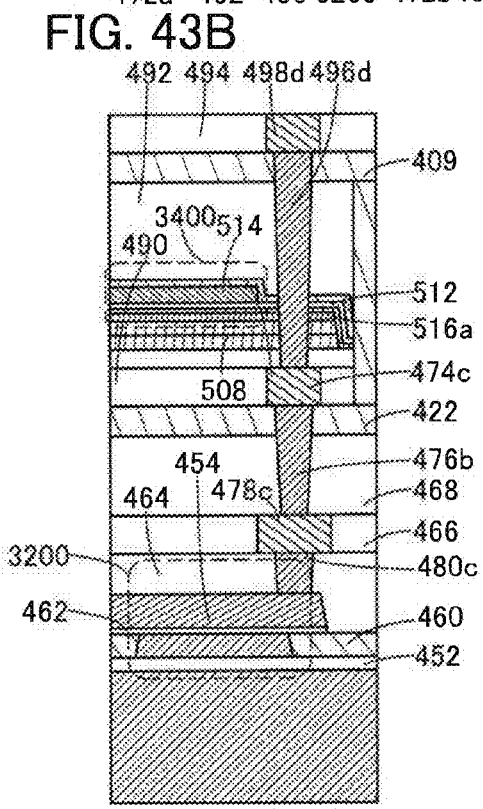
Figure 43C:
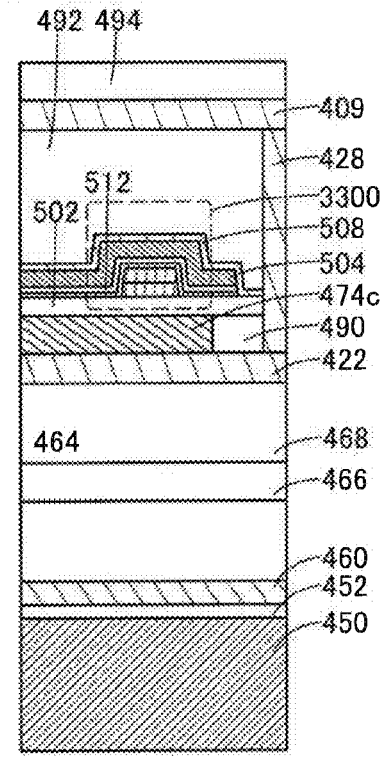

A semiconductor device in FIG. 43 differs from the semiconductor device in FIG. 41 only in the structure of the transistor 3200. Therefore, the description of the semiconductor device in FIG. 41 is referred to for the semiconductor device in FIG. 43. Specifically, in the semiconductor device in FIG. 43, the transistor 3200 is provided on the semiconductor substrate 450 that is an SOI substrate. For the transistor 3200, which is provided on the semiconductor substrate 450 that is an SOI substrate, the description of the transistor 2200 in FIG. 39 is referred to. Note that although the transistor 2200 is illustrated as a p-channel transistor in FIG. 39, the transistor 3200 may be an n-channel transistor. Note that FIG. 43(A), FIG. 43(B), and FIG. 43(C) are cross-sectional views of different portions.

<Memory Device 2>

Figure 40B:
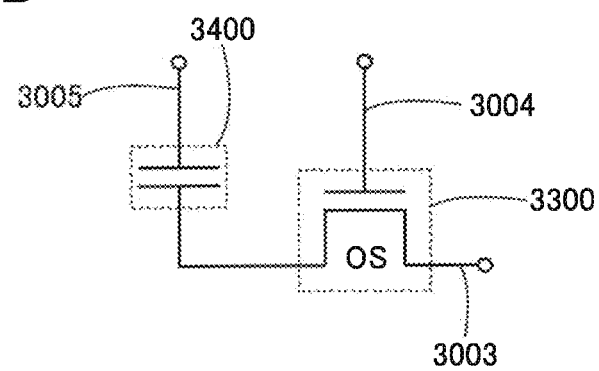

The semiconductor device in FIG. 40(B) differs from the semiconductor device in FIG. 40(A) in that the transistor 3200 is not provided. Also in this case, writing and retaining operations of data can be performed similarly to the operations of the semiconductor device in FIG. 40(A).

Reading of data in the semiconductor device in FIG. 40(B) is described. When the transistor 3300 is turned on, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400. C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be provided as the transistor 3300 to be stacked over the driver circuit.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device according to one embodiment of the present invention does not have a limit on the number of times data can be rewritten, and the reliability thereof is drastically improved. Furthermore, data is written depending on the on or off state of the transistor, whereby high-speed operation can be easily achieved.

<Imaging Device>

An imaging device of one embodiment of the present invention is described below.

Figure 44A:
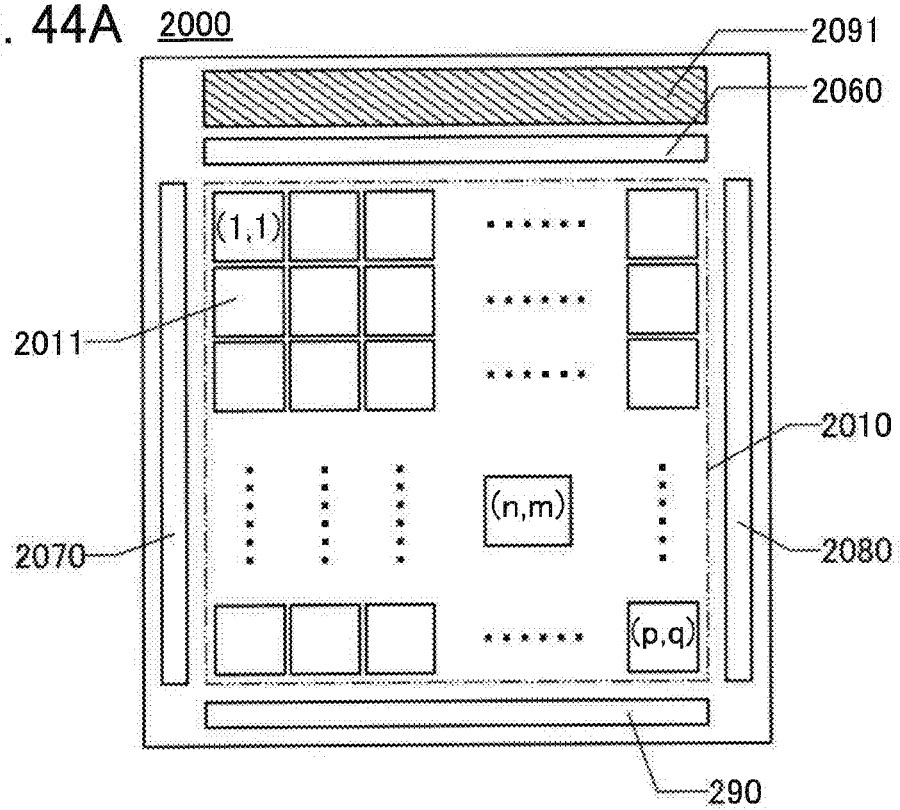
FIG. 44 Top views illustrating a semiconductor device according to one embodiment of the present invention.

FIG. 44(A) is a plan view illustrating an example of an imaging device 2000 according to one embodiment of the present invention. The imaging device 2000 includes a pixel portion 2010 and a peripheral circuit 2060, a peripheral circuit 2070, a peripheral circuit 2080, and a peripheral circuit 2090 which are for driving the pixel portion 2010. The pixel portion 2010 includes a plurality of pixels 2011 arranged in a matrix with p rows and q columns (p and q are each an integer of 2 or more). The peripheral circuit 2060, the peripheral circuit 2070, the peripheral circuit 2080, and the peripheral circuit 2090 are each connected to the plurality of pixels 2011, and have a function of supplying signals for driving the plurality of pixels 2011. In this specification and the like, in some cases, a "peripheral circuit" or a "driver circuit" indicate all of the peripheral circuit 2060, the peripheral circuit 2070, peripheral circuit 2080, the peripheral circuit 2090, and the like. For example, the peripheral circuit 2060 can be regarded as part of the peripheral circuit.

The imaging device 2000 preferably includes a light source 2091. The light source 2091 can emit detection light P1.

The peripheral circuit includes at least one of a logic circuit, a switch, a buffer, an amplifier circuit, and a converter circuit. The peripheral circuit may be formed over a substrate where the pixel portion 2010 is formed. Part or the whole of the peripheral circuit may be mounted using a semiconductor device such as an IC. Note that as the peripheral circuit, one or more of the peripheral circuit 2060, the peripheral circuit 2070, the peripheral circuit 2080, and the peripheral circuit 2090 may be omitted.

Figure 44B:
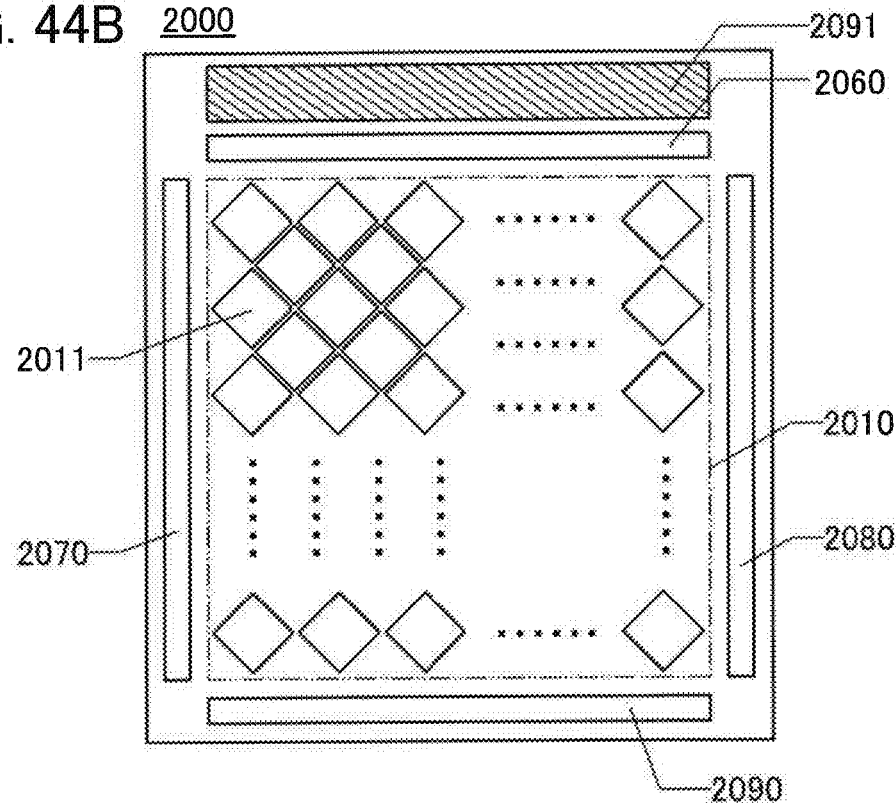

As illustrated in FIG. 44(B), the pixels 2011 may be obliquely arranged in the pixel portion 2010 included in the imaging device 2000. When the pixels 2011 are obliquely arranged, the distance between pixels (pitch) can be shortened in the row direction and the column direction. Accordingly, the quality of an image taken with the imaging device 2000 can be improved.

Configuration Example 1 of Pixel

One pixel 2011 included in the imaging device 2000 is formed with a plurality of subpixels 2012, and each subpixel 2012 is combined with a filter (color filter) which transmits light in a specific wavelength range, whereby data for achieving color image display can be obtained.

Figure 45A:
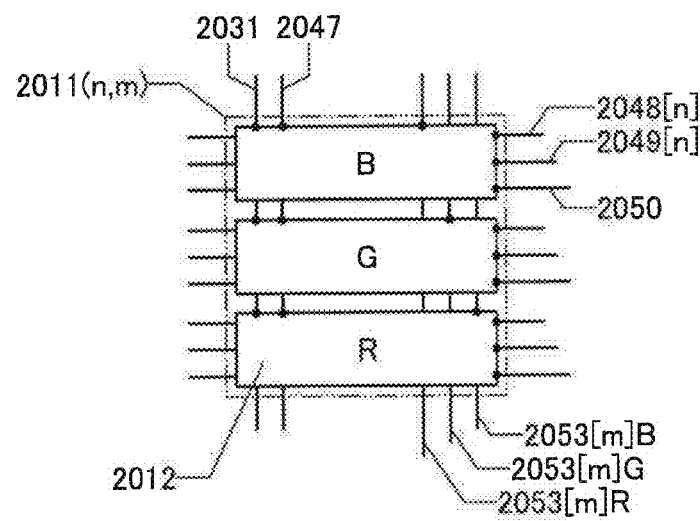
FIG. 45 Block diagrams illustrating a semiconductor device according to one embodiment of the present invention.

FIG. 45(A) is a plan view illustrating an example of the pixel 2011 with which a color image is obtained. The pixel 2011 illustrated in FIG. 45(A) includes a subpixel 2012 provided with a color filter transmitting light with the red (R) wavelength range (hereinafter also referred to as a "subpixel 2012R"), a subpixel 2012 provided with a color filter transmitting light with the green (G) wavelength range (hereinafter also referred to as a "subpixel 2012G"), and a subpixel 2012 provided with a color filter transmitting light with the blue (B) wavelength range (hereinafter also referred to as a "subpixel 2012B"). The subpixel 2012 can function as a photosensor.

The subpixel 2012 (the subpixel 2012R, the subpixel 2012G, and the subpixel 2012B) is electrically connected to a wiring 2031, a wiring 2047, a wiring 2048, a wiring 2049, and a wiring 2050. In addition, the subpixel 2012R, the subpixel 2012G, and the subpixel 2012B are connected to respective wirings 2053 which are independently provided. In this specification and the like, for example, the wiring 2048 and the wiring 2049 that are connected to the pixel 2011 in the n-th row are referred to as a wiring 2048[n] and a wiring 2049[n]. For example, the wiring 2053 connected to the pixel 2011 in the m-th column is referred to as a wiring 2053[m]. Note that in FIG. 45(A), the wiring 2053 connected to the subpixel 2012R, the wiring 2053 connected to the subpixel 2012G, and the wiring 2053 connected to the subpixel 2012B in the pixel 2011 in the mth column are referred to as a wiring 2053[m]R, a wiring 2053[m]G, and a wiring 2053[m]B. The subpixels 2012 are electrically connected to the peripheral circuit through the above wirings.

Figure 45B:
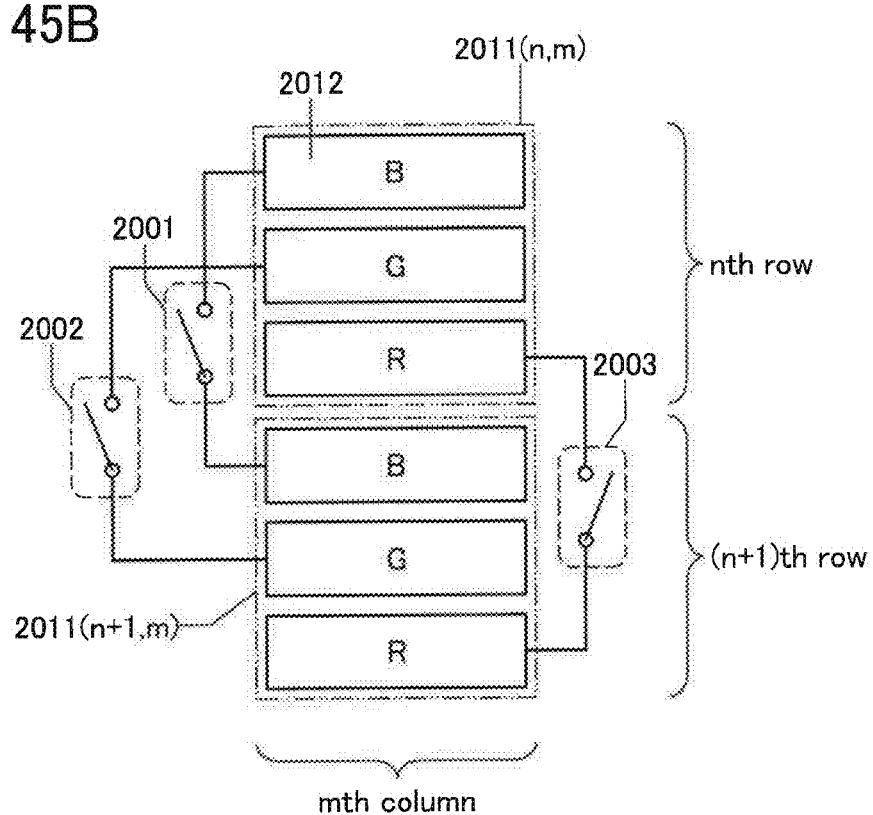

The imaging device 2000 has a configuration in which the subpixels which are provided with color filters transmitting light in the same wavelength range in adjacent pixels 2011 are electrically connected to each other via a switch. FIG. 45(B) shows a connection example in which the subpixel 2012 in the pixel 2011 arranged in an nth row (n is an integer greater than or equal to 1 and less than or equal to p) and an mth column (m is an integer greater than or equal to 1 and less than or equal to q) and the subpixel 2012 which is adjacent to the pixel 2011 and arranged in an (n+1)th row and the mth column. In FIG. 45(B), the subpixel 2012R arranged in the nth row and the mth column and the subpixel 2012R arranged in the (n+1)th row and the mth column are connected to each other via a switch 2001. The subpixel 2012G arranged in the nth row and the mth column and the subpixel 2012G arranged in the (n+1)th row and the mth column are connected to each other via a switch 2002. The subpixel 2012B arranged in the nth row and the mth column and the subpixel 2012B arranged in the (n+1)th row and the mth column are connected to each other via a switch 2003.

The color filter used in the subpixel 2012 is not limited to red (R), green (G), and blue (B), and color filters that transmit light of cyan (C), yellow (Y), and magenta (M) may be used. By provision of the subpixels 2012 that sense light in three different wavelength ranges in one pixel 2011, a full-color image can be obtained.

The pixel 2011 including the subpixel 2012 provided with a color filter transmitting yellow (Y) light may be provided, in addition to the subpixels 2012 provided with the color filters transmitting red (R), green (G), and blue (B) light. The pixel 2011 including the subpixel 2012 provided with a color filter transmitting blue (B) light may be provided, in addition to the subpixels 2012 provided with the color filters transmitting cyan (C), yellow (Y), and magenta (M) light. When the subpixels 2012 sensing light in four different wavelength ranges are provided in one pixel 2011, the reproducibility of colors of an obtained image can be increased.

For example, in FIG. 45(A), the pixel number ratio (or the light receiving area ratio) of the subpixel 2012 sensing the red wavelength range, the subpixel 2012 sensing the green wavelength range, and the subpixel 2012 sensing the blue wavelength range is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) may be red:green:blue of 1:6:1.

Although the number of subpixels 2012 provided in the pixel 2011 may be one, it is preferably two or more. For example, when two or more subpixels 2012 sensing the same wavelength range are provided, the redundancy is increased, and the reliability of the imaging device 2000 can be increased.

When an infrared (IR) filter that transmits infrared light and absorbs or reflects visible light is used as the filter, the imaging device 2000 that senses infrared light can be achieved.

Furthermore, when an ND (Neutral Density) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Figure 46A:
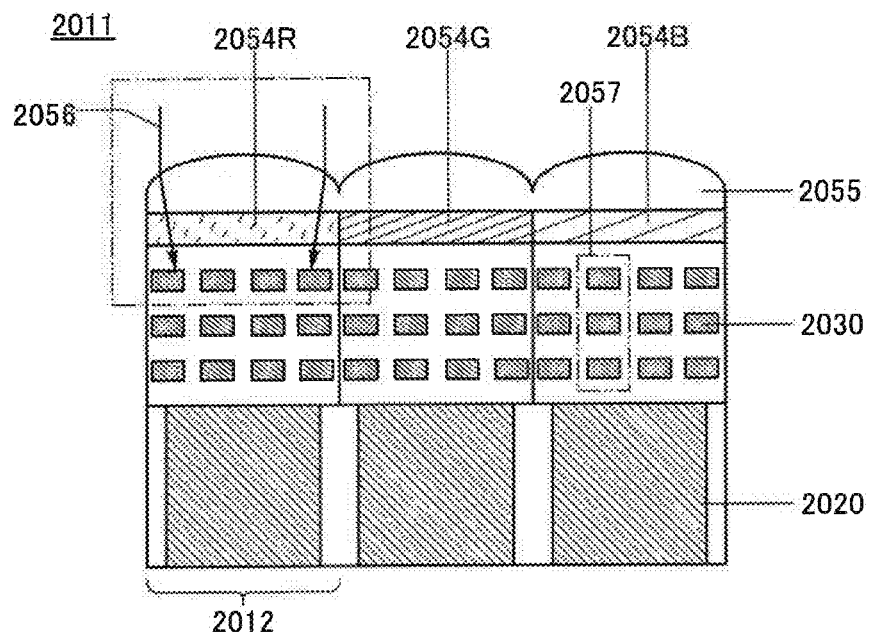
FIG. 46 Cross-sectional views illustrating a semiconductor device according to one embodiment of the present invention.

Besides the above-described filter, the pixel 2011 may be provided with a lens. An arrangement example of the pixel 2011, a filter 2054, and a lens 2055 is described with cross-sectional views in FIG. 46. With the lens 2055, the photoelectric conversion element can receive incident light efficiently. Specifically, as illustrated in FIG. 46(A), light 2056 enters a photoelectric conversion element 2020 through the lens 2055, the filter 2054 (a filter 2054R, a filter 2054G, and a filter 2054B), a pixel circuit 2030, and the like which are provided in the pixel 2011.

Figure 46B:
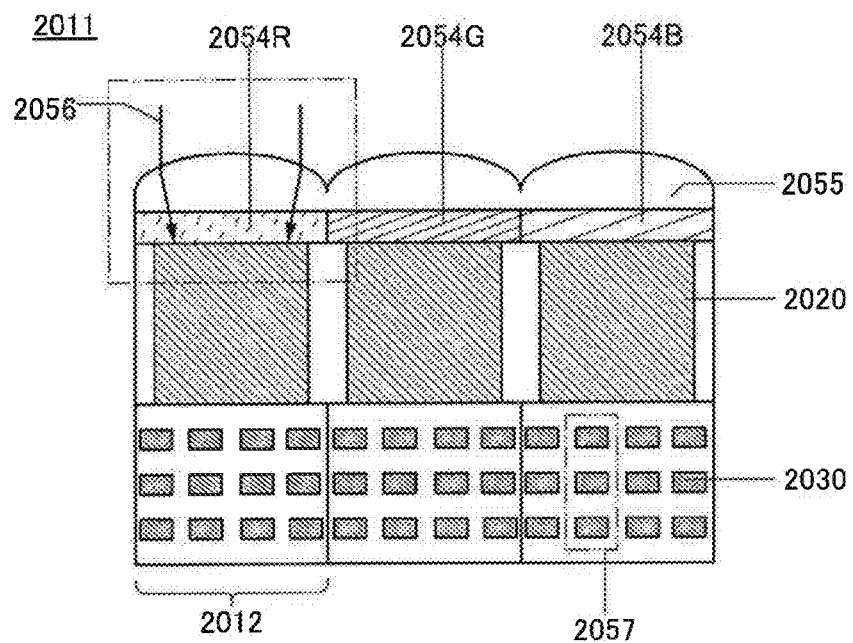

However, as illustrated in a region surrounded by a dashed-dotted line, part of the light 2056 indicated by arrows might be blocked by part of a wiring 2057. Thus, a preferable structure is that the lens 2055 and the filter 2054 are provided on the photoelectric conversion element 2020 side, so that the photoelectric conversion element 2020 can efficiently receive the light 2056 as illustrated in FIG. 46(B). When the light 2056 enters the photoelectric conversion element 2020 from the photoelectric conversion element 2020 side, the imaging device 2000 with high sensitivity can be provided.

As the photoelectric conversion element 2020 illustrated in FIG. 46, a photoelectric conversion element in which a pn junction or a pin junction is formed may be used.

The photoelectric conversion element 2020 may be formed using a substance that has a function of absorbing a radiation and generating electric charges. Examples of the substance that has a function of absorbing a radiation and generating electric charge include selenium, lead iodide, mercury iodide, gallium arsenide, cadmium telluride, and a cadmium-zinc alloy.

For example, when selenium is used for the photoelectric conversion element 2020, the photoelectric conversion element 2020 can have a light absorption coefficient in a wide wavelength band, such as visible light, ultraviolet light, infrared light, X-rays, and gamma rays.

One pixel 2011 included in the imaging device 2000 may include the subpixel 2012 with a first filter in addition to the subpixel 2012 illustrated in FIG. 45.

Configuration Example 2 of Pixel

An example of a pixel which is formed using a transistor using silicon and a transistor using an oxide semiconductor is described below.

Figure 47A:
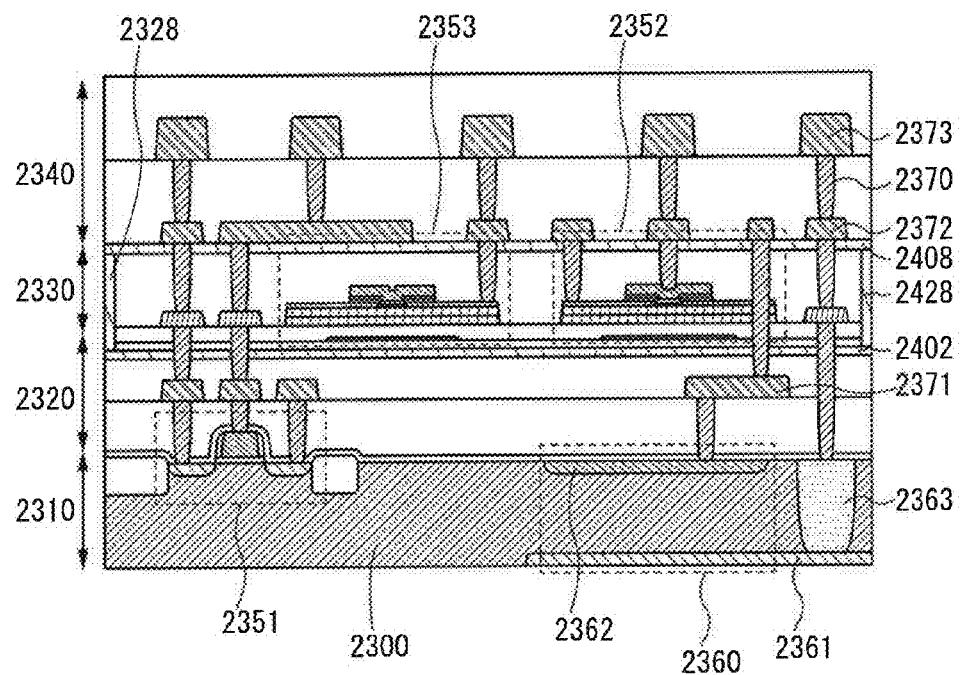
FIG. 47 Cross-sectional views illustrating a semiconductor device according to one embodiment of the present invention.
Figure 47B:
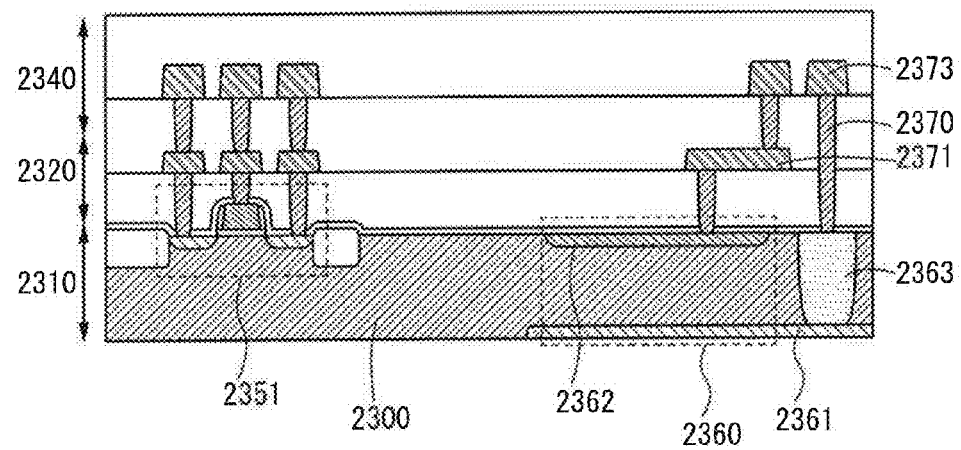

FIG. 47(A) and FIG. 47(B) are cross-sectional views of element included in imaging devices. The imaging device illustrated in FIG. 47(A) includes a transistor 2351 which uses silicon and is provided on a silicon substrate 2300, a transistor 2352 and a transistor 2353 which use an oxide semiconductor and are provided to be stacked over the transistor 2351, and a photodiode 2360 provided in a silicon substrate 2300. The transistors and the photodiode 2360 have electrical connection with various plugs 2370 and wirings 2371. In addition, the photodiode 2360 includes an anode 2361 and a cathode 2362, and the anode 2361 has electrical connection with the plug 2370 through a low-resistance region 2363.

The imaging device includes a layer 2310 including the transistor 2351 and the photodiode 2360 that are provided on and in the silicon substrate 2300, a layer 2320 which is provided in contact with the layer 2310 and includes the wirings 2371, a layer 2330 which is provided in contact with the layer 2320 and includes the transistor 2352 and the transistor 2353, and a layer 2340 which is provided in contact with the layer 2330 and includes a wiring 2372 and a wiring 2373.

In the example of cross-sectional view in FIG. 47(A), a light-receiving surface of the photodiode 2360 is provided on the side opposite to a surface of the silicon substrate 2300 where the transistor 2351 is formed. With this structure, a light path can be secured without being influenced by the various transistors and wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may be a layer which includes the transistor including an oxide semiconductor. Alternatively, the layer 2310 may be omitted, and the pixel may be formed only with the transistors including an oxide semiconductor.

In the case where a pixel is formed with use of only transistors including silicon, the layer 2330 may be omitted. An example of a cross-sectional view in which the layer 2330 is omitted is illustrated in FIG. 47(B). In the case where the layer 2330 is omitted, the wiring 2372 of the layer 2340 can be omitted.

Note that the silicon substrate 2300 may be an SOI substrate. Furthermore, the silicon substrate 2300 can be replaced with a substrate including germanium, silicon germanium, silicon carbide, gallium arsenide, aluminum gallium arsenide, indium phosphide, gallium nitride, or an organic semiconductor.

Here, an insulator 2422 is provided between the layer 2310 including the transistor 2351 and the photodiode 2360 and the layer 2330 including the transistor 2352 and the transistor 2353. However, there is no limitation on the position of the insulator 2422.

Hydrogen in an insulator provided in the vicinity of a channel formation region of the transistor 2351 has a function of improving the reliability of the transistor 2351 by terminating dangling bonds of silicon. In contrast, hydrogen in the insulator provided in the vicinity of the transistor 2352, the transistor 2353, and the like becomes one of factors generating a carrier in the oxide semiconductor. Thus, the hydrogen may cause a reduction in the reliability of the transistor 2352, the transistor 2353, and the like. For this reason, in the case where the transistor using an oxide semiconductor is provided to be stacked over the transistor using silicon, it is preferable that the insulator 2422 having a barrier property be provided between them. The transistor 2352 and the transistor 2353 are preferably surrounded on all four sides by an insulator 2328 and an insulator 2428 having barrier properties. In addition, an insulator 2409 having a barrier property preferably covers the transistor 2352 and the transistor 2353. When the hydrogen is confined below the insulator 2422, the reliability of the transistor 2351 can be improved. In addition, the hydrogen can be prevented from being diffused from a part below the insulator 2422 to a part above the insulator 2422; thus, the reliability of the transistor 2352, the transistor 2353, and the like can be improved.

In other words, the semiconductor device illustrated in FIG. 47 has a structure in which the transistor 2352 and the transistor 2353 are surrounded by the insulators having barrier properties. Note that the transistor 2352 and the transistor 2353 are not necessarily surrounded by the insulators having barrier properties.

In the cross-sectional view in FIG. 47(A), the photodiode 2360 provided in the layer 2310 and the transistor provided in the layer 2330 can be formed so as to overlap with each other. Thus, the degree of integration of pixels can be increased. In other words, the resolution of the imaging device can be increased.

Figure 48A:
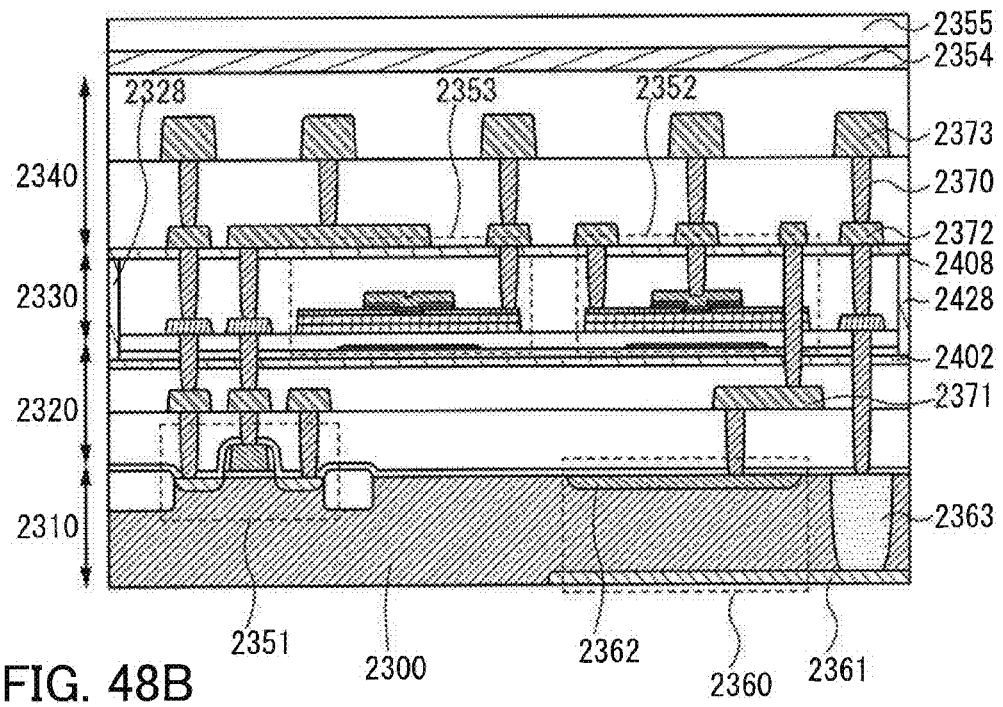
FIG. 48 Cross-sectional views illustrating a semiconductor device according to one embodiment of the present invention.
Figure 48B:
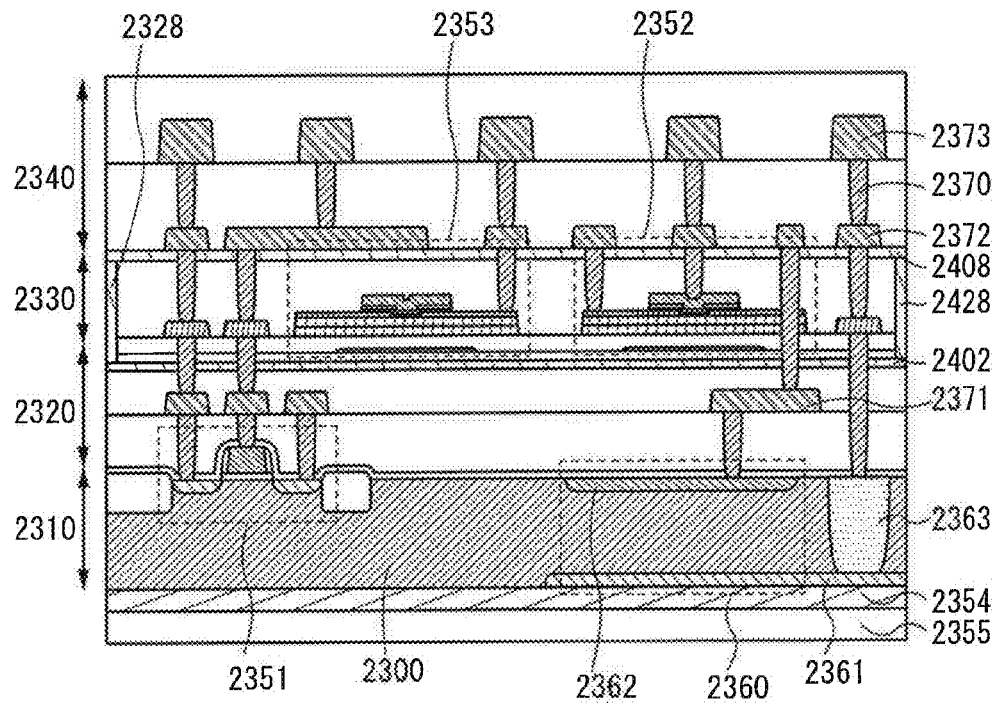

Note that a filter 2354 and/or a lens 2355 may be provided over or under the pixel as illustrated in FIG. 48(A) and FIG. 48(B). For the filter 2354, refer to the description of the filter 2054. For the lens 2355, refer to for the description of the lens 2055.

As illustrated in FIG. 49(A1) and FIG. 49(B1), part or the whole of the imaging device can be bent. FIG. 49(A1) illustrates a state in which the imaging device is bent in the direction of a dashed-dotted line X1-X2. FIG. 49(A2) is a cross-sectional view illustrating a portion indicated by the dashed-dotted line X1-X2 in FIG. 49(A1). FIG. 49(A3) is a cross-sectional view illustrating a portion indicated by a dashed-dotted line Y1-Y2 in FIG. 49(A1).

FIG. 49(B1) illustrates a state where the imaging device is bent in the direction of a dashed-dotted line X3-X4 and the direction of a dashed-dotted line Y3-Y4. FIG. 49(B2) is a cross-sectional view illustrating a portion indicated by the dashed-dotted line X3-X4 in FIG. 49(B1). FIG. 49(B3) is a cross-sectional view illustrating a portion indicated by the dashed-dotted line Y3-Y4 in FIG. 49(B1).

Bending the imaging device enables the curvature of field and astigmatism to be reduced. Thus, the optical design of lens and the like, which is used in combination with the imaging device, can be facilitated. For example, the number of lens used for aberration correction can be reduced; accordingly, a reduction in the size or weight of electronic devices using the imaging device, and the like, can be achieved. In addition, the quality of a captured image can be improved.

<CPU>

A CPU including a semiconductor device such as the above-described transistor or the above-described memory device is described below.

Figure 50:
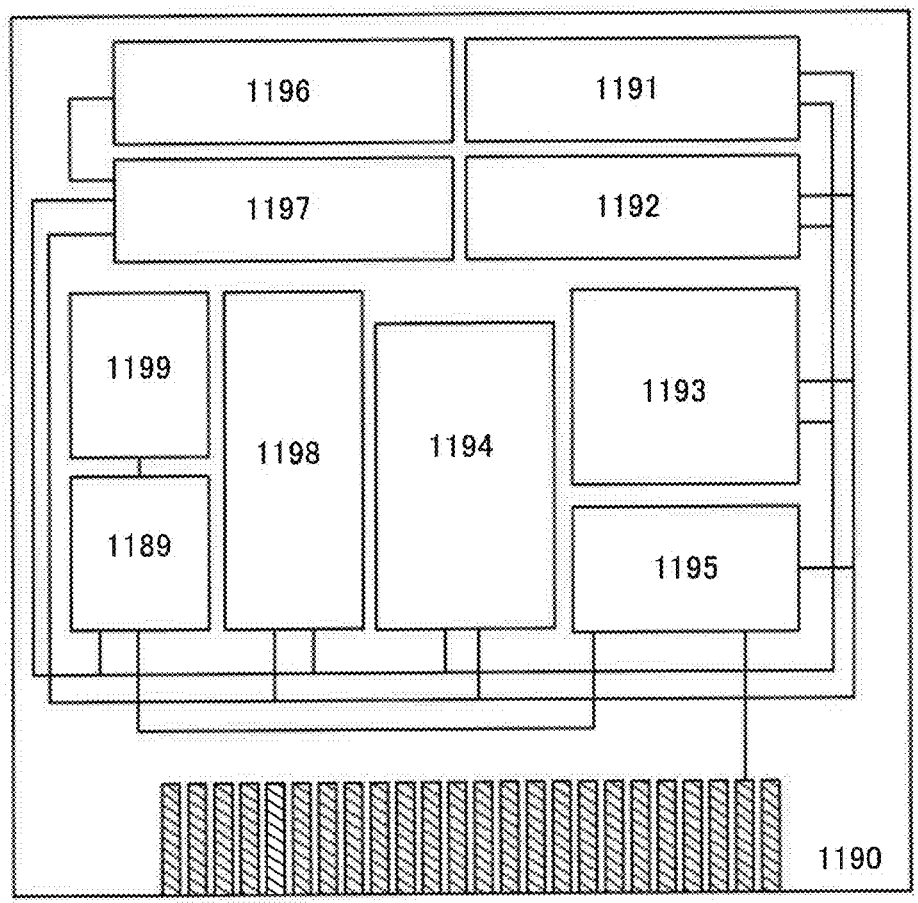
FIG. 50 A block diagram illustrating a semiconductor device according to one embodiment of the present invention.

FIG. 50 is a block diagram illustrating a configuration example of a CPU part of which includes the above-described transistor.

The CPU illustrated in FIG. 50 includes, over a substrate 1190, an ALU (Arithmetic logic unit) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU illustrated in FIG. 50 is just an example in which the configuration has been simplified, and an actual CPU may have a variety of configurations depending on the application. For example, a configuration in which a structure including the CPU illustrated in FIG. 50 or an arithmetic circuit is considered as one core, a plurality of cores are included, and the cores operate in parallel may be employed. The number of bits that the CPU can process in an internal arithmetic circuit or in a data bus can be 8 bits, 16 bits, 32 bits, or 64 bits, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 50, a memory cell is provided in the register 1196. For the memory cell of the register 1196, any of the above-described transistors, the above-described memory device, or the like can be used.

In the CPU illustrated in FIG. 50, the register controller 1197 selects operation of retaining data in the register 1196 in accordance with an instruction from the ALU 1191. That is, it selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 51:
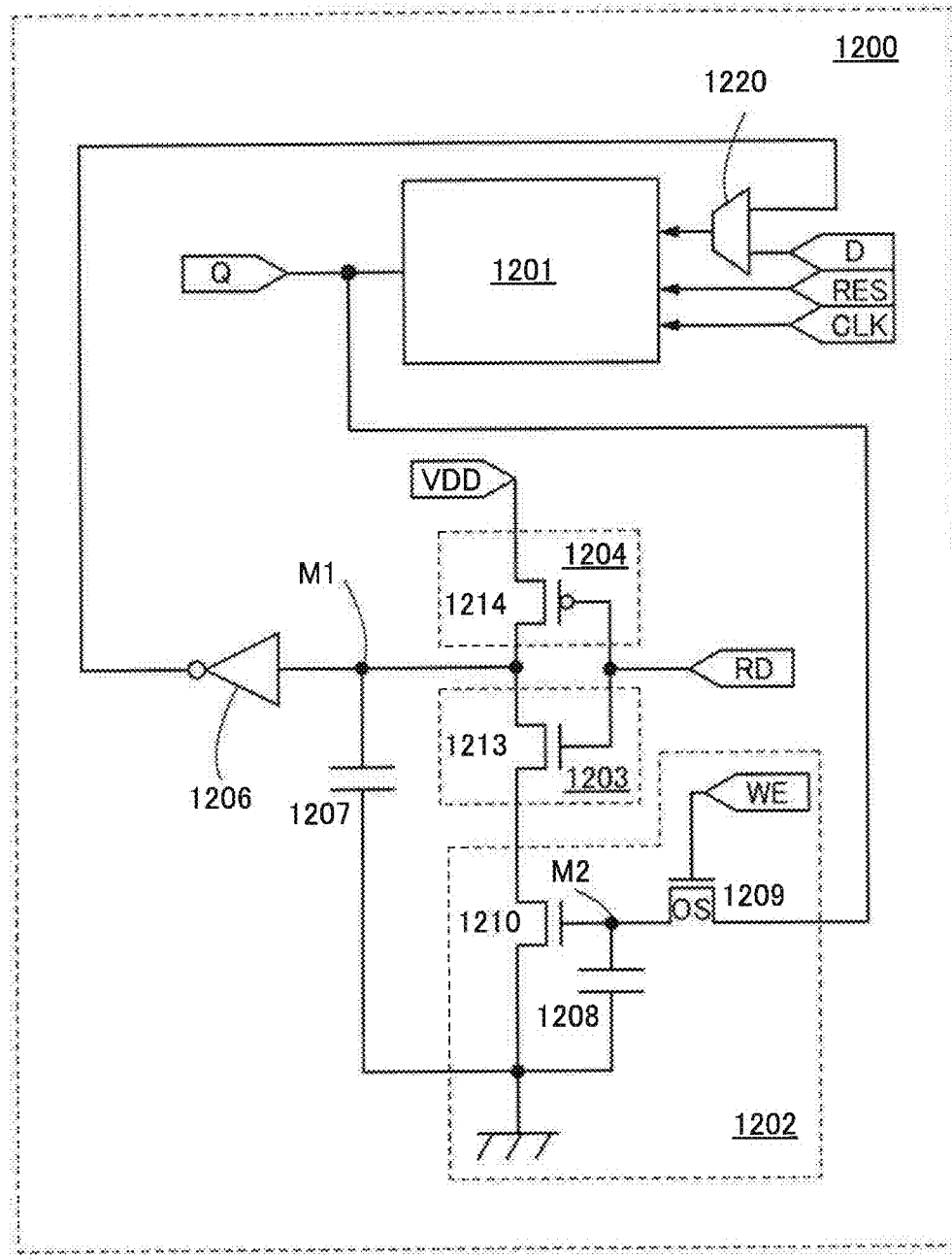
FIG. 51 A circuit diagram illustrating a semiconductor device according to one embodiment of the present invention.

FIG. 51 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to one another. Here, the connection portion is referred to as a node M1. A configuration in which a constant potential is input to the other of the pair of electrodes of the capacitor 1207 can be employed. For example, a configuration in which a low power supply potential (e.g., GND) or a high power supply potential (e.g., VDD) is input can be employed. The other of the pair of electrodes of the capacitor 1207 is electrically connected to the wiring which can supply a low power supply potential (e.g., a GND line). A configuration in which a constant potential is input to the other of the pair of electrodes of the capacitor 1208 can be employed. For example, a configuration in which a low power supply potential (e.g., GND) or a high power supply potential (e.g., VDD) is input can be employed. The other of the pair of electrodes of the capacitor 1208 is electrically connected to the wiring which can supply a low power supply potential (e.g., a GND line).

The capacitor 1207 and the capacitor 1208 can be omitted as long as the parasitic capacitance of the transistor, the wiring, or the like is actively utilized.

A control signal WE is input to the gate of the transistor 1209. As for the switch 1203 and the switch 1204, a conduction state or a non-conduction state between the first terminal and the second terminal is selected by the control signal RD which is different from the control signal WE, and when the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 51 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and is input to the circuit 1201 through the circuit 1220.

In the example of FIG. 51, a signal output from the second terminal of the switch 1203 (the other of the source and the drain of the transistor 1213) is input to the circuit 1201 through the logic element 1206 and the circuit 1220; however, it is not limited thereto. The signal output from the second terminal of the switch 1203 (the other of the source and the drain of the transistor 1213) may be input to the circuit 1201 without the logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 51, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors used in the memory element 1200 may be a transistor in which a channel is formed in an oxide semiconductor. Further alternatively, the memory element 1200 may include a transistor in which a channel is formed in an oxide semiconductor in addition to the transistor 1209, and the rest of the transistors can be a transistor in which a channel is formed in a film formed using a semiconductor other than an oxide semiconductor or in the substrate 1190.

As the circuit 1201 in FIG. 51, for example, a flip-flop circuit can be used. As the logic element 1206, for example, an inverter or a clocked inverter can be used.

In a period during which the memory element 1200 is not supplied with the power supply voltage, the semiconductor device according to one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element is characterized by performing pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the on state or the off state of the transistor 1210 is switched by the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the storage device can be returned to the same state as that before the power supply is stopped. Therefore, the power supply can be stopped even for a short time in the processor or one or more of logic circuits included in the processor, resulting in lower power consumption.

Although the example of the memory element 1200 used in a CPU has been described, the memory element 1200 can also be used in an LSI such as a DSP (Digital Signal Processor), a custom LSI, or a PLD (Programmable Logic Device), and an RF (Radio Frequency) device.

<Display Device>

A display device according to one embodiment of the present invention is described below with reference to FIG. 52 and FIG. 54.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic EL (Electroluminescent) element, an organic EL element, and the like. A display device including an EL element (EL display device) and a display device including a liquid crystal element (liquid crystal display device) are described below as examples of the display device.

Note that the display device described below includes a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an IC (integrated circuit) is mounted directly on a display element by a COG method.

Figure 52A:
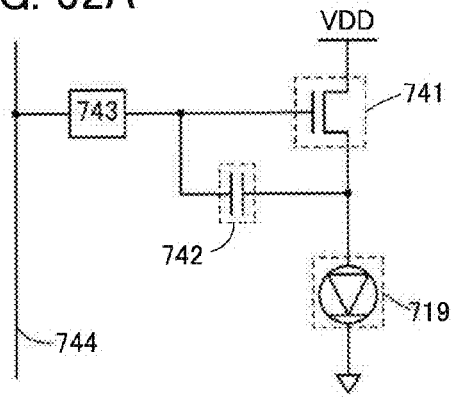
FIG. 52 A circuit diagram, a top view, and a cross-sectional view illustrating a semiconductor device according to one embodiment of the present invention.
Figure 52B:
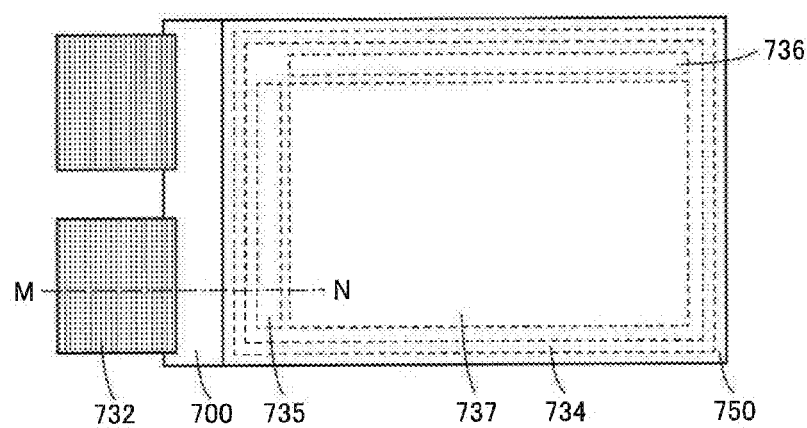

FIG. 52 illustrates an example of an EL display device according to one embodiment of the present invention. FIG. 52(A) is a circuit diagram of a pixel in an EL display device. FIG. 52(B) is a plan view showing the whole of the EL display device.

FIG. 52(A) illustrates an example of a circuit diagram of a pixel used in an EL display device.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention can be clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 52(A) includes a switching element 743, a transistor 741, a capacitor 742, and a light-emitting element 719.

Note that FIG. 52(A) and the like are examples of a circuit configuration; therefore, a transistor can be provided additionally. In contrast, for each node in FIG. 52(A), it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than it.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the above-described transistor can be used, for example.

FIG. 52(B) is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

Figure 52C:
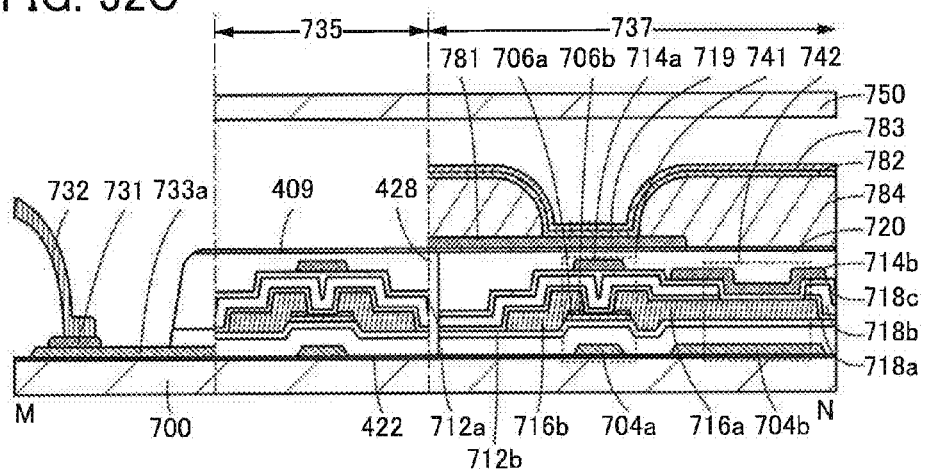

FIG. 52(C) is a cross-sectional view of the EL display device taken along part of dashed-dotted line M-N in FIG. 52B. Note that the insulator 428 is provided between the driver circuit 735 and the pixel 737.

FIG. 52(C) illustrates a structure of the transistor 741 including the insulator 422 over the substrate 700, a conductor 704a over the insulator 422: an insulator 712a over the conductor 704a; an insulator 712b over the insulator 712a; a semiconductor 706a and a semiconductor 706b which are over the insulator 712b and overlaps the conductor 704a; a conductor 716a and a conductor 716b in contact with the semiconductors 706a and 706b; an insulator 718a over the semiconductor 706b, the conductor 716a, and the conductor 716b; an insulator 718b over the insulator 718a; an insulator 718c over the insulator 718b; and a conductor 714a which is over the insulator 718c and overlaps the semiconductor 706b. Note that the structure of the transistor 741 is just an example, and it may be a structure different from the structure illustrated in FIG. 52(C).

Thus, in the transistor 741 illustrated in FIG. 52(C), the conductor 704a has a function of a gate electrode, the insulator 712a and the insulator 712b have a function of a gate insulator, the conductor 716a has a function of a source electrode, the conductor 716b has a function of a drain electrode, the insulator 718a, the insulator 718b, and the insulator 718c have a function of a gate insulator, and the conductor 714a has a function of a gate electrode. Note that in some cases, the electrical characteristics of the semiconductor 706 change if light enters it. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, they are not distinguished from each other in some cases depending on an observation method.

FIG. 52(C) illustrates a structure of the capacitor 742 which includes a conductor 704b over the substrate; the insulator 712a over the conductor 704b; the insulator 712b over the insulator 712a; the conductor 716a that is over the insulator 712b and overlaps the conductor 704b; the insulator 718a over the conductor 716a; the insulator 718b over the insulator 718a; the insulator 718c over the insulator 718b; and a conductor 714b that is over the insulator 718c and overlaps the conductor 716a, and in which part of the insulator 718a and the insulator 718b is removed in a region where the conductor 716a and the conductor 714b overlap each other.

In the capacitor 742, the conductor 704b and the conductor 714b function as one electrode, and the conductor 716a functions as the other electrode.

Thus, the capacitor 742 can be formed using a film in common with the transistor 741. The conductor 704a and the conductor 704b are preferably the same type of conductor. In that case, the conductor 704a and the conductor 704b can be formed through the same step. The conductor 714a and the conductor 714b are preferably the same kind of conductor. In this case, the conductor 714a and the conductor 714b can be formed through the same step.

The capacitor 742 illustrated in FIG. 52(C) is a capacitor which has a large capacitance per occupation area. Therefore, the EL display device illustrated in FIG. 52(C) has high display quality. Note that although the capacitor 742 illustrated in FIG. 52(C) has the structure in which the part of the insulator 718a and the insulator 718b is removed to reduce the thickness of the region where the conductor 716a and the conductor 714b overlap each other, the capacitor according to one embodiment of the present invention is not limited thereto. For example, a structure in which part of the insulator 718c is removed to reduce the thickness of the region where the conductor 716a and the conductor 714b overlap each other may be used.

An insulator 720 is placed over the transistor 741 and the capacitor 742. Here, the insulator 720 may have an opening reaching the conductor 716a that functions as the source electrode of the transistor 741. The insulator 409 is placed over the insulator 720, and a conductor 781 is placed over the insulator 409. The conductor 781 may be electrically connected to the transistor 741 through the opening in the insulator 720.

A partition wall 784 having an opening reaching the conductor 781 is placed over the conductor 781. A light-emitting layer 782 in contact with the conductor 781 through the opening formed in the partition wall 784 is placed over the partition wall 784. A conductor 783 is placed over the light-emitting layer 782. A region where the conductor 781, the light-emitting layer 782, and the conductor 783 overlap with one another serves as the light-emitting element 719.

The insulator 422, the insulator 428, and the insulator 409 have barrier properties. This means that the display device illustrated in FIG. 52 has a structure in which the transistor 741 is surrounded by the insulators having barrier properties. Note that one or more of the insulator 422, the insulator 428, and the insulator 409 are not necessarily provided.

Note that a transistor, a capacitor, a wiring layer, and/or the like may be stacked to make the EL display device highly integrated.

Figure 53:
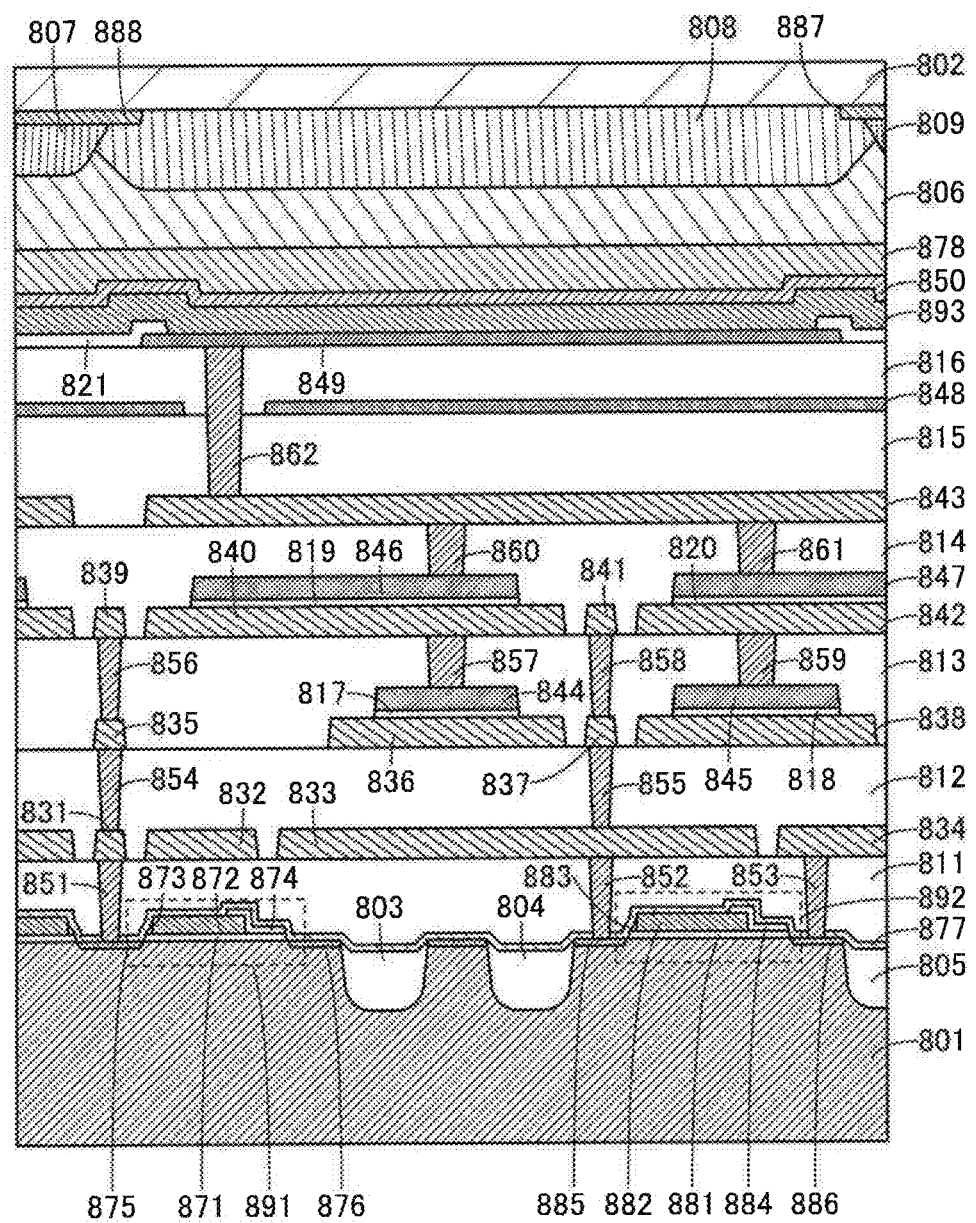
FIG. 53 A cross-sectional view illustrating a semiconductor device according to one embodiment of the present invention.

FIG. 53 is an example of a cross-sectional view illustrating a pixel of an EL display device fabricated over a semiconductor substrate.

The EL display device shown in FIG. 53 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 is formed with the semiconductor substrate 801, the insulator 871, the conductor 872, the insulator 873, the insulator 874, and the region 875 and the region 876. The semiconductor substrate 801 functions as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping part of the semiconductor substrate 801 with the insulator 871 therebetween. The region 875 and the region 876 are regions where impurities are added to the semiconductor substrate 801. Alternatively, they may be regions in which a silicide is formed, in the case where the semiconductor substrate 801 is a silicon substrate. For example, they may be regions including tungsten silicide, titanium silicide, cobalt silicide, nickel silicide, or the like. The region 875 and the region 876 can be formed in a self-aligned manner using the conductor 872, the insulator 873, the insulator 874, and the like. Thus, the region 875 and the region 876 are placed in positions of the semiconductor substrate 801 between which a channel formation region is provided.

Since the transistor 891 includes the insulator 873, the region 875 can be distanced from the channel formation region. Because the insulator 873 is provided, the transistor 891 can be prevented from being broken or degraded by an electric field generated from the region 875. Since the transistor 891 includes the insulator 874, the region 876 can be distanced from the channel formation region. Therefore, since the insulator 874 is included, the transistor 891 can be prevented from being broken or degraded by an electric field generated from the region 876. Note that in the transistor 891, the space between the region 876 and a channel formation region is larger than the space between the region 875 and a channel formation region. This structure can enable both high on-state current and high reliability in the case where a potential difference between the region 876 and a channel formation region is likely to be larger than a potential difference between the region 875 and a channel formation region in operation of the transistor 891.

A transistor 892 is formed with the semiconductor substrate 801, the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source and/or a drain region.

The conductor 882 includes a region overlapping part of the semiconductor substrate 801 with the insulator 881 therebetween. The region 885 and the region 886 are regions where impurities are added to the semiconductor substrate 801. They are regions in which a silicide is formed, in the case where the semiconductor substrate 801 is a silicon substrate. The region 885 and the region 886 can be formed in a self-aligned manner using the conductor 882, the insulator 883, the insulator 884, and the like. Thus, the region 885 and the region 886 are placed in positions of the semiconductor substrate 801 between which a channel formation region is provided.

Since the transistor 892 includes the insulator 883, the region 885 can be distanced from the channel formation region. Because the insulator 883 is included, the transistor 892 can be prevented from being broken or degraded by an electric field generated from the region 885. Since the transistor 892 includes the insulator 884, the region 886 can be distanced from the channel formation region. Therefore, since the insulator 884 is provided, the transistor 892 can be prevented from being broken or degraded by an electric field generated from the region 886. Note that in the transistor 892, the space between the region 886 and a channel formation region is larger than the space between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is placed so as to cover the transistor 891 and the transistor 892. Thus, the insulator 877 has a function of a protective film for the transistor 891 and the transistor 892. The insulator 803, the insulator 804, and the insulator 805 have a function of isolating elements. For example, the transistor 891 and the transistor 892 are isolated from each other with the insulator 803 and the insulator 804 therebetween.

The conductor 851, the conductor 852, the conductor 853, the conductor 854, the conductor 855, the conductor 856, the conductor 857, the conductor 858, the conductor 859, the conductor 860, the conductor 861, and the conductor 862 have a function of electrically connecting elements, an element and a wiring, and wirings, and the like. Therefore, these conductors can also be referred to as a wiring or a plug.

The conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 have a function of a wiring, an electrode, and/or a light-blocking layer.

For example, the conductor 836 and the conductor 844 have a function of an electrode of a capacitor including the insulator 817. For example, the conductor 838 and the conductor 845 have a function of an electrode of a capacitor including the insulator 818. For example, the conductor 840 and the conductor 846 have a function of an electrode of a capacitor including the insulator 819. For example, the conductor 842 and the conductor 847 have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

The insulator 811, the insulator 812, the insulator 813, the insulator 814, the insulator 815, and the insulator 816 have a function of an interlayer insulator. The surfaces of the insulator 811, the insulator 812, the insulator 813, the insulator 814, the insulator 815, and the insulator 816 are preferably planarized.

The conductor 831, the conductor 832, the conductor 833, and the conductor 834 are placed over the insulator 811. The conductor 851 is placed in an opening in the insulator 811. The conductor 851 electrically connects the conductor 831 and the region 875. The conductor 852 is placed in an opening in the insulator 811. The conductor 852 electrically connects the conductor 833 and the region 885. The conductor 853 is placed in an opening in the insulator 811. The conductor 853 electrically connects the conductor 834 and the region 886.

The conductor 835, the conductor 836, the conductor 837, and the conductor 838 are placed over the insulator 812. The insulator 817 is placed over the conductor 836. The conductor 844 is placed over the insulator 817. The insulator 818 is placed over the conductor 838. The conductor 845 is placed over the insulator 818. The conductor 854 is placed in an opening in the insulator 812. The conductor 854 electrically connects the conductor 835 and the conductor 831. The conductor 855 is placed in an opening in the insulator 812. The conductor 855 electrically connects the conductor 837 and the conductor 833.

The conductor 839, the conductor 840, the conductor 841, and the conductor 842 are placed over the insulator 813. The insulator 819 is placed over the conductor 840. The conductor 846 is placed over the insulator 819. The insulator 820 is placed over the conductor 842. The conductor 847 is placed over the insulator 820. The conductor 856 is placed in an opening in the insulator 813. The conductor 856 electrically connects the conductor 839 and the conductor 835. The conductor 857 is placed in an opening in the insulator 813. The conductor 857 electrically connects the conductor 840 and the conductor 844. The conductor 858 is placed in an opening in the insulator 813. The conductor 858 electrically connects the conductor 841 and the conductor 837. The conductor 859 is placed in an opening in the insulator 813. The conductor 859 electrically connects the conductor 842 and the conductor 845.

The conductor 843 is placed over the insulator 814. The conductor 860 is placed in an opening in the insulator 814. The conductor 860 electrically connects the conductor 843 and the conductor 846. The conductor 860 electrically connects the conductor 843 and the conductor 847.

The conductor 848 is placed over the insulator 815. The conductor 848 may be electrically floating. Note that the conductor 848 is not limited to a conductor as long as it has a function of a light-blocking layer. For example, it may be an insulator or a semiconductor having a light-blocking property.

The conductor 849 is placed over the insulator 816. The insulator 821 is placed over the insulator 816 and the conductor 849. The insulator 821 includes an opening exposing the conductor 849. The light-emitting layer 893 is placed over the conductor 849 and the insulator 821. The conductor 850 is placed over the light-emitting layer 893.

Accordingly, light emission is generated from the light-emitting layer 893 by application of a potential difference to the conductor 849 and the conductor 850. Thus, the conductor 849, the conductor 850, and the light-emitting layer 893 have a function of a light-emitting element. Note that the insulator 821 has a function of a partition wall.

The insulator 878 is placed over the conductor 850. Since the insulator 878 covers the light-emitting element, it has a function of a protective insulator. For example, the insulator 878 may be an insulator which has a barrier property. Alternatively, a structure in which the light-emitting element is surrounded by insulators having barrier properties may be employed.

A substrate having a light-transmitting property can be used as the substrate 802. For example, the description of the substrate 750 is referred to. The layer 887 and the layer 888 are provided on the substrate 802. The layer 887 and the layer 888 have a function of a light-blocking layer. A resin, a metal, or the like can be used for the light-blocking layer.

When the layer 887 and the layer 888 are provided, the contrast, color bleeding, and the like of the EL display device can be reduced.

The filter 807, the filter 808, and the filter 809 have a function of a color filter. The description of the filter 2054 is referred to, for example. The filter 808 is placed to overlap the layer 888, the substrate 802, and the layer 887. The filter 807 has a region overlapping the filter 808 on the layer 888. The filter 809 has a region overlapping the filter 808 on the layer 887. The filter 807, the filter 808, and the filter 809 may have different thicknesses. When the filters have different thicknesses, the outcoupling efficiency of the light-emitting element may be increased.

An adhesive layer 806 is placed between the filter 807, the filter 808, and the filter 809 and the insulator 878.

Because the EL display device in FIG. 53 has a stacked-layer structure of the transistor, the capacitor, the wiring layer, and/or the like, the pixel can be miniaturized. Thus, a high-resolution EL display device can be provided.

So far, examples of the EL display device are described. Next, an example of a liquid crystal display device will be described.

Figure 54A:
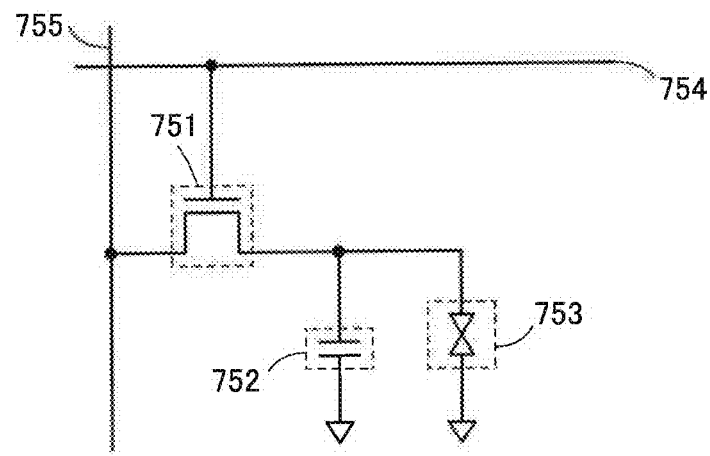
FIG. 54 A circuit diagram and a cross-sectional view illustrating a semiconductor device according to one embodiment of the present invention.

FIG. 54(A) is a circuit diagram illustrating a configuration example of a pixel of a liquid crystal display device. A pixel shown in FIG. 54 includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate thereof is electrically connected to a scan line 754.

One electrode of the capacitor 752 is electrically connected to the other of the source and the drain of the transistor 751, and the other electrode thereof is electrically connected to a wiring for supplying a common potential.

One electrode of the liquid crystal element 753 is electrically connected to the other of the source and the drain of the transistor 751, and the other electrode thereof is electrically connected to a wiring to which a common potential is supplied. The common potential supplied to the wiring electrically connected to the other electrode of the capacitor 752 may be different from that supplied to the other electrode of the liquid crystal element 753.

Figure 54B:
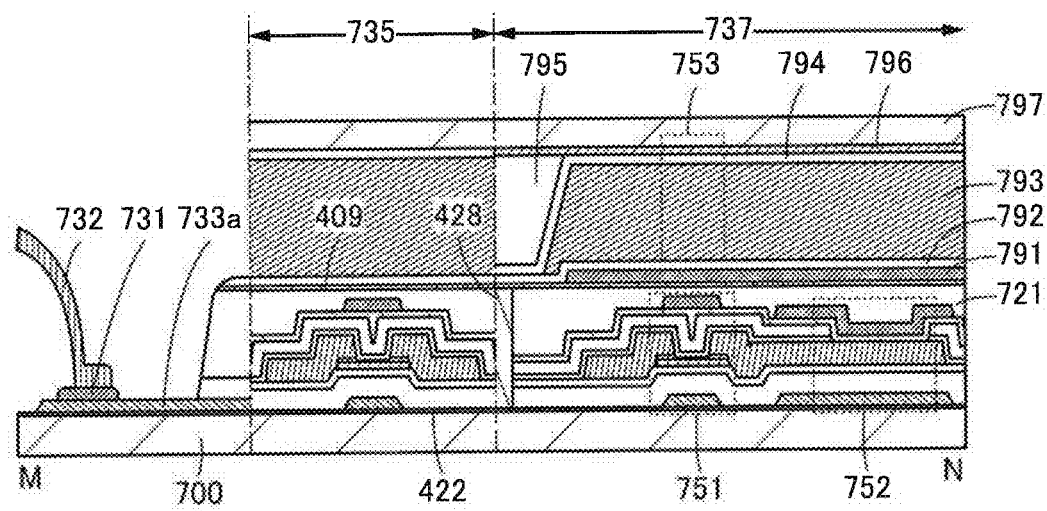

Note that the description of the liquid crystal display device is made on the assumption that the top plan view thereof is similar to that of the EL display device. FIG. 54(B) is a cross-sectional view of the liquid crystal display device taken along dashed-dotted line M-N in FIG. 52(B). In FIG. 54(B), the FPC 732 is connected to a wiring 733a via a terminal 731. Note that the wiring 733a may be formed using the same kind of conductor or semiconductor as the conductor or semiconductor of the transistor 751.

For the transistor 751, the description of the transistor 741 is referred to. For the capacitor 752, the description of the capacitor 742 is referred to. Note that the structure of the capacitor 752 in FIG. 54(B) corresponds to, but is not limited to, the structure of the capacitor 742 in FIG. 52(C).

Note that in the case where an oxide semiconductor is used as the semiconductor of the transistor 751, the transistor with extremely small off-state current can be obtained. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image is displayed, whereby power for the operation of the transistor 751 can be saved in that period; accordingly a liquid crystal display device with low power consumption can be provided. Furthermore, the occupation area of the capacitor 752 can be reduced; thus, a liquid crystal display device with a high aperture ratio or a high-resolution liquid crystal display device can be provided.

An insulator 721 is placed over the transistor 751 and the capacitor 752. The insulator 721 has an opening reaching the transistor 751. A conductor 791 is placed over the insulator 721. The conductor 791 is electrically connected to the transistor 751 through the opening in the insulator 721.

The insulator 422, the insulator 428, and the insulator 409 are insulators having barrier properties. This means that the display device illustrated in FIG. 54 has a structure in which the transistor 751 is surrounded by the insulators having barrier properties. Note that one or more of the insulator 422, the insulator 428, and the insulator 409 are not necessarily provided.

An insulator 792 functioning as an alignment film is placed over the conductor 791. A liquid crystal layer 793 is placed over the insulator 792. An insulator 794 functioning as an alignment film is placed over the liquid crystal layer 793. A spacer 795 is placed over the insulator 794. A conductor 796 is placed over the spacer 795 and the insulator 794. A substrate 797 is placed over the conductor 796.

Owing to the above-described structure, a display device including a capacitor occupying a small area, a display device with high display quality, or a high-resolution display device can be provided. A high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display (PDP), a display element using MEMS (micro electro mechanical systems), a digital micromirror device (DMD), a DMS (digital micro shutter), an IMOD (interferometric modulator display) element, a MEMS shutter display element, an optical-interference-type MEMS display element, an electrowetting element, a piezoelectric ceramic display, and a display element including a carbon nanotube. In addition to the above, a display medium whose contrast, luminance, reflectivity, transmittance, or the like changes by electrical or magnetic action may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In order to obtain a transflective liquid crystal display or a reflective liquid crystal display, some of or all of pixel electrodes have a function of a reflective electrode. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be placed under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductor included in the LED can also be formed by a sputtering method.

<Electronic Device>

A semiconductor device according to one embodiment of the present invention can be used for display devices, personal computers, or image reproducing devices provided with recording media (typically, devices that reproduce the content of recording media such as DVDs (digital versatile discs) and have displays for displaying the reproduced images). Other examples of electronic appliances that can be equipped with the semiconductor device according to one embodiment of the present invention are cellular phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIG. 55 illustrates specific examples of these electronic devices.

Figure 55A:
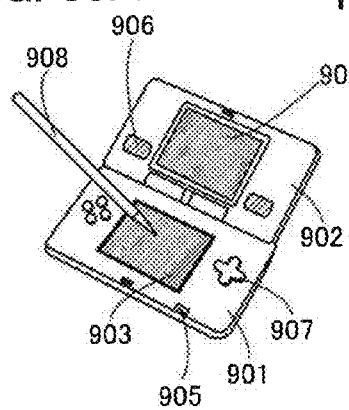
FIG. 55 Perspective views illustrating electronic devices according to one embodiment of the present invention.

FIG. 55(A) illustrates a portable game console including a housing 901, a housing 902, a display portion 903, a display portion 904, a microphone 905, a speaker 906, an operation key 907, a stylus 908, and the like. Although the portable game console in FIG. 55(A) has the two display portions 903 and 904, the number of display portions included in the portable game console is not limited thereto.

Figure 55B:
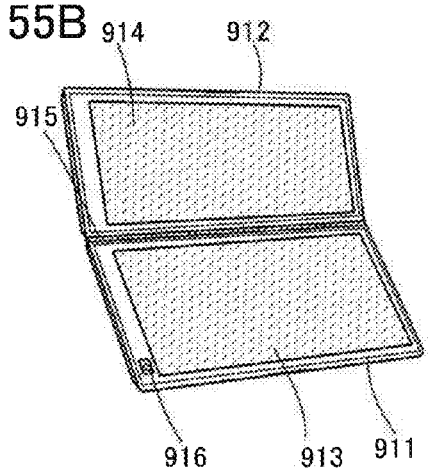

FIG. 55(B) illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a function of a position input device may be used as at least one of the first display portion 913 and the second display portion 914. Note that the function of a position input device can be added by providing a touch panel in a display device. Alternatively, the function of a position input device can be added by provision of a photoelectric conversion element called a photosensor in a pixel portion of a display device.

Figure 55C:
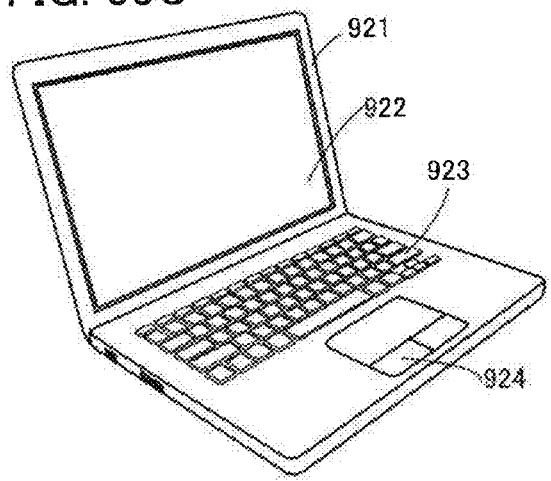

FIG. 55(C) illustrates a notebook personal computer, which includes a housing 921, a display portion 922, a keyboard 923, a pointing device 924, and the like.

Figure 55D:
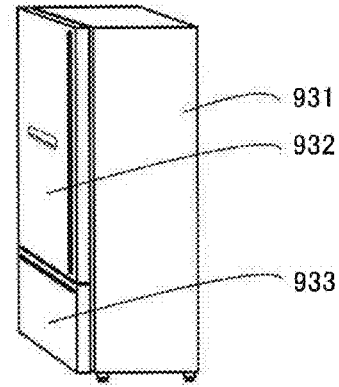

FIG. 55(D) illustrates an electric refrigerator-freezer, which includes a housing 931, a door for a refrigerator 932, a door for a freezer 933, and the like.

Figure 55E:
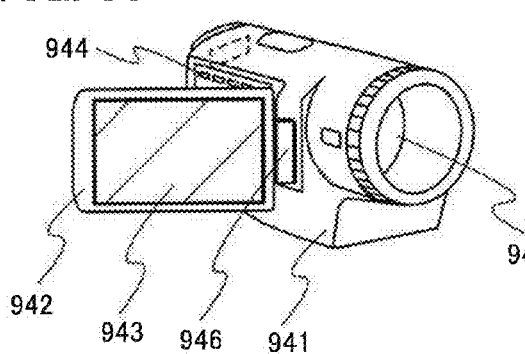

FIG. 55(E) illustrates a video camera, which includes a first housing 941, a second housing 942, a display portion 943, operation keys 944, a lens 945, a joint 946, and the like. The operation keys 944 and the lens 945 are included in the first housing 941, and the display portion 943 is included in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 55F:
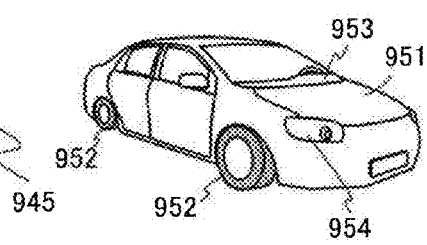

FIG. 55(F) illustrates a car including a car body 951, wheels 952, a dashboard 953, lights 954, and the like.

Example 1

In this example, a polycrystalline In—Ga—Zn oxide was baked and the hydrogen concentration was measured.

A prepared polycrystalline In—Ga—Zn oxide has an atomic ratio of In:Ga:Zn=1:1:1. Then, the polycrystalline In—Ga—Zn oxide was cut into Sample 1, Sample 2, Sample 3, and Sample 4 according to differences in conditions for baking.

Sample 1 is a sample on which baking was performed in the conditions shown in FIG. 1(B). The conditions of the baking of Sample 1 are shown in the following table.

TABLE 3

| | Sample 1 | | | |
|---|---|---|---|---|
| Time | Atmosphere | Time | Start temperature | End temperature |
| t0-t1 | $N_2$ | 3 h | 25° C. | 1200° C. |
| t1-t2 | | 3 h | 1200° C. | 1200° C. |
| t2-t3 | | | | |
| t3-t4 | | 5 h | 1200° C. | 25° C. |

Sample 2 is a sample on which baking was performed in the conditions shown in FIG. 1(B). The conditions of the baking of Sample 2 are shown in the following table.

TABLE 4

| | Sample 2 | | | |
|---|---|---|---|---|
| Time | Atmosphere | Time | Start temperature | End temperature |
| t0-t1 | $N_2$ | 3 h | 25° C. | 1200° C. |
| t1-t2 | | 1.5 h | 1200° C. | 1200° C. |
| t2-t3 | $O_2$ | 1.5 h | 1200° C. | 1200° C. |
| t3-t4 | | 5 h | 1200° C. | 25° C. |

Sample 3 is a sample on which baking was performed in the conditions shown in FIG. 2(A). The conditions of the baking of Sample 3 are shown in the following table.

TABLE 5

| | Sample 3 | | | |
|---|---|---|---|---|
| Time | Atmosphere | Time | Start temperature | End temperature |
| t0-t1 | $N_2$ | 3 h | 25° C. | 1200° C. |
| t1-t2 | | 1.5 h | 1200° C. | 1200° C. |
| t2-t3 | | | | |

TABLE 5-continued

| | Sample 3 | | | |
|---|---|---|---|---|
| Time | Atmosphere | Time | Start temperature | End temperature |
| t3-t4 | | 5 h | 1200° C. | 25° C. |
| t4-t5 | $O_2$ | 3 h | 25° C. | 1200° C. |
| t5-t6 | | 1.5 h | 1200° C. | 1200° C. |
| t6-t7 | | | | |
| t7-t8 | | 5 h | 1200° C. | 25° C. |

Note that Sample 4 is a sample corresponding to Samples 1 to 3 before baking.

The hydrogen concentrations of Samples 1 to 4 that were formed were measured by SIMS. The profiles are shown in FIG. 61(A), FIG. 61(B), FIG. 61(C), and FIG. 61(D), respectively. Note that a dashed line in the figure indicates a lower measurement limit of this measurement. For the SIMS, a PHI ADEPT-1010 quadrupole SIMS instrument manufactured by ULVAC-PHI. Inc. was used.

An average hydrogen concentration of Sample 4 corresponding to the one before baking except singular points on the surface was approximately $1\times10^{19}$ atoms/cm$^3$; that of Sample 1 subjected to baking was approximately $3\times10^{18}$ atoms/cm$^3$; that of Sample 2 subjected to baking was approximately $4\times10^{18}$ atoms/cm$^3$; and that of Sample 3 subjected to baking was approximately $3\times10^{18}$ atoms/cm$^3$. Note that the hydrogen concentrations of Samples 1 to 3 subjected to baking are in the vicinity of $1.3\times10^{18}$ atoms/cm$^3$ that is the lower measurement limit of this measurement; therefore, there is a possibility that the hydrogen concentrations have a region lower than or equal to the lower measurement limit.

It was found from this example that the hydrogen concentration of the In—Ga—Zn oxide subjected to baking according to one embodiment of the present invention was lowered as compared to that before baking. It was found from the results of Sample 1 that the hydrogen concentration in the In—Ga—Zn oxide was reduced by heating in a nitrogen atmosphere, which is an inert atmosphere. Meanwhile, in Sample 2 and Sample 3, oxygen vacancies in the In—Ga—Zn oxide are reduced as compared to those in Sample 1 by a combination of heating in a nitrogen atmosphere that is an inert atmosphere and heating in an oxygen atmosphere that is an oxidation atmosphere. Thus, it is found that a sputtering target which is manufactured in a manner similar to that of Sample 2 or Sample 3 is a target which has a low hydrogen concentration, a small amount of oxygen vacancies, and a low defect density.

REFERENCE NUMERALS

100 target
100*a* target
100*b* target
101 deposition chamber
103*b* magnet unit
110 backing plate
110*a* backing plate
110*b* backing plate
120 target holder
120*a* target holder
120*b* target holder
122 target shield
122*a* target shield
122*b* target shield 123 target shield
130 magnet unit
130a magnet unit
130b magnet unit
130N magnet
130N1 magnet
130N2 magnet
130S magnet
132 magnet holder
140 plasma
142 member
160 substrate
170 substrate holder
180a magnetic force line
180b magnetic force line
190 power source
191 power source
200 pellet
200a pellet
200b pellet
200c pellet
201 ion
202 lateral growth portion
206a layer
206b layer
206d pellet
206e pellet
206f pellet
206m layer
210 backing plate
220 substrate
230 target
240 plasma
250 magnet
260 heating mechanism
400 substrate
401 insulator
402 insulator
404 conductor
406a semiconductor
406b semiconductor
406c semiconductor
408 insulator
409 insulator
412 insulator
413 conductor
416a conductor
416b conductor
422 insulator
428 insulator
450 semiconductor substrate
452 insulator
454 conductor
456 region
460 region
462 insulator
464 insulator
466 insulator
468 insulator
472a region
472b region
474a conductor
474b conductor
474c conductor
476a conductor
476b conductor
478a conductor
478b conductor
478c conductor
480a conductor
480b conductor
480c conductor
490 insulator
492 insulator
494 insulator
496a conductor
496b conductor
496c conductor
496d conductor
498a conductor
498b conductor
498c conductor
498d conductor
500 substrate
502 insulator
503 insulator
504 conductor
506a semiconductor
506b semiconductor
506c semiconductor
508 insulator
512 insulator
513 conductor
514 conductor
516a conductor
516b conductor
700 substrate
704a conductor
704b conductor
706 semiconductor
706a semiconductor
706b semiconductor
712a insulator
712b insulator
714a conductor
714b conductor
716a conductor
716b conductor
718a insulator
718b insulator
718c insulator
719 light-emitting element
720 insulator
721 insulator
731 terminal
732 FPC
733a wiring
734 sealant
735 driver circuit
736 driver circuit
737 pixel
741 transistor
742 capacitor
743 switching element
744 signal line
750 substrate
751 transistor
752 capacitor
753 liquid crystal element
754 scan line
755 signal line
781 conductor
782 light-emitting layer
783 conductor 784 partition wall
791 conductor
792 insulator
793 liquid crystal layer
794 insulator
795 spacer
796 conductor
797 substrate
801 semiconductor substrate
802 substrate
803 insulator
804 insulator
805 insulator
806 adhesive layer
807 filter
808 filter
809 filter
811 insulator
812 insulator
813 insulator
814 insulator
815 insulator
816 insulator
817 insulator
818 insulator
819 insulator
820 insulator
821 insulator
831 conductor
832 conductor
833 conductor
834 conductor
835 conductor
836 conductor
837 conductor
838 conductor
839 conductor
840 conductor
841 conductor
842 conductor
843 conductor
844 conductor
845 conductor
846 conductor
847 conductor
848 conductor
849 conductor
850 conductor
851 conductor
852 conductor
853 conductor
854 conductor
855 conductor
856 conductor
857 conductor
858 conductor
859 conductor
860 conductor
861 conductor
862 conductor
871 insulator
872 conductor
873 insulator
874 insulator
875 region
876 region
877 insulator
878 insulator
881 insulator
882 conductor
883 insulator
884 insulator
885 region
886 region
887 layer
888 layer
891 transistor
892 transistor
893 light-emitting layer
901 housing
902 housing
903 display portion
904 display portion
905 microphone
906 speaker
907 operation key
908 stylus
911 housing
912 housing
913 display portion
914 display portion
915 joint
916 operation key
921 housing
922 display portion
923 keyboard
924 pointing device
931 housing
932 door for a refrigerator
933 door for a freezer
941 housing
942 housing
943 display portion
944 operation key
945 lens
946 joint
951 car body
952 wheel
953 dashboard
954 light
1189 ROM interface
1190 substrate
1191 ALU
1192 ALU controller
1193 instruction decoder
1194 interrupt controller
1195 timing controller
1196 register
1197 register controller
1198 bus interface
1199 ROM
1200 memory element
1201 circuit
1202 circuit
1203 switch
1204 switch
1206 logic element
1207 capacitor
1208 capacitor
1209 transistor
1210 transistor
1213 transistor
1214 transistor
1220 circuit 2000 imaging device
2001 switch
2002 switch
2003 switch
2010 pixel portion
2011 pixel
2012 subpixel
2012B subpixel
2012G subpixel
2012R subpixel
2020 photoelectric conversion element
2030 pixel circuit
2031 wiring
2047 wiring
2048 wiring
2049 wiring
2050 wiring
2053 wiring
2054 filter
2054B filter
2054G filter
2054R filter
2055 lens
2056 light
2057 wiring
2060 peripheral circuit
2070 peripheral circuit
2080 peripheral circuit
2090 peripheral circuit
2091 light source
2100 transistor
2200 transistor
2355 lens
2700 deposition apparatus
2300 silicon substrate
2310 layer
2320 layer
2328 insulator
2330 layer
2340 layer
2351 transistor
2352 transistor
2353 transistor
2354 filter
2360 photodiode
2361 anode
2363 low-resistance region
2370 plug
2371 wiring
2372 wiring
2373 wiring
2409 insulator
2422 insulator
2428 insulator
2701 atmosphere-side substrate supply chamber
2702 atmosphere-side substrate transfer chamber
2703a load lock chamber
2703b unload lock chamber
2704 transfer chamber
2705 substrate heating chamber
2706a deposition chamber
2706b deposition chamber
2706c deposition chamber
2751 cryotrap
2752 substrate delivery stage
2761 cassette port
2762 alignment port
2763 transfer robot
2764 gate valve
2765 heating stage
2766a target
2766b target
2767 target shield
2767a target shield
2767b target shield
2768 substrate holder
2769 substrate
2770 vacuum pump
2771 cryopump
2772 turbo molecular pump
2780 mass flow controller
2781 refiner
2782 gas heating mechanism
2784 adjustment member
2790a magnet unit
2790b magnet unit
2791 power source
3001 wiring
3002 wiring
3003 wiring
3004 wiring
3005 wiring
3200 transistor
3300 transistor
3400 capacitor
5100 pellet
5120 substrate
5161 region

The invention claimed is:

1. A method for manufacturing a sputtering target comprising:
   a first step of preparing a mixture including indium, zinc, an element M, and oxygen, wherein the element M is aluminum, gallium, yttrium, or tin;
   a second step of raising a temperature of the mixture from a first temperature to a second temperature in a first atmosphere containing nitrogen at a concentration of higher than or equal to 90 vol % and lower than or equal to 100 vol %; and
   a third step of lowering the temperature of the mixture from the second temperature to a third temperature in a second atmosphere containing oxygen at a concentration of higher than or equal to 10 vol % and lower than or equal to 100 vol %.

2. The method for manufacturing a sputtering target according to claim 1, wherein the first atmosphere comprises a gas with a dew point of lower than −60° C.

3. The method for manufacturing a sputtering target according to claim 1, wherein the second atmosphere comprises a gas with a dew point of lower than −60° C.

4. The method for manufacturing a sputtering target according to claim 1, wherein the first temperature is higher than or equal to 10° C. and lower than or equal to 300° C.

5. The method for manufacturing a sputtering target according to claim 1, wherein the second temperature is higher than or equal to 800° C. and lower than or equal to 1700° C.

6. The method for manufacturing a sputtering target according to claim 1, wherein the third temperature is higher than or equal to 10° C. and lower than or equal to 300° C.

7. A method for manufacturing a sputtering target comprising:

a first step of preparing a mixture including indium, zinc, an element M and oxygen, wherein the element M is aluminum, gallium, yttrium, or tin;

a second step of raising a temperature of the mixture from a first temperature to a second temperature in a first atmosphere containing nitrogen at a concentration of higher than or equal to 90 vol % and lower than or equal to 100 vol %;

a third step of maintaining the mixture at the second temperature in the first atmosphere for longer than or equal to 3 minutes and shorter than 24 hours; and a fourth step of lowering the temperature of the mixture from the second temperature to a third temperature in a second atmosphere containing oxygen at a concentration of higher than or equal to 10 vol % and lower than or equal to 100 vol %.

8. The method for manufacturing a sputtering target according to claim 7, wherein the first atmosphere comprises a gas with a dew point of lower than −60° C.

9. The method for manufacturing a sputtering target according to claim 7, wherein the second atmosphere comprises a gas with a dew point of lower than −60° C.

10. The method for manufacturing a sputtering target according to claim 7, wherein the first temperature is higher than or equal to 10° C. and lower than or equal to 300° C.

11. The method for manufacturing a sputtering target according to claim 7, wherein the second temperature is higher than or equal to 800° C. and lower than or equal to 1700° C.

12. The method for manufacturing a sputtering target according to claim 7, wherein the third temperature is higher than or equal to 10° C. and lower than or equal to 300° C.

13. A method for manufacturing a sputtering target comprising:

a first step of preparing a mixture including indium, zinc, an element M and oxygen, wherein the element M is aluminum, gallium, yttrium, or tin;

a second step of raising a temperature of the mixture from a first temperature to a second temperature in a first atmosphere containing nitrogen at a concentration of higher than or equal to 90 vol % and lower than or equal to 100 vol %;

a third step of maintaining the mixture at the second temperature in the first atmosphere for longer than or equal to 3 minutes and shorter than 24 hours;

a fourth step of maintaining the mixture at the second temperature in a second atmosphere containing oxygen at a concentration of higher than or equal to 10 vol % and lower than or equal to 100 vol % for longer than or equal to 3 minutes and shorter than 24 hours; and a fifth step of lowering the temperature of the mixture from the second temperature to a third temperature in the second atmosphere.

14. The method for manufacturing a sputtering target according to claim 13, wherein the first atmosphere comprises a gas with a dew point of lower than −60° C.

15. The method for manufacturing a sputtering target according to claim 13, wherein the second atmosphere comprises a gas with a dew point of lower than −60° C.

16. The method for manufacturing a sputtering target according to claim 13, wherein the first temperature is higher than or equal to 10° C. and lower than or equal to 300° C.

17. The method for manufacturing a sputtering target according to claim 13, wherein the second temperature is higher than or equal to 800° C. and lower than or equal to 1700° C.

18. The method for manufacturing a sputtering target according to claim 13, wherein the third temperature is higher than or equal to 10° C. and lower than or equal to 300° C.

* * * * *